(12) United States Patent
Babbs et al.

(10) Patent No.: US 11,978,648 B2
(45) Date of Patent: May 7, 2024

(54) SUBSTRATE TRANSPORT

(71) Applicant: BOOKS AUTOMATION US, LLC, Chelmsford, MA (US)

(72) Inventors: Daniel Babbs, Austin, TX (US); Robert T Caveney, Windham, NH (US); Robert C May, Austin, TX (US); Krzysztof A Majczak, Beverly, MA (US)

(73) Assignee: Brooks Automation US, LLC, Chelmsford, MA (US)

( * ) Notice: Subject to any disclaimer, the term of this patent is extended or adjusted under 35 U.S.C. 154(b) by 0 days.

(21) Appl. No.: 18/322,072

(22) Filed: May 23, 2023

(65) Prior Publication Data
US 2023/0377924 A1 Nov. 23, 2023

Related U.S. Application Data

(63) Continuation of application No. 17/475,083, filed on Sep. 14, 2021, now Pat. No. 11,658,051, which is a continuation of application No. 16/552,881, filed on Aug. 27, 2019, now Pat. No. 11,121,015, which is a continuation of application No. 14/161,039, filed on Jan. 22, 2014, now Pat. No. 10,395,959.

(60) Provisional application No. 61/755,156, filed on Jan. 22, 2013.

(51) Int. Cl.
| H01L 21/673 | (2006.01) |
| H01L 21/67 | (2006.01) |
| H01L 21/677 | (2006.01) |

(52) U.S. Cl.
CPC .. *H01L 21/67376* (2013.01); *H01L 21/67201* (2013.01); *H01L 21/67775* (2013.01)

(58) Field of Classification Search
CPC ......... H01L 21/67376; H01L 21/67201; H01L 21/67775; H01L 21/67161; H01L 21/67167; H01L 21/67739; H01L 21/67748; H01L 21/67751; H01L 21/67757; H01L 21/67763
See application file for complete search history.

(56) References Cited

U.S. PATENT DOCUMENTS

| 5,152,539 A | 10/1992 | Takii et al. |
| 5,169,272 A | 12/1992 | Bonora et al. |
| 5,291,923 A | 3/1994 | Gallagher et al. |

(Continued)

FOREIGN PATENT DOCUMENTS

| CN | 102194730 | 9/2011 |
| JP | 0648508 | 2/1994 |

(Continued)

*Primary Examiner* — Glenn F Myers
(74) *Attorney, Agent, or Firm* — Perman & Green, LLP

(57) ABSTRACT

A substrate transport system includes a carrier having a housing forming an interior environment having an opening for holding at least one substrate and a door for sealing the opening from an outside atmosphere where when sealed the interior environment is configured to maintain an interior atmosphere therein, the housing including a fluid reservoir exterior to the interior environment and configured to contain a fluid, forming a different atmosphere in the fluid reservoir than the interior atmosphere, to form a fluidic barrier seal that seals the interior environment from an environment exterior to the carrier.

18 Claims, 51 Drawing Sheets

(56) References Cited

U.S. PATENT DOCUMENTS

| | | |
|---|---|---|
| 6,188,323 B1 | 2/2001 | Rosenquist et al. |
| 6,390,145 B1 | 5/2002 | Okabe et al. |
| 6,452,503 B1 | 9/2002 | Weiss |
| 6,536,136 B2 | 3/2003 | Saga |
| 6,636,626 B1 | 10/2003 | Yoo et al. |
| 6,758,876 B2 | 7/2004 | Suzuki et al. |
| 6,825,486 B1 | 11/2004 | Cole et al. |
| 6,883,539 B2 | 4/2005 | Inoue et al. |
| 6,918,731 B2 | 7/2005 | Talmer |
| 7,015,492 B2 | 3/2006 | Garssen et al. |
| 7,202,491 B2 | 4/2007 | Garssen et al. |
| 8,109,407 B2 | 2/2012 | Hsiao et al. |
| 8,591,809 B2 | 11/2013 | Ra et al. |
| 8,837,777 B2 | 9/2014 | Yasuda et al. |
| 9,159,600 B2 | 10/2015 | Mizokawa et al. |
| 10,395,959 B2 | 8/2019 | Babbs et al. |
| 2001/0017192 A1* | 8/2001 | Hwang ............ H01L 21/67781 156/345.32 |
| 2001/0026747 A1 | 10/2001 | Saga |
| 2002/0162742 A1 | 11/2002 | Bae et al. |
| 2003/0002958 A1 | 1/2003 | Talmer |
| 2004/0013498 A1 | 1/2004 | Soucy et al. |
| 2004/0013500 A1 | 1/2004 | Gilchrist |
| 2004/0055650 A1 | 3/2004 | Inoue et al. |
| 2004/0069409 A1 | 4/2004 | Wu et al. |
| 2004/0238122 A1* | 12/2004 | Ishizawa ............ H01L 21/67201 156/345.31 |
| 2005/0005849 A1* | 1/2005 | Masuoka ........ H01L 21/67184 118/719 |
| 2006/0286300 A1 | 12/2006 | Ishikawa et al. |
| 2008/0045030 A1 | 2/2008 | Tahara |
| 2008/0295412 A1 | 12/2008 | Hsiao et al. |
| 2009/0003976 A1 | 1/2009 | Hofmeister et al. |
| 2009/0029560 A1 | 1/2009 | Hansen et al. |
| 2010/0038283 A1 | 2/2010 | Chiu et al. |
| 2010/0111648 A1 | 5/2010 | Tamura et al. |
| 2010/0282638 A1 | 11/2010 | Chiu et al. |
| 2015/0243538 A1 | 8/2015 | Miyajima et al. |

FOREIGN PATENT DOCUMENTS

| | | |
|---|---|---|
| JP | 06112297 | 4/1994 |
| JP | 06179472 | 6/1994 |
| JP | 09246351 | 9/1997 |
| JP | 2001002145 | 1/2001 |
| JP | 2001015583 | 1/2001 |
| JP | 2001284433 | 10/2001 |
| JP | 2001319959 | 11/2001 |
| JP | 2002231803 | 8/2002 |
| JP | 2004535671 | 11/2004 |
| JP | 2005333076 | 12/2005 |
| JP | 2011503837 | 1/2011 |
| JP | 2011527525 | 10/2011 |
| JP | 6510423 | 5/2019 |
| KR | 1020010078006 | 8/2001 |
| KR | 1020110029174 | 3/2011 |
| TW | 533174 | 5/2003 |
| TW | 568874 | 1/2004 |
| TW | 200815115 | 4/2008 |
| TW | 201233511 | 8/2012 |
| WO | 2008144670 | 11/2008 |
| WO | 2010003927 | 1/2010 |

* cited by examiner

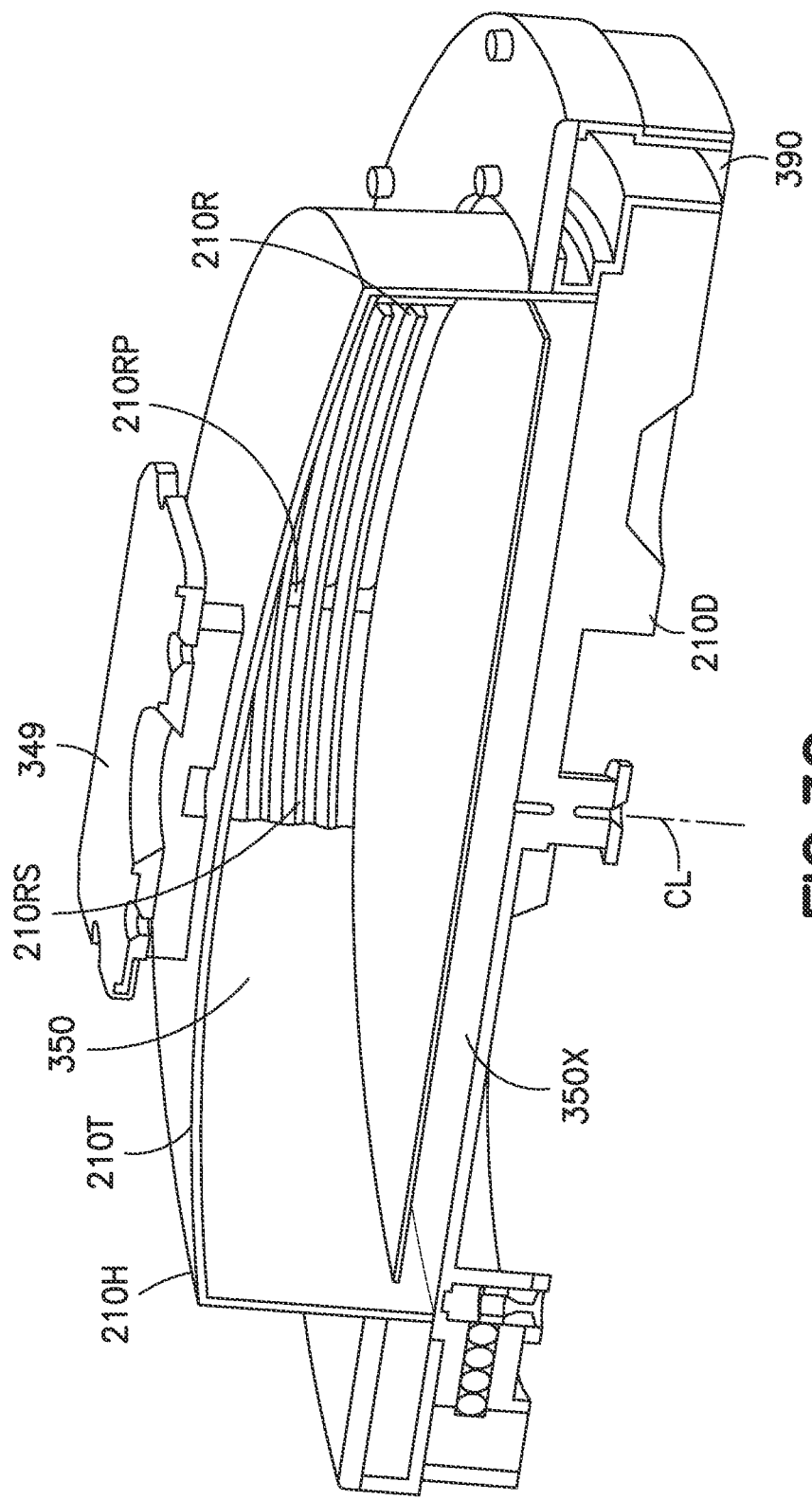

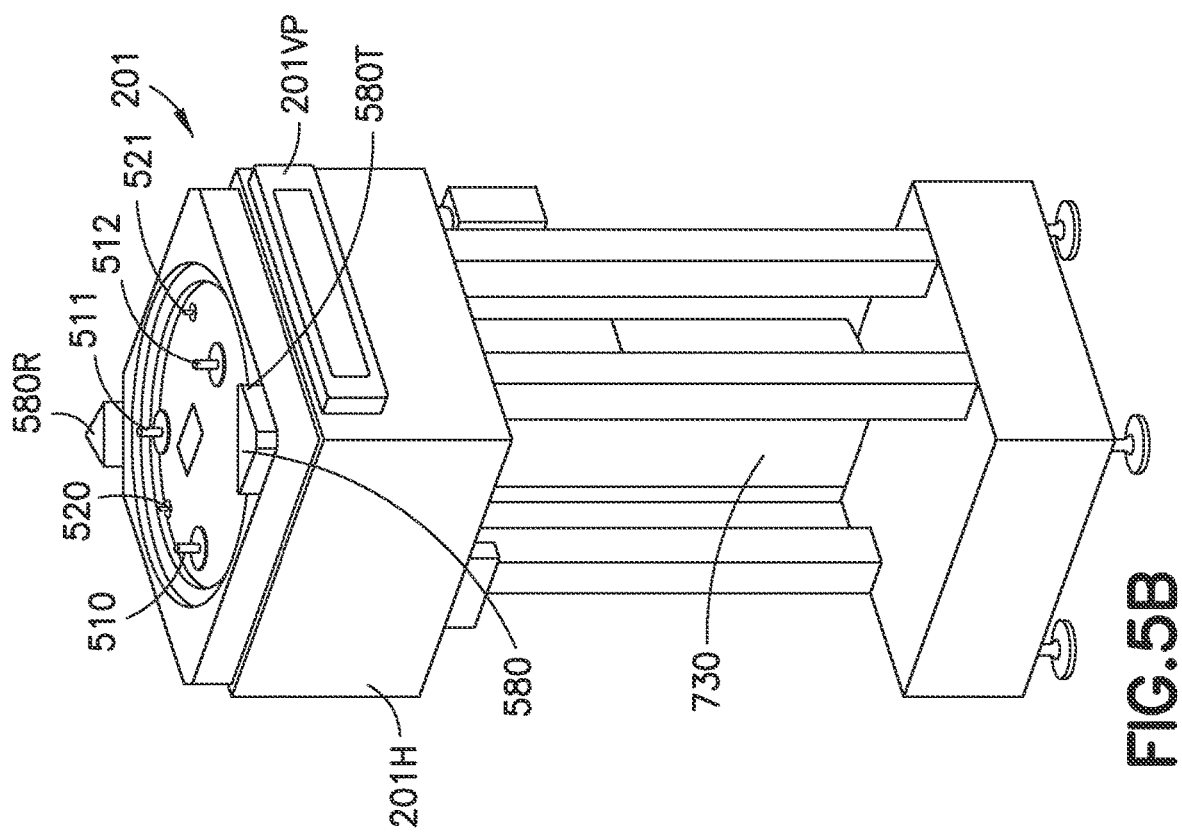
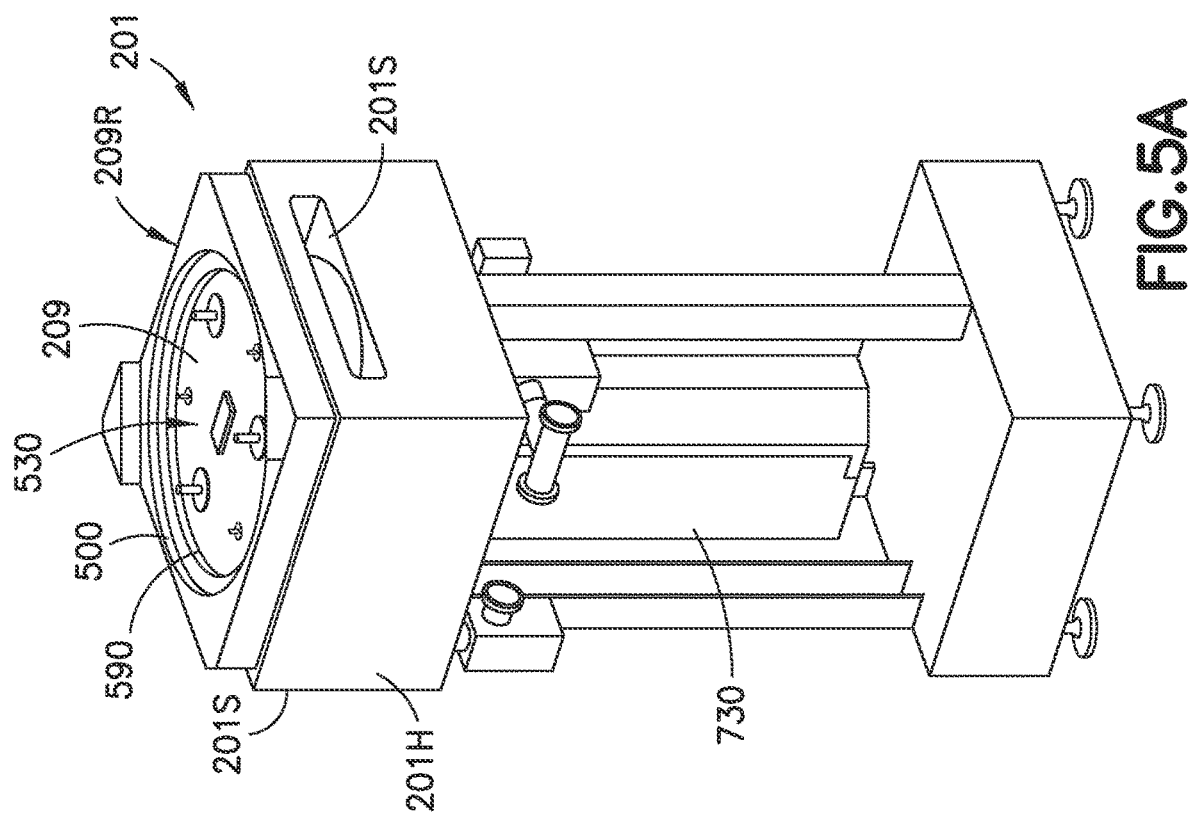

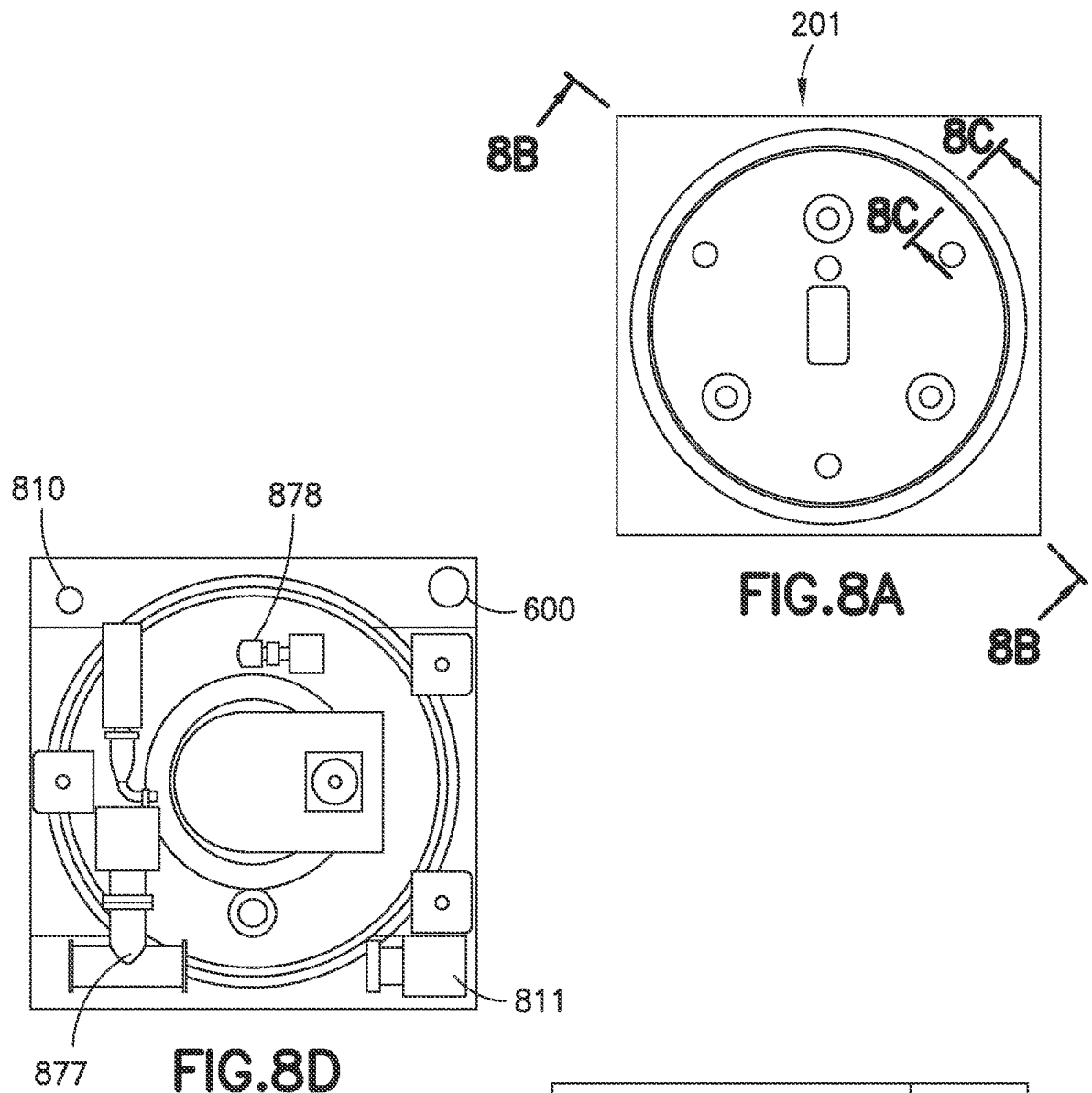
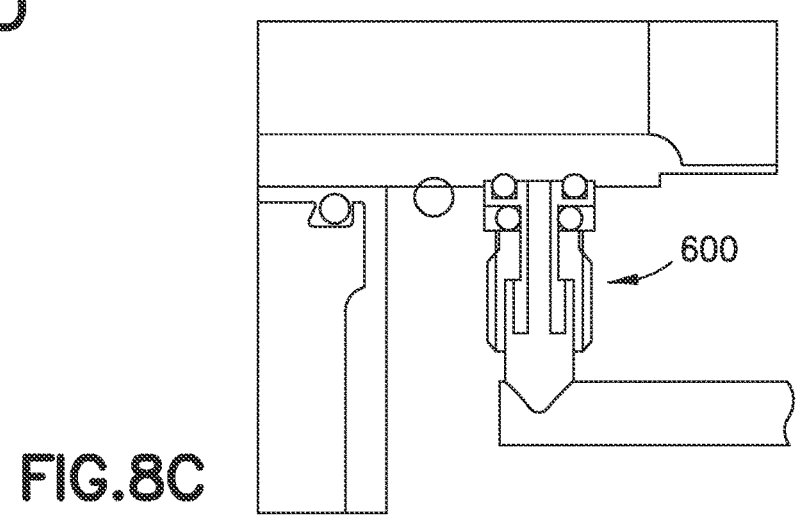

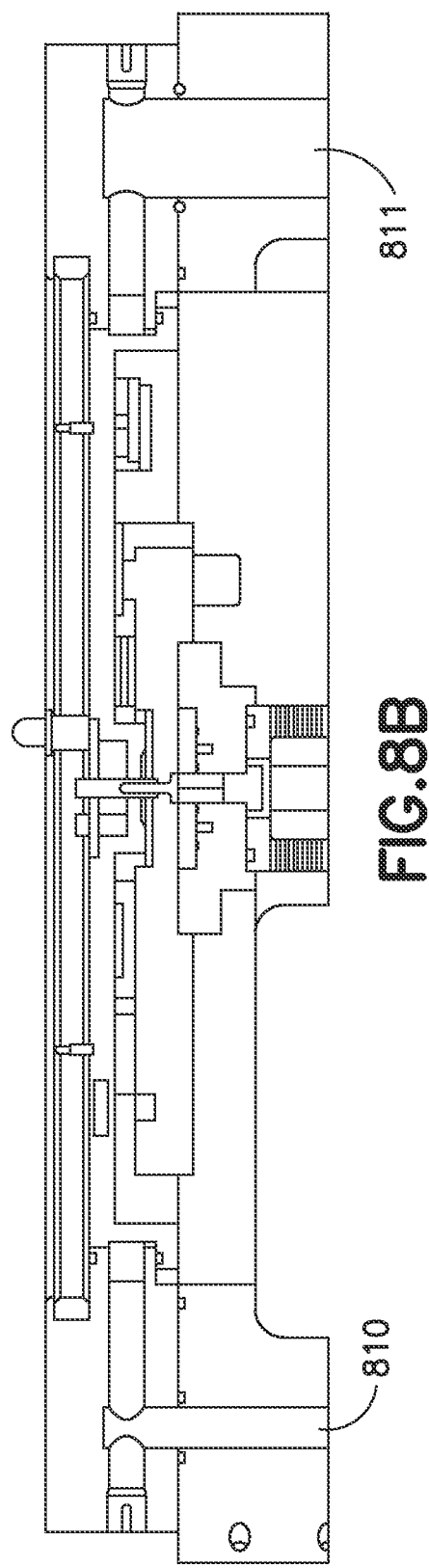

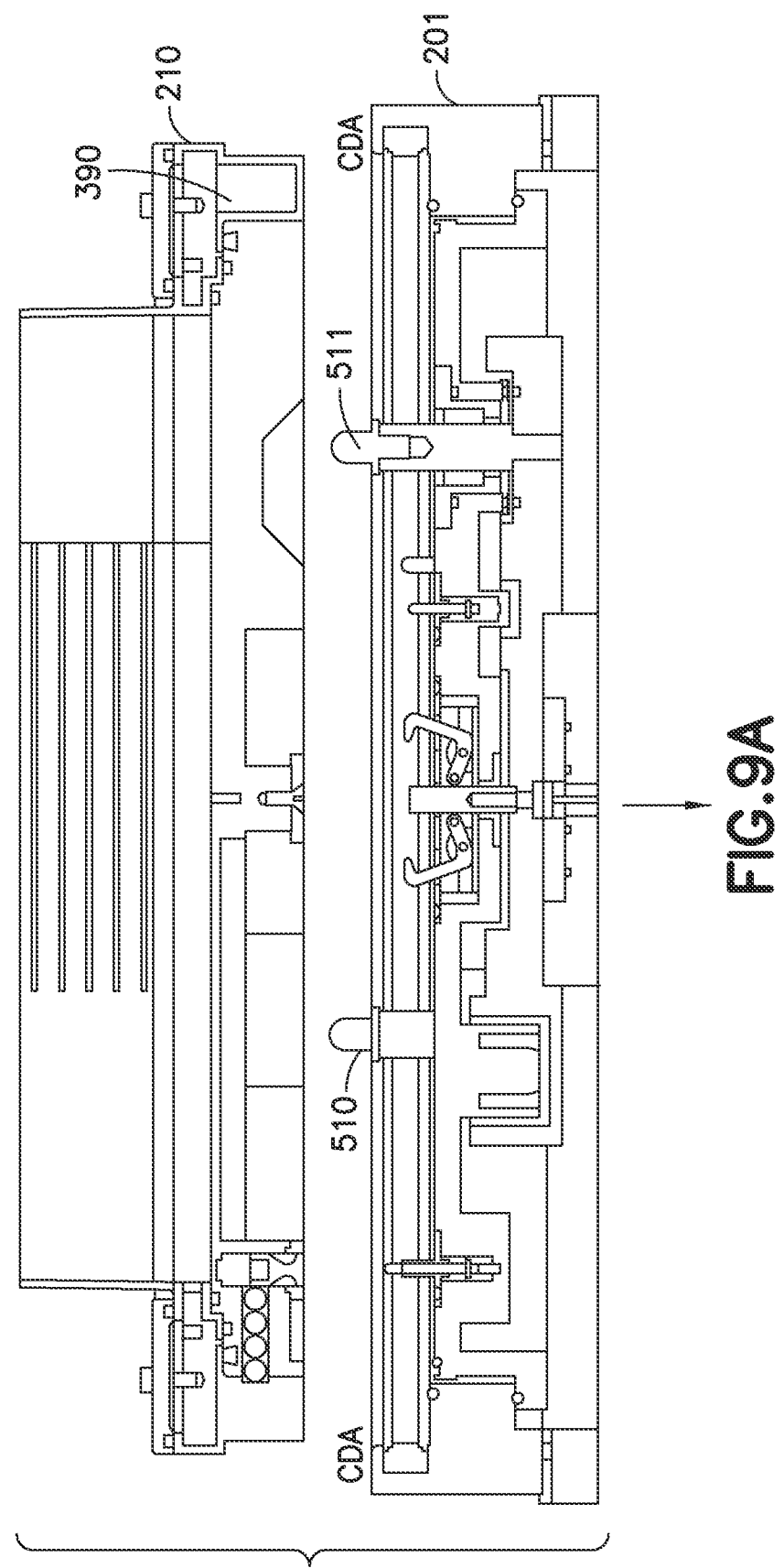

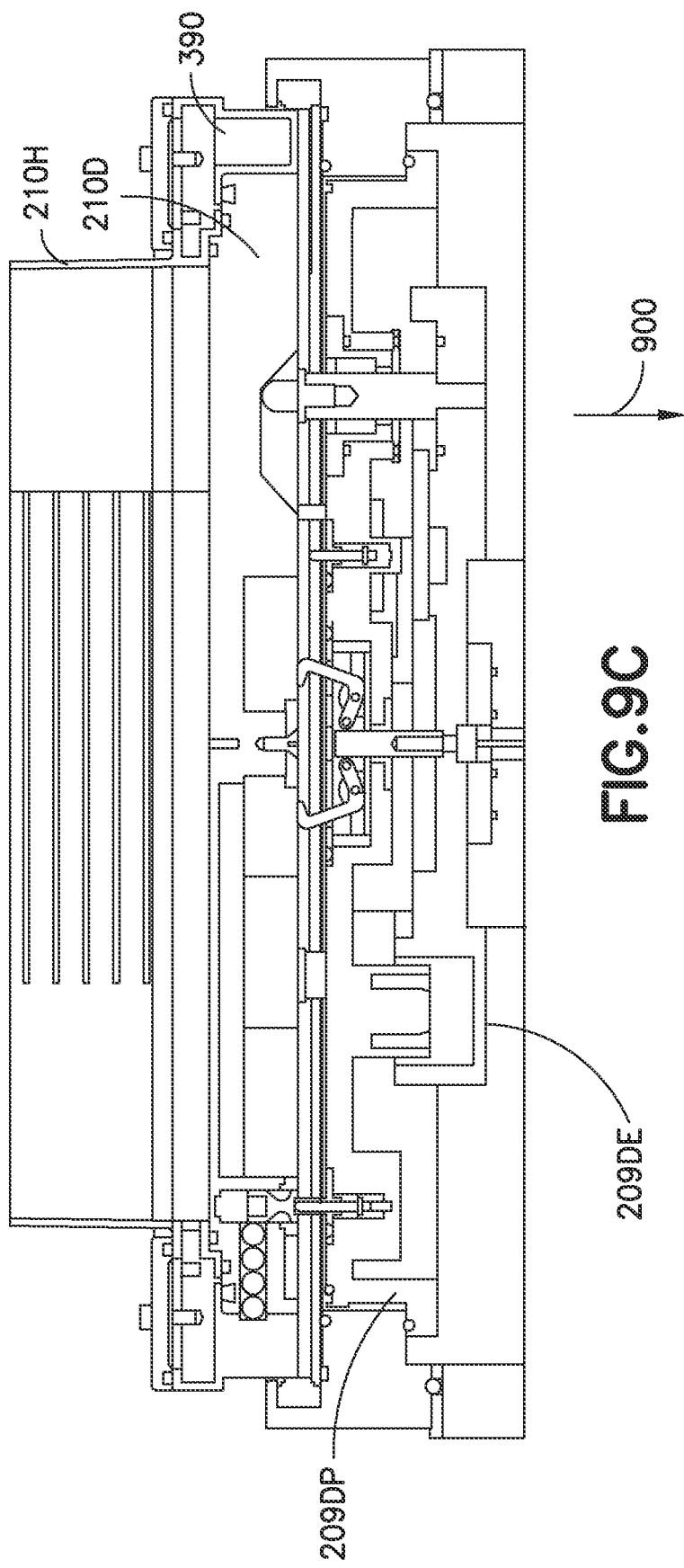

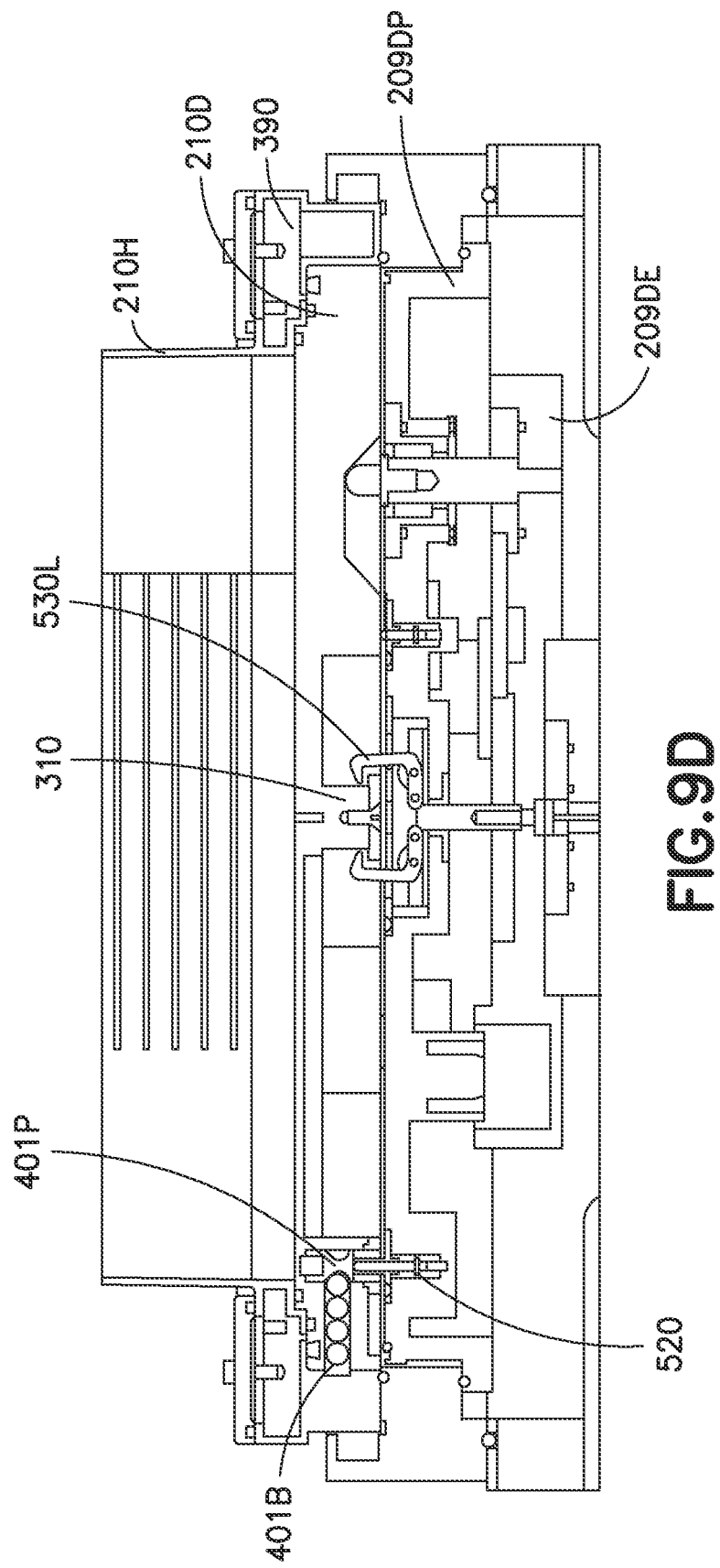

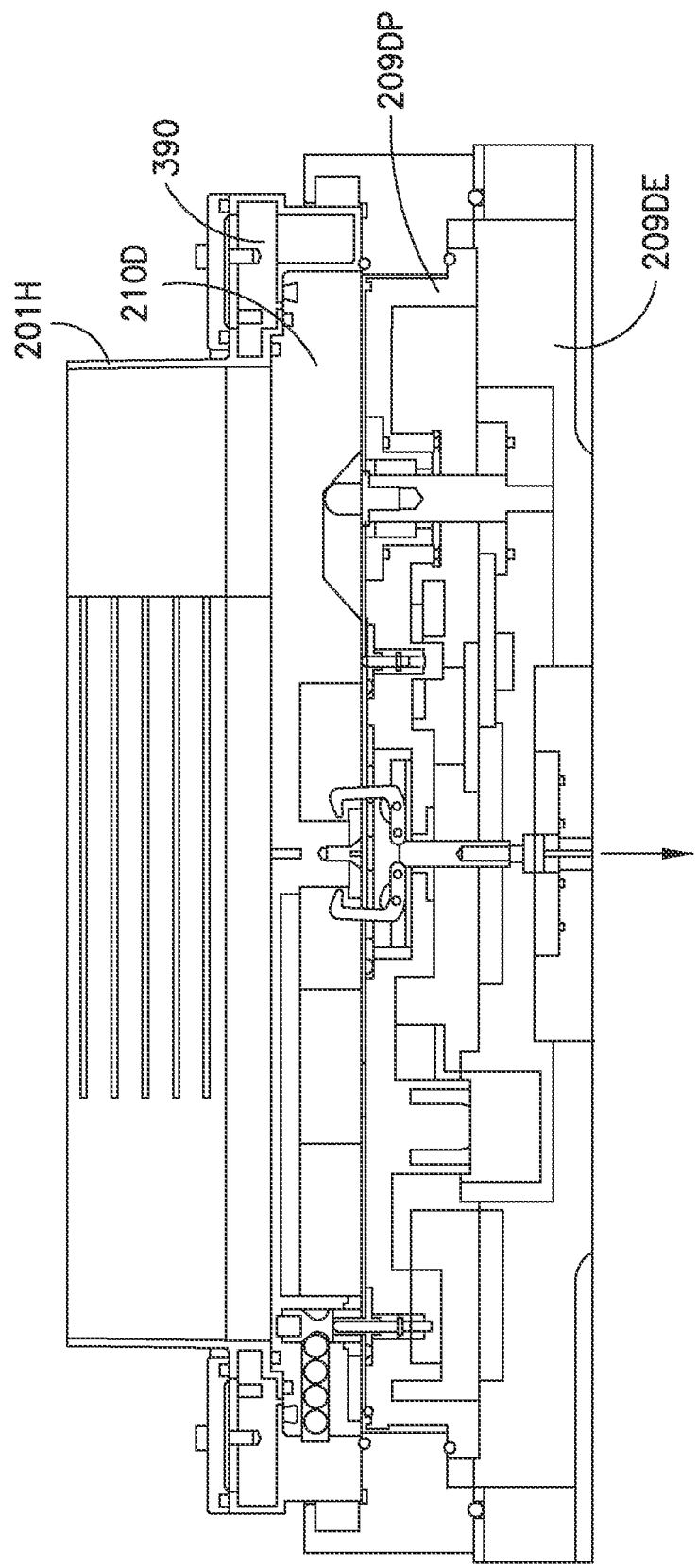

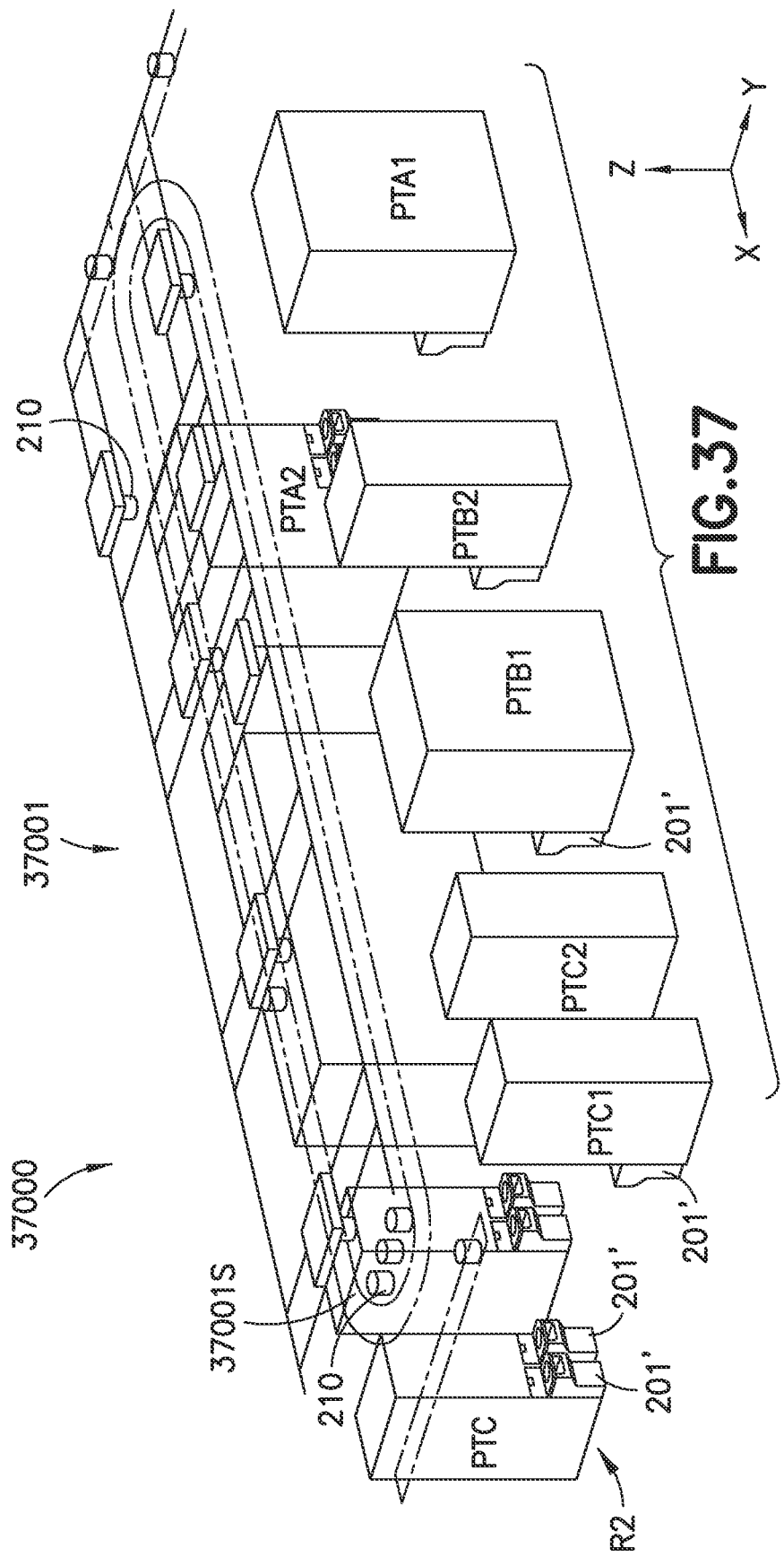

SUBSTRATE TRANSPORT

CROSS-REFERENCE TO RELATED APPLICATIONS

This application is a continuation of U.S. Non-Provisional application Ser. No. 17/475,083, filed Sep. 14, 2021, (now U.S. Pat. No. 11,658,051), which is a continuation of U.S. Non-Provisional patent application Ser. No. 16/552,881, filed Aug. 27, 2019, (now U.S. Pat. No. 11,121,015), which is a continuation of U.S. Non-Provisional patent application Ser. No. 14/161,039, filed on Jan. 22, 2014 (now U.S. Pat. No. 10,395,959), which claims priority from and the benefit of U.S. provisional patent application No. 61/755,156 filed on Jan. 22, 2013, the disclosures of which are incorporated herein by reference in their entireties.

BACKGROUND

1. Field

The aspects of the disclosed embodiment generally relate to substrate transports and, more particularly, to substrate carriers and their tool interface(s).

2. Brief Description of Related Developments

Substrates such as semiconductor wafers are generally carried between tools and stored in some form of carrier so the substrates are not exposed to the uncontrolled ambient environment in the semiconductor factory and protected from contaminants. Generally the carriers used remain at atmospheric pressure and chemistry in order to transport substrates to various processing equipment. Other substrate transport solutions include carriers that can be filled with an inert gas, such as nitrogen, but these carriers ultimately can expose the wafers to contamination because they are not hermetically sealed and the internal volume of the carrier can be exposed to uncontrolled environments on the processing equipment. A conventional carrier is constructed of materials which can attract moisture and oxygen and, in instances where moisture or oxygen is a contaminant of concern, the carrier internal environment during wafer transport or storage will likely result in contamination of the wafers. Even in the case of a conventional carrier filled with inert gas the water concentration inside the carrier can be elevated due to moisture entering the inert gas volume from internal carrier surfaces and this water can contaminate the wafer surface. It is noted that for some processes it is undesirable for substrates to be exposed to any type of contaminants, such as moisture, oxygen, and airborne particulates, when being transported from one tool to the next.

BRIEF DESCRIPTION OF THE DRAWINGS

The foregoing aspects and other features of the disclosed embodiment are explained in the following description, taken in connection with the accompanying drawings, wherein:

FIGS. 3A-3D are schematic illustrations of a substrate carrier in accordance with aspects of the disclosed embodiment;

FIGS. 5A-5C are schematic illustrations of a portion of a processing tool in accordance with aspects of the disclosed embodiment;

FIGS. 8A-8D are schematic illustrations of portions of a processing tool in accordance with aspects of the disclosed embodiment;

FIGS. 9A-9F are schematic illustrations of portions of a processing tool in accordance with aspects of the disclosed embodiment;

FIG. 37 is a schematic illustration of a fabrication facility in accordance with aspects of the disclosed embodiment;

DETAILED DESCRIPTION

Although the aspects of the disclosed embodiment will be described with reference to the drawings, it should be understood that the aspects of the disclosed embodiment can be embodied in many forms. In addition, any suitable size, shape or type of elements or materials could be used.

Referring to FIGS. 1A-1D, there are shown schematic views of substrate processing apparatus or tools incorporating aspects of the disclosed embodiment as disclosed further herein.

Figure 1A:
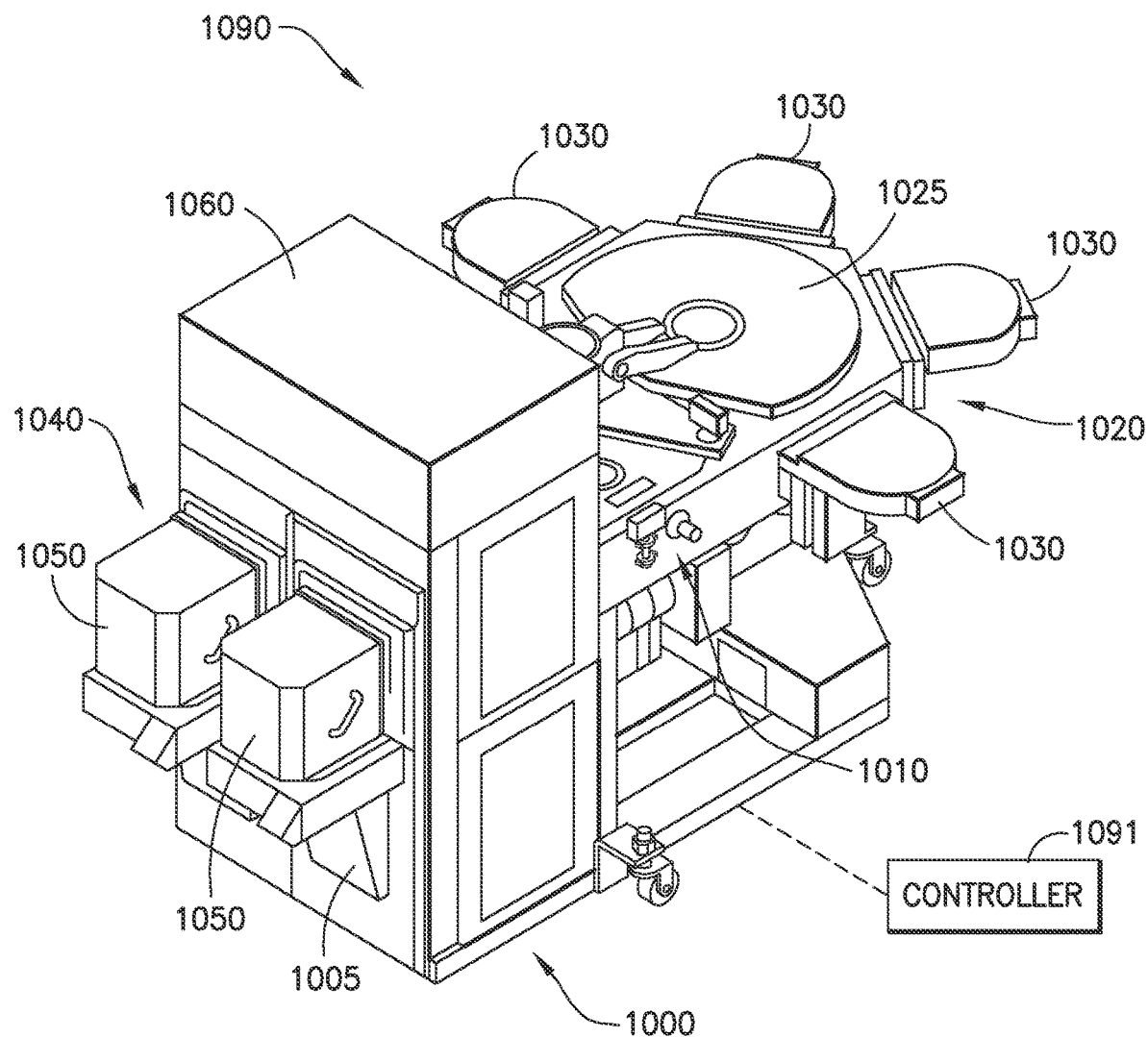
FIGS. 1A-1D are schematic views of processing tools in accordance with aspects of the disclosed embodiment.
Figure 1B:
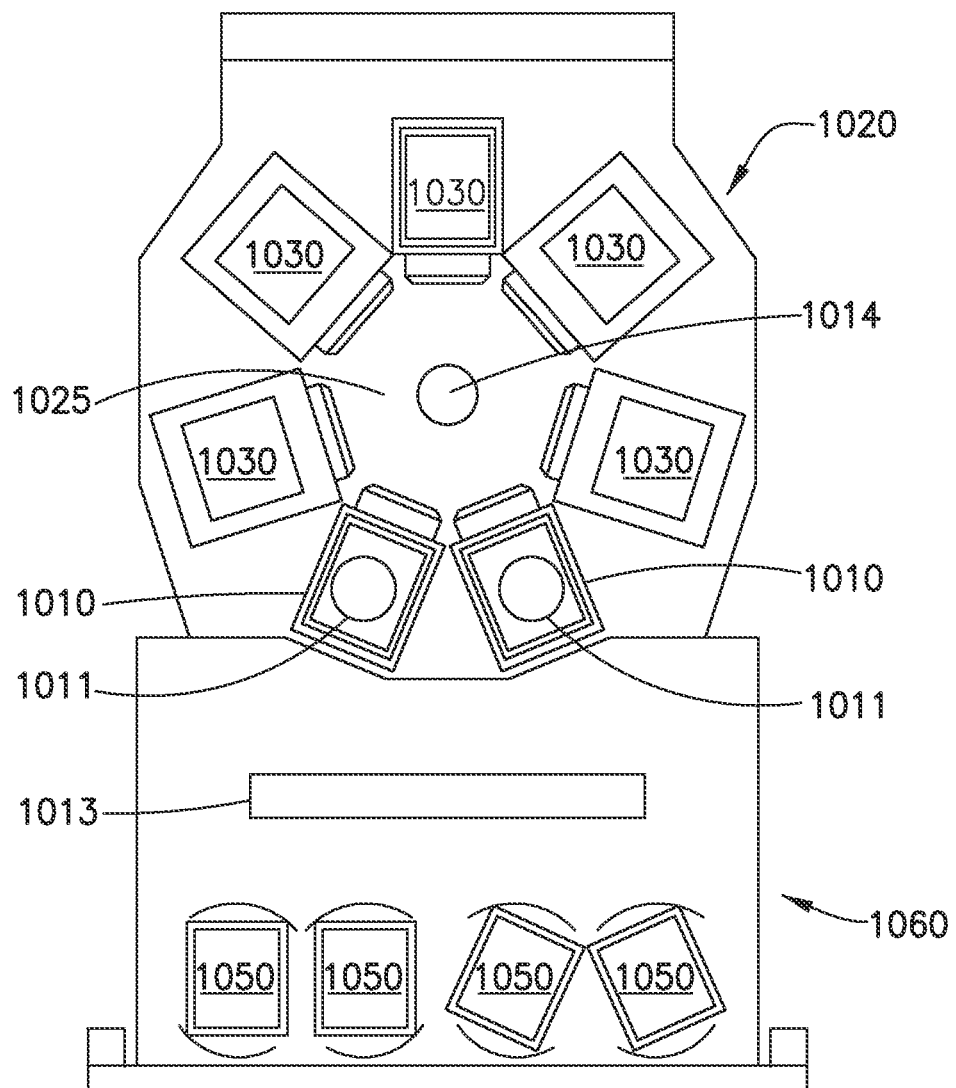

Referring to FIGS. 1A and 1B, a processing apparatus, such as for example a semiconductor tool station 1090 is shown in accordance with an aspect of the disclosed embodiment. Although a semiconductor tool is shown in the drawings, the aspects of the disclosed embodiment described herein can be applied to any tool station or application employing robotic manipulators. In this example the tool 1090 is shown as a cluster tool, however the aspects of the disclosed embodiments may be applied to any suitable tool station such as, for example, a linear tool station such as that shown in FIGS. 1C and 1D and described in U.S. patent application Ser. No. 11/442,511, entitled "Linearly Distributed Semiconductor Workpiece Processing Tool," filed May 26, 2006, the disclosure of which is incorporated by reference herein in its entirety. The tool station 1090 generally includes an atmospheric front end 1000, a vacuum load lock 1010 and a vacuum back end 1020. In other aspects, the tool station may have any suitable configuration. The components of each of the front end 1000, load lock 1010 and back end 1020 may be connected to a controller 1091 which may be part of any suitable control architecture such as, for example, a clustered architecture control. The control system may be a closed loop controller having a master controller, cluster controllers and autonomous remote controllers such as those disclosed in U.S. patent application Ser. No. 11/178,615, entitled "Scalable Motion Control System," filed Jul. 11, 2005, the disclosure of which is incorporated by reference herein in its entirety. In other aspects, any suitable controller and/or control system may be utilized.

It is noted that one or more of the tool modules may include a workpiece transport or robot for transferring the workpiece(s) throughout the tool.

In the aspects of the disclosed embodiment, the front end 1000 generally includes load port modules 1005 and a mini-environment 1060 such as for example a mini-environment/equipment front end module (EFEM). The load port modules 1005 may be box opener/loader to tool standard (BOLTS) interfaces that conform to SEMI standards E15.1, E47.1, E62, E19.5 or E1.9 for 300 mm load ports, front opening or bottom opening boxes/pods and cassettes. In other aspects, the load port modules and other components of the tool, as described herein, may be configured to interface with or otherwise operate on 200 mm, 300 mm or 450 mm wafers or any other suitable size and shape of substrate such as for example larger or smaller wafers, rectangular or square wafers, or flat panels for flat panel displays, light emitting diodes or solar arrays. In other aspects the components of the tool, including for example the substrate transports, as described herein may be configured to handle hot wafers from any one or more of the semiconductor manufacturing processes described herein. Although two load port modules are shown in FIG. 1A, in other aspects any suitable number of load port modules may be incorporated into the front end 1000. The load port modules 1005 may be configured to receive substrate carriers or cassettes 1050 from an overhead transport system, automatic guided vehicles, person guided vehicles, rail guided vehicles or from any other suitable transport method. The load port modules 1005 may interface with the mini-environment 1060 through load ports 1040. The load ports 1040 may allow the passage of substrates between the substrate cassettes 1050 and the mini-environment 1060. The mini-environment 1060 generally includes a transfer robot 1013. In one aspect of the disclosed embodiment the robot 1013 may be a track mounted robot such as that described in, for example, U.S. Pat. No. 6,002,840, the disclosure of which is incorporated by reference herein in its entirety. The mini-environment 1060 may provide a controlled, clean zone for substrate transfer between multiple load port modules.

The vacuum load lock 1010 may be located between and connected to the mini-environment 1060 and the back end 1020. The load lock 1010 generally includes atmospheric and vacuum slot valves. The slot valves may provide the environmental isolation employed to evacuate the load lock after loading a substrate from the atmospheric front end and to maintain the vacuum in the transfer chamber when evacuating the lock with an inert gas such as nitrogen. It is noted that the term evacuate as used herein corresponds to the removal of gas from a volume where the removal is done by venting the gas, e.g. by opening a valve, or by pumping the gas out of the volume. In one aspect, during evacuation the gas may be replaced (e.g. purging) so as to maintain a predetermined pressure within the volume or the gas may not be replaced or only be partially replaced so that a vacuum is formed within the volume. The load lock 1010 may also include an aligner 1011 for aligning a fiducial of the substrate to a desired position for processing. In other aspects, the vacuum load lock may be located in any suitable location of the processing apparatus and have any suitable configuration.

The vacuum back end 1020 generally includes a transfer chamber 1025, one or more processing station(s) 1030 and a transfer robot 1014. The transfer robot 1014 will be described below and may be located within the transfer chamber 1025 to transport substrates between the load lock 1010 and the various processing stations 1030. The processing stations 1030 may operate on the substrates through various deposition, etching, or other types of processes to form electrical circuitry or other desired structure on the substrates. Typical processes include but are not limited to thin film processes that use a vacuum such as plasma etch or other etching processes, chemical vapor deposition (CVD), plasma vapor deposition (PVD), implantation such as ion implantation, metrology, rapid thermal processing (RTP), dry strip atomic layer deposition (ALD), oxidation/diffusion, forming of nitrides, vacuum lithography, epitaxy (EPI), wire bonder and evaporation or other thin film processes that use vacuum pressures. The processing stations 1030 are connected to the transfer chamber 1025 to allow substrates to be passed from the transfer chamber 1025 to the processing stations 1030 and vice versa.

Figure 1C:
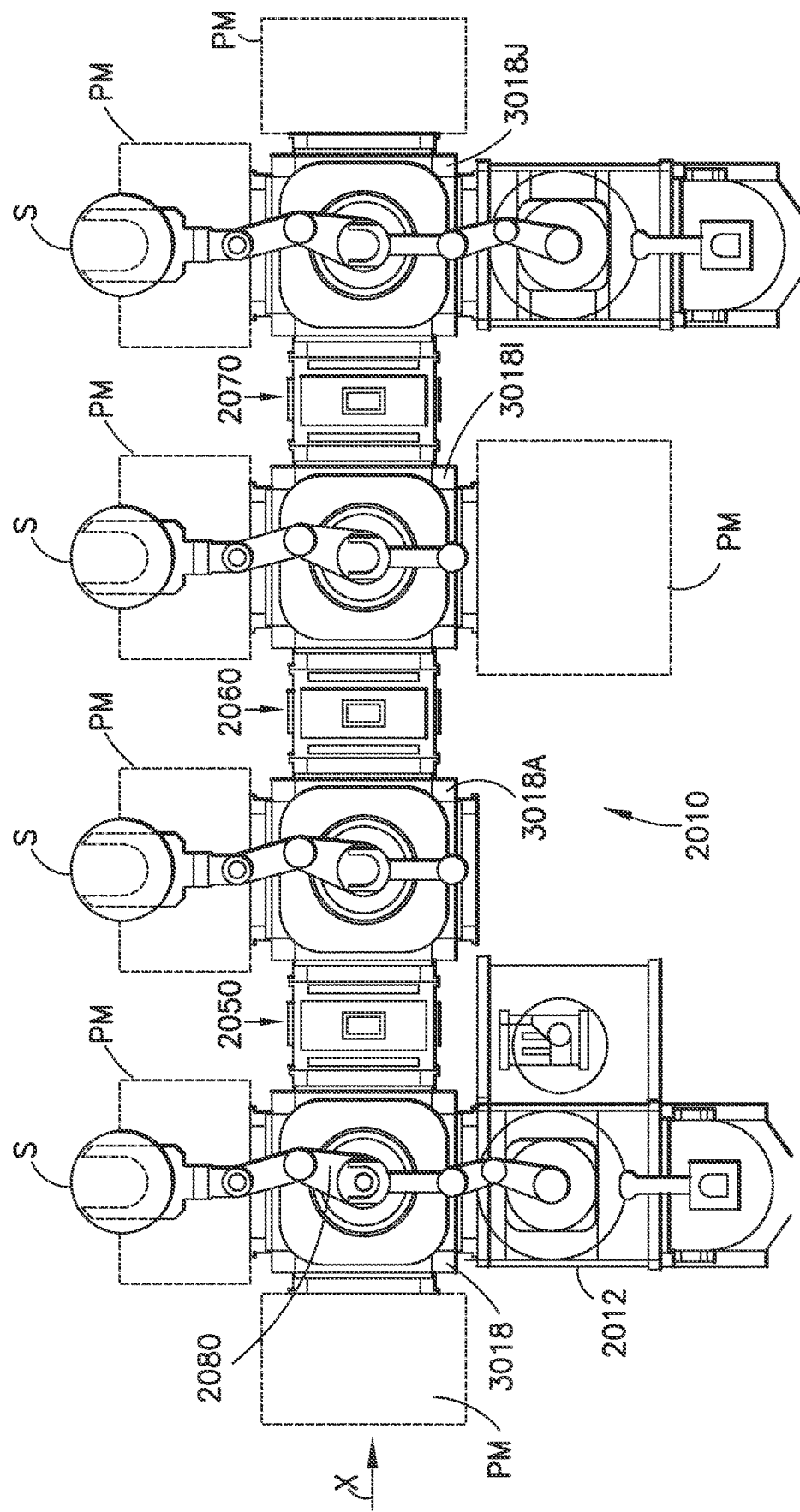

Referring now to FIG. 1C, a schematic plan view of a linear substrate processing system 2010 is shown where the tool interface section 2012 is mounted to a transfer chamber module 3018 so that the interface section 2012 is facing generally towards (e.g. inwards) but is offset from the longitudinal axis X of the transfer chamber 3018. The transfer chamber module 3018 may be extended in any suitable direction by attaching other transfer chamber modules 3018A, 3018I, 3018J to interfaces 2050, 2060, 2070 as described in U.S. patent application Ser. No. 11/442,511, previously incorporated herein by reference. Each transfer chamber module 3018, 3019A, 3018I, 3018J includes a substrate transport 2080 for transporting substrates throughout the processing system 2010 and into and out of, for example, processing modules PM. As may be realized, each chamber module may be capable of holding an isolated, controlled or sealed atmosphere (e.g. N2, clean air, vacuum).

Figure 1D:
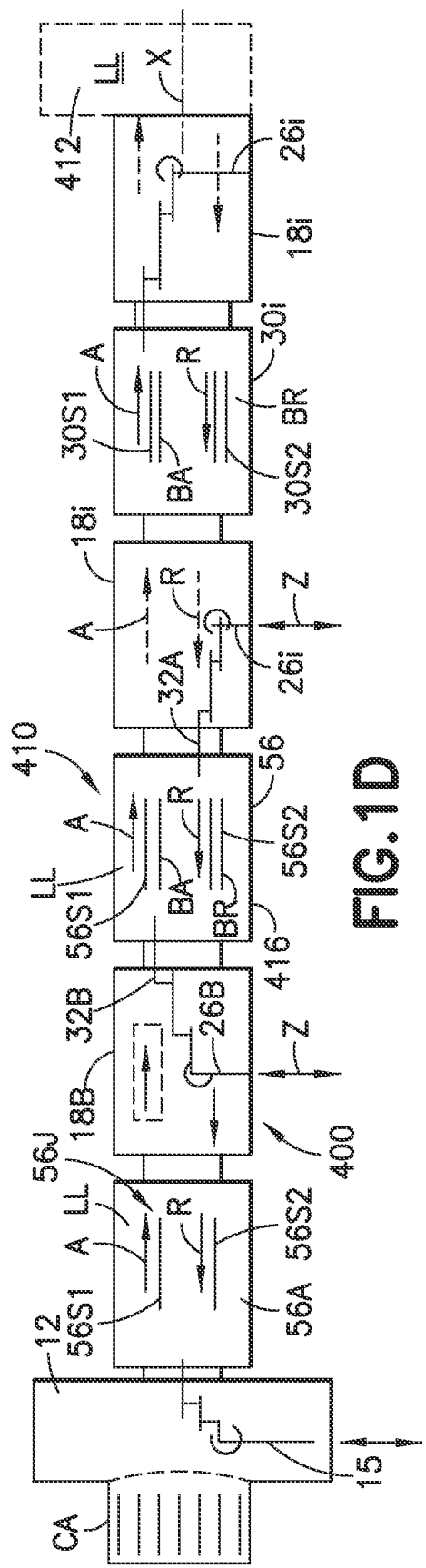
Figure 2A:
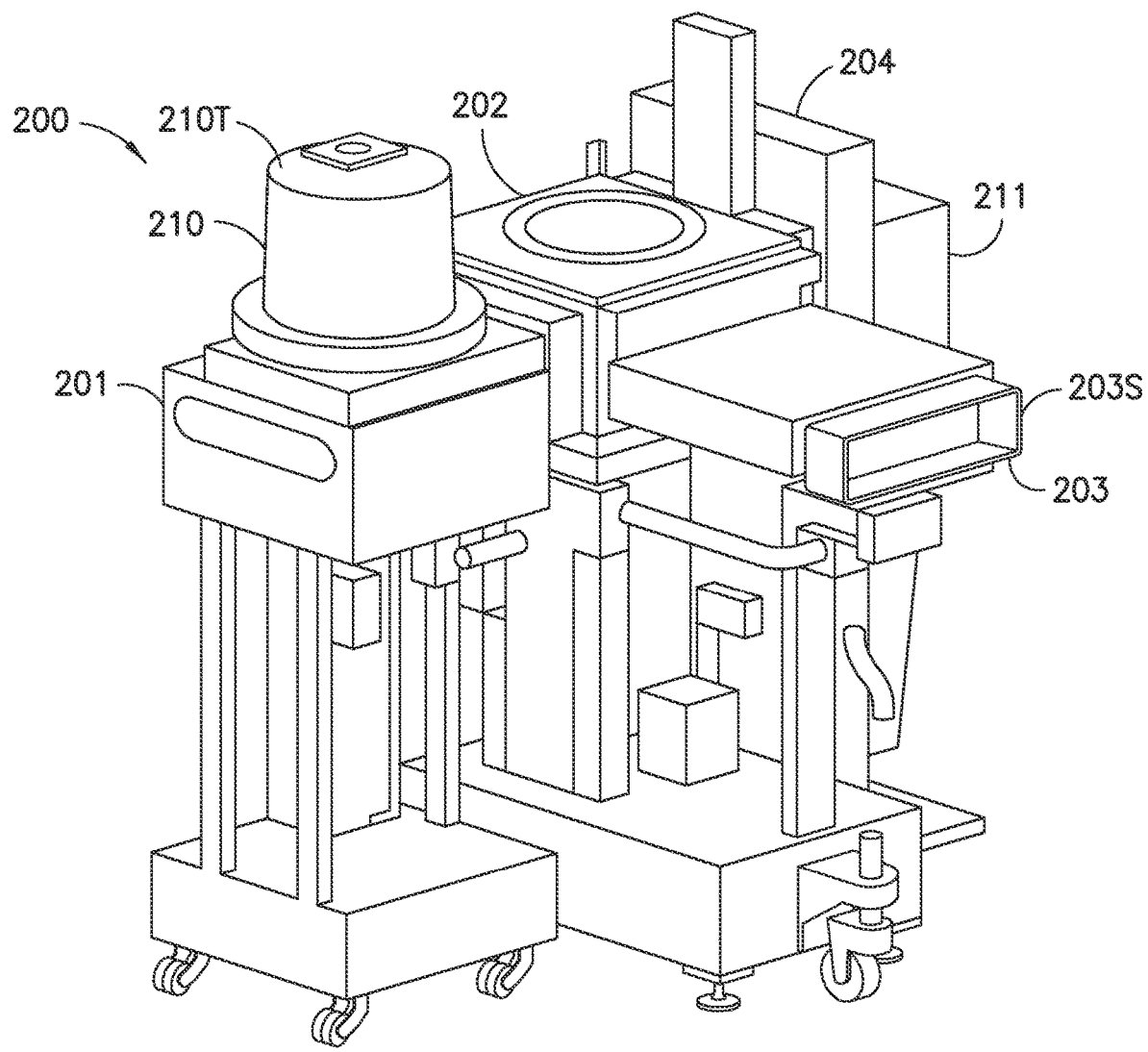
FIGS. 2A-2E are schematic illustrations of a portion of a processing tool in accordance with aspects of the disclose embodiment.
Figure 2B:
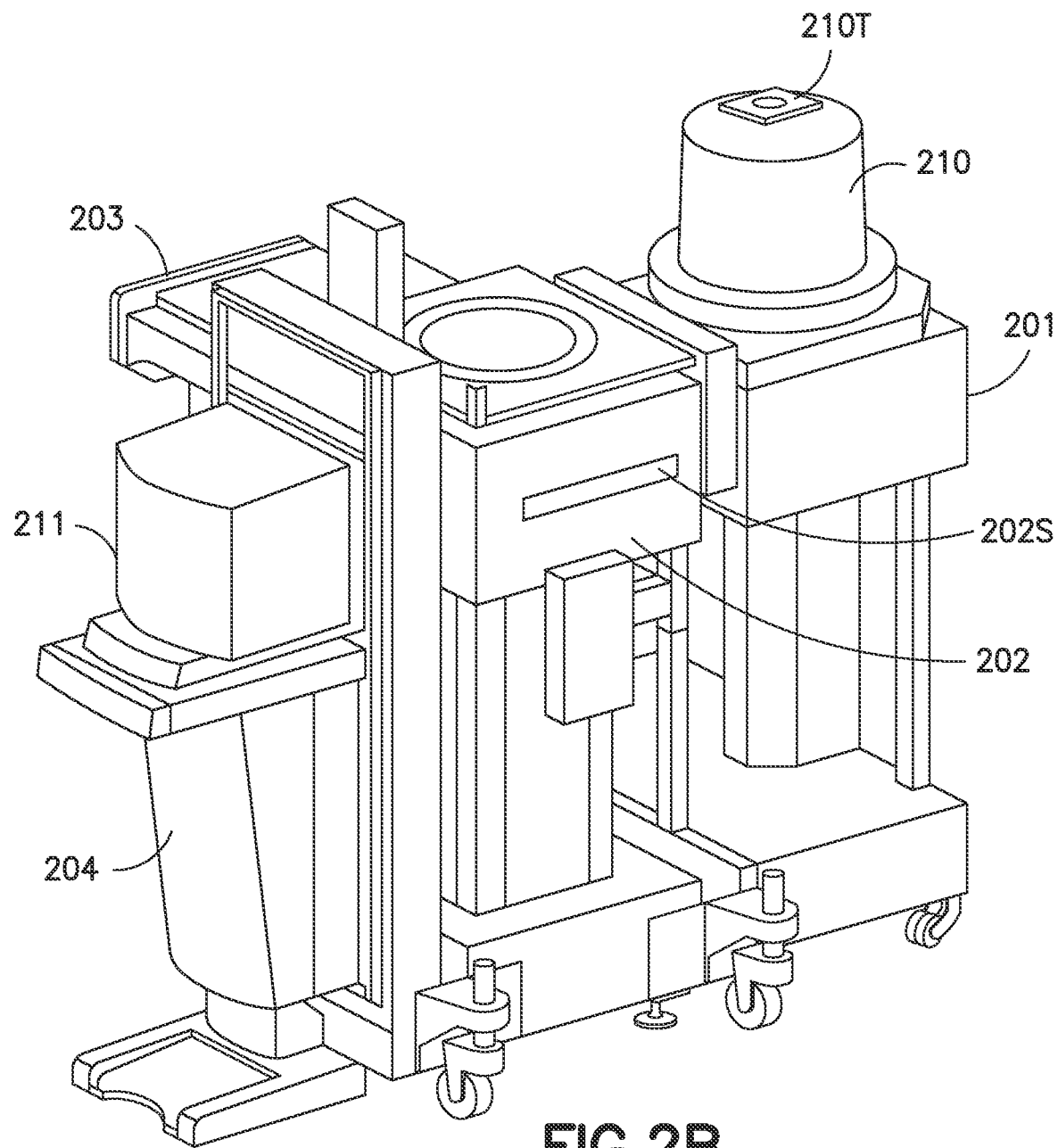
Figure 2C:
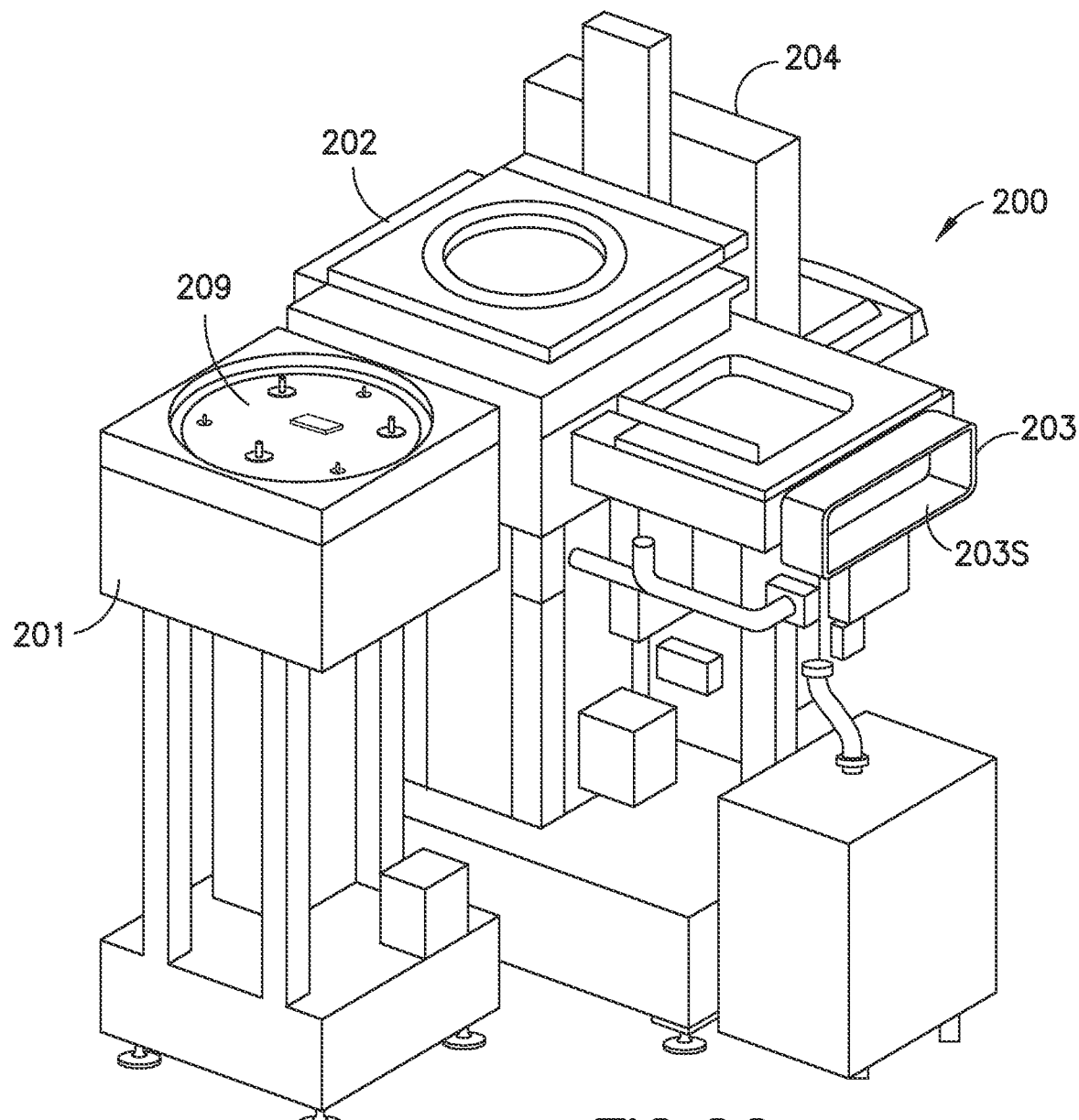
Figure 2D:
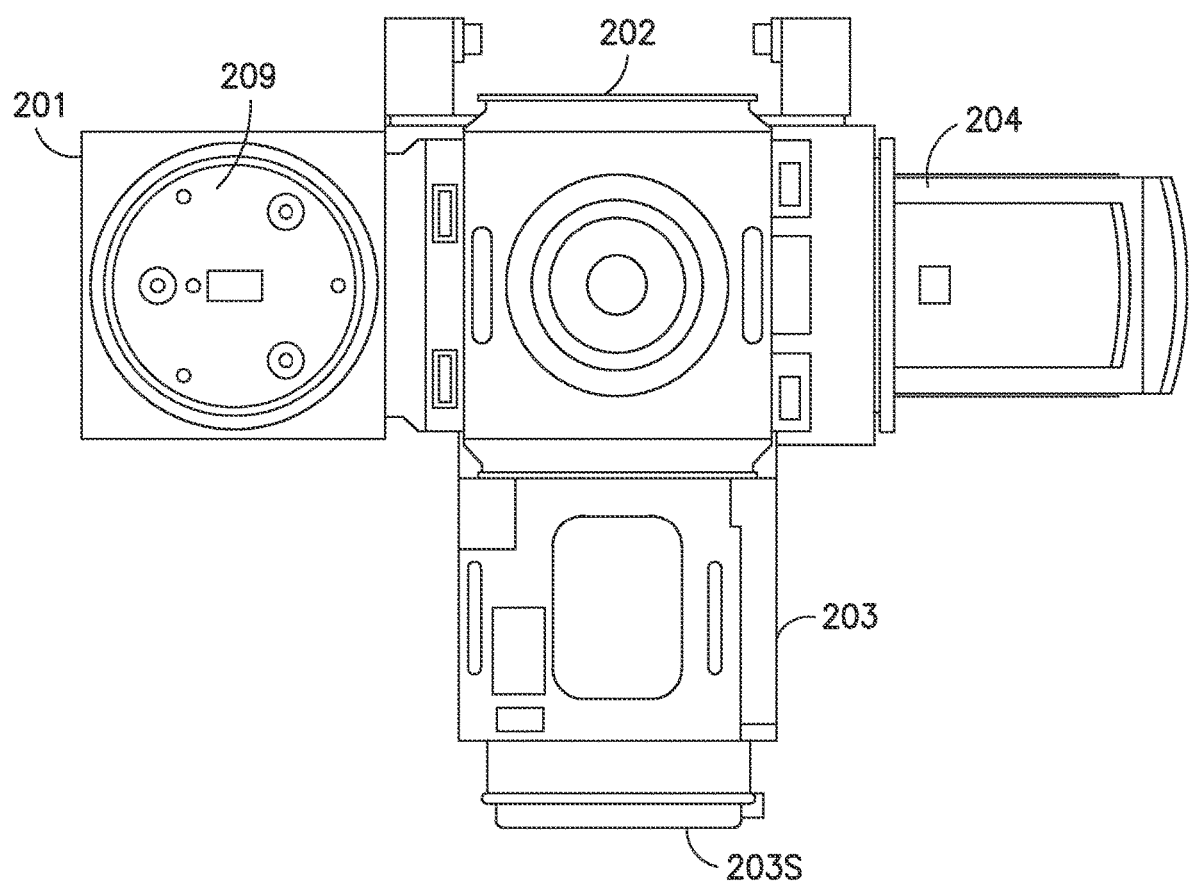
Figure 2E:
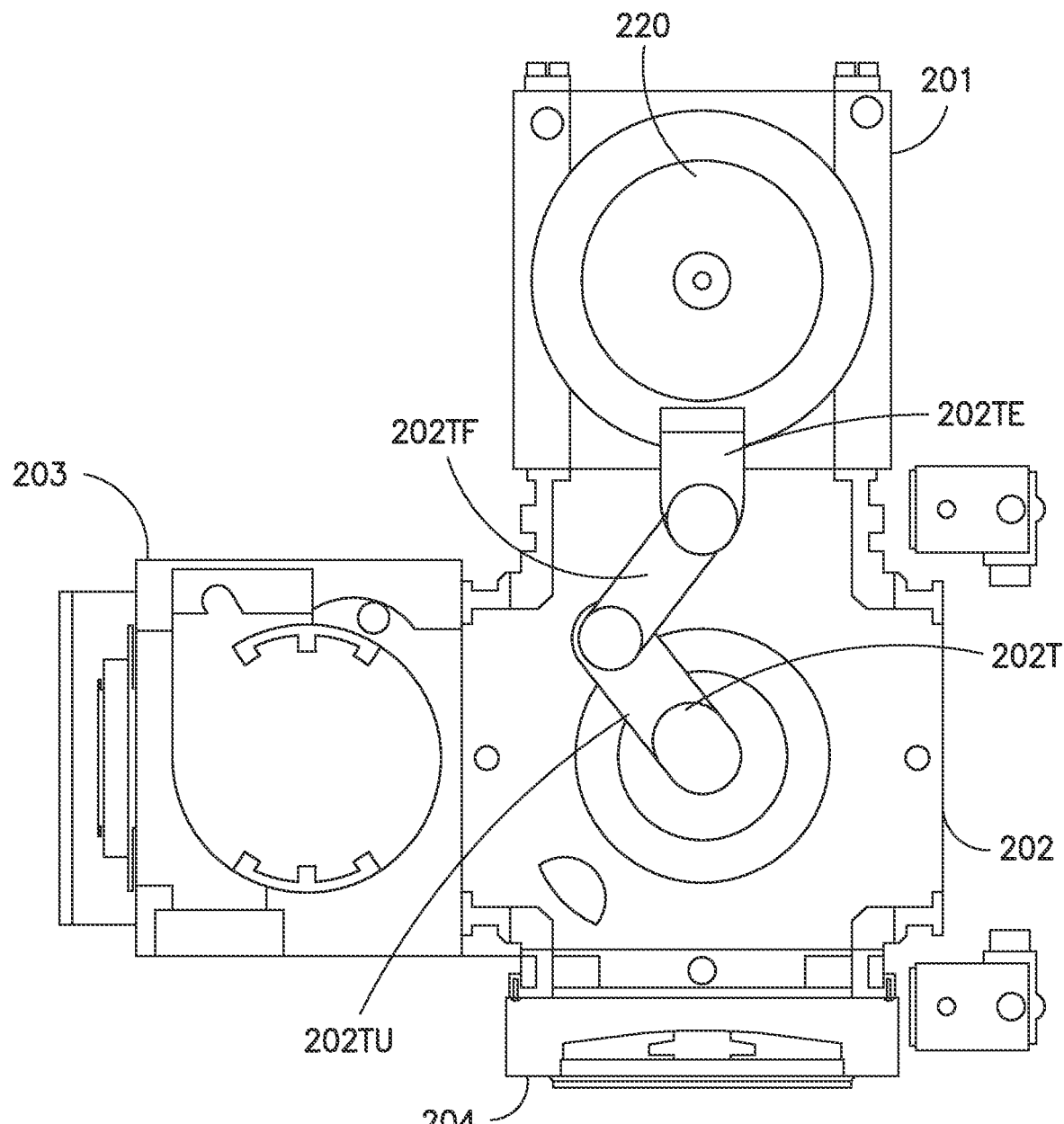

Referring to FIG. 1D, there is shown a schematic elevation view of an exemplary processing tool 410 such as may be taken along longitudinal axis X of the linear transfer chamber 416. In one aspect, as shown in FIG. 1D, the tool interface section 12 may be representatively connected to the transfer chamber 416. In this aspect, interface section 12 may define one end of the tool transfer chamber 416. As seen in FIG. 1D, the transfer chamber 416 may have another workpiece entry/exit station 412 for example at an opposite end from interface section 12. In other aspects, other entry/exit stations for inserting/removing work pieces from the transfer chamber may be provided such as between the ends of the tool transfer chamber 416. In one aspect of the disclosed embodiment, interface section 12 and entry/exit station 412 may allow loading and unloading of workpieces from the tool. In other aspects, workpieces may be loaded into the tool from one end and removed from the other end. In one aspect, the transfer chamber 416 may have one or more transfer chamber module(s) 18B, 18i. Each chamber module may be capable of holding an isolated, controlled or sealed atmosphere (e.g. N2, clean air, vacuum). As noted before, the configuration/arrangement of the transfer chamber modules 18B, 18i, load lock modules 56A, 56B and workpiece stations forming the transfer chamber 416 shown in FIG. 1D is merely exemplary, and in other aspects the transfer chamber may have more or fewer modules disposed in any desired modular arrangement. In one aspect station 412 may be a load lock. In other aspects, a load lock module may be located between the end entry/exit station (similar to station 412) or the adjoining transfer chamber module (similar to module 18i) may be configured to operate as a load lock. As also noted before, transfer chamber modules 18B, 18i have one or more corresponding transport apparatus 26B, 26i located therein. The transport apparatus 26B, 26i of the respective transfer chamber modules 18B, 18i may cooperate to provide the linearly distributed workpiece transport system 420 in the transfer chamber. In other aspects the transfer chamber modules 18B may be configured to allow any suitable transport cart (not shown) to travel between transfer chamber modules 18B along at least a portion of the length of the linear transfer chamber 416. As may be realized the transport cart 900 may include any suitable transport apparatus mounted thereto and substantially similar to those transport apparatuses described herein. As shown in FIG. 1D, in one aspect the arms of the transport apparatus 26B may be arranged to provide what may be referred to as fast swap arrangement allowing the transport to quickly swap wafers from a pick/place location as will also be described in further detail below. The transport arm 26B may have a suitable drive section for providing each arm with three (3) (e.g. independent rotation about shoulder and elbow joints with Z axis motion) degrees of freedom from a simplified drive system compared to conventional drive systems. In other aspects, the drive section may provide the arm with more or less than three degrees of freedom. As seen in FIG. 1D, in one aspect the modules 56A, 56, 30i may be located interstitially between transfer chamber modules 18B, 18i and may define suitable processing modules, load lock(s), buffer station(s), metrology station(s) or any other desired station(s). For example the interstitial modules, such as load locks 56A, 56 and workpiece station 30i, may each have stationary workpiece supports/shelves 56S, 56S1, 56S2, 30S1, 30S2 that may cooperate with the transport arms to effect transport or workpieces through the length of the transfer chamber along linear axis X of the transfer chamber. By way of example, workpiece(s) may be loaded into the transfer chamber 416 by interface section 12. The workpiece(s) may be positioned on the support(s) of load lock module 56A with the transport arm 15 of the interface section. The workpiece(s), in load lock module 56A, may be moved between load lock module 56A and load lock module 56 by the transport arm 26B in module 18B, and in a similar and consecutive manner between load lock 56 and workpiece station 30i with arm 26i (in module 18i) and between station 30i and station 412 with arm 26i in module 18i. This process may be reversed in whole or in part to move the workpiece(s) in the opposite direction. Thus, in one aspect, workpieces may be moved in any direction along axis X and to any position along the transfer chamber and may be loaded to and unloaded from any desired module (processing or otherwise) communicating with the transfer chamber. In other aspects, interstitial transfer chamber modules with static workpiece supports or shelves may not be provided between transfer chamber modules 18B, 18i. In such aspects of the disclosed embodiment, transport arms of adjoining transfer chamber modules may pass off workpieces directly (or through the use of a buffer station) from end effector or one transport arm to end effector of another transport arm to move the workpiece through the transfer chamber. The processing station modules may operate on the substrates through various deposition, etching, or other types of processes to form electrical circuitry or other desired structure on the substrates. The processing station modules are connected to the transfer chamber modules to allow substrates to be passed from the transfer chamber to the processing stations and vice versa. A suitable example of a processing tool with similar general features to the processing apparatus depicted in FIG. 1D is described in U.S. patent application Ser. No. 11/442,511, previously incorporated by reference in its entirety.

Referring now to FIGS. 2A-2E a portion of a processing tool 200 (e.g. such as those processing tools described above) is illustrated. The processing tool 200 may include a controlled environment interface module 201 (referred to herein as an "interface module"), a transfer chamber 202, a load lock 203 and a load port module 204. The load port module may be any suitable load port module such as those described in U.S. Pat. Nos. 6,641,348, 6,501,070, 6,815,661, 6,784,418, 6,765,222, 6,281,516 and U.S. patent application Ser. No. 11/178,836 (US Pub. No. 2007/0009345) filed on Jul. 11, 2005, the disclosures of which are incorporated herein by reference in their entireties. In one aspect the load port module may be configured to support and couple to a front opening unified pod (FOUP), a standard mechanical interface (SMIF) box or any other suitable portable substrate transfer/storage container 211 configured to hold any suitable size and shaped substrate(s) as described above.

The transfer chamber 202 may be any suitable transfer chamber configured to hold any suitable internal atmosphere. In one aspect the transfer chamber 202 may be configured to hold a vacuum within the chamber where the substrate transfer/storage container 211 is also configured to hold a vacuum therein and interface substantially directly with the vacuum environment of the transfer chamber 202. In other aspect the transfer chamber 202 may be configured to cycle the atmosphere within the transfer chamber 202 between, for example, an atmospheric environment and a vacuum environment. The transfer chamber 202 may include one or more sealable openings 202S for coupling the transfer chamber to any suitable semiconductor processing modules such as, for example, the interface module 201, another transfer chamber, the load lock 203 and/or the load port module 204. The transfer chamber 202 may also include any suitable substrate transport, such as substrate transport 202T, for transporting substrates between one or more of the substrate processing modules coupled to the transfer chamber 202. In one aspect the substrate transport 202T may be a selectively complaint articulated robot arm (SCARA) having, for example, at least one upper arm 202TU, at least one forearm 202TF and at least one substrate holder or end effector 202TE configured to hold at least one substrate 220. In other aspects the substrate transport may be a frog leg style arm, a bisymmetric transport arm, a sliding link transport arm, an unequal link substrate transport arm or any other suitable transport configured to transport one or more substrates from one substrate holding location to another substrate holding location.

The load lock 203 may be any suitable load lock configured to cycle an internal environment of the load lock between any two environments such as, for example, the internal environment of the transfer chamber 202 and a processing module (not shown) or another transfer chamber (not shown) coupled to the load lock 203. As may be realized, the load lock may include one or more sealable openings 203S configured for coupling the load lock 203 to any suitable substrate processing module in a manner similar to that described above.

Referring also to FIGS. 5A-8C the interface module 201 may be configured to interface with any suitable substrate carrier such as controlled environment substrate pod 210 (referred to herein as "substrate pod") which will be described in greater detail below. The interface module 201 may include features, as will be described below, to dock with, open and close the substrate pod 210. It is noted that while the substrate pod 210 is illustrated as a bottom opening pod and the interface module 201 is shown as being configured to open and close the bottom opening pod in other aspects the pod may be a front/side opening pod or a top opening pod including the features described herein and the interface module may be suitably configured, and including the features described herein, to open and close the pod. The interface module 201 may include a frame having a housing 201H that forms one or more internal chambers. It is noted that while the interface module 201 is shown as a single substrate pod interface module in other aspects, as will be described below, the interface module may be a multi-port interface module that may have an internal chamber common to each of the pod interface ports or separate internal chambers for each pod interface port. In one aspect the internal chamber may be a vacuum chamber while in other aspects the internal chamber may be configured to hold any suitable environment. The housing may include one or more sealable openings 201S configured for coupling the interface module 201 to other semiconductor processing modules such as those described herein and/or one or more view ports 201VP for allowing visual inspection of the interior of the housing 201H. As may be realized, the housing 201H, and the other semiconductor processing modules described herein, may have multiple openings on a single side of the housing 201H in a vertically stacked and/or horizontal side-by-side arrangement for coupling any suitable number of processing modules to the housing 201H and allowing flexibility to integrate the interface module to multiple equipment configurations.

In one aspect the interface module 201 includes a port plate 209 and an elevator 730 which may be configured to open the substrate pod 210. The elevator 730 may be coupled to at least a portion of the port plate 209, such as for example, interface module door 209D, to move the interface module door 209D in, for example, the direction of arrow 799 for opening and closing the substrate pod 210. The elevator may include any suitable linear actuator 530A that may be isolated from the interior of the housing 201H in any suitable manner, such as by a bellows 730B to substantially prevent particle and organic contamination from entering the interior of the housing 201H. In one aspect, the interface module door 209D may include a pod interface 209DP and an elevator interface 209DE which may be movable relative to one another. For example, the pod interface 209DP may be held in a spaced relationship with the elevator interface 209DE in any suitable manner such as with resilient members 752. The elevator 730 may be coupled to the pod interface 209DP so that the port plate operates passively when the linear actuator 530A is operated. For example, passive relative movement between the pod interface 209DP and the elevator interface 209DE, e.g. from operation of the elevator, may cause operation of door latch pin(s) 520, a door latch actuator 530 or any other feature of the port plate as will be described below. In other aspects the pod interface 209DP and the elevator interface 209DE may have a unitary one piece construction and the features of the port plate may be operated in any suitable manner.

In one aspect, the port plate 209 may include, for example, one or more of a port seal 590, a port door seal 591 (e.g. for sealing between the port door 209D and a port rim 760R, which forms an opening 201X (FIG. 7) of the interface module 201 for transferring substrates into an interior of the housing 201H, to seal the opening 201X), a pod clamp 500 and a door latch actuator 530, one or more of which may be located on the interface module door 209D and/or any other suitable location of the port plate 209. The port plate 209 may also include one or more of a pod presence sensor 580 (FIG. 5B), status indicators 610, purge port(s) 600, one or more door latch sensors 520 and a door presence sensor(s) 700 interface module door 209D, one or more of which may be located on the interface module door 209 and/or any other suitable location of the port plate 209.

Figure 3A:
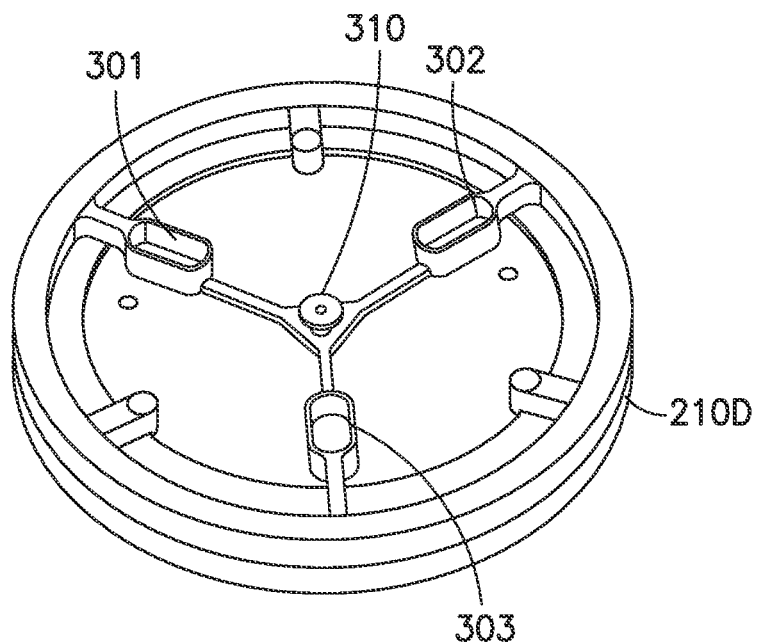
Figure 3B:
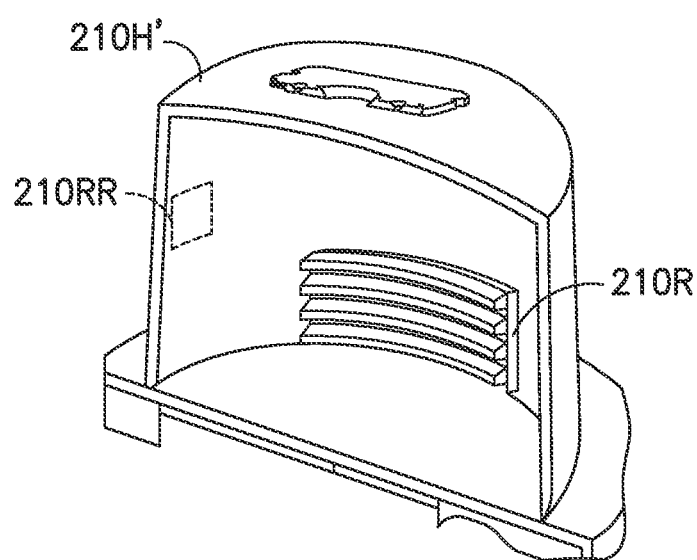
Figure 3D:
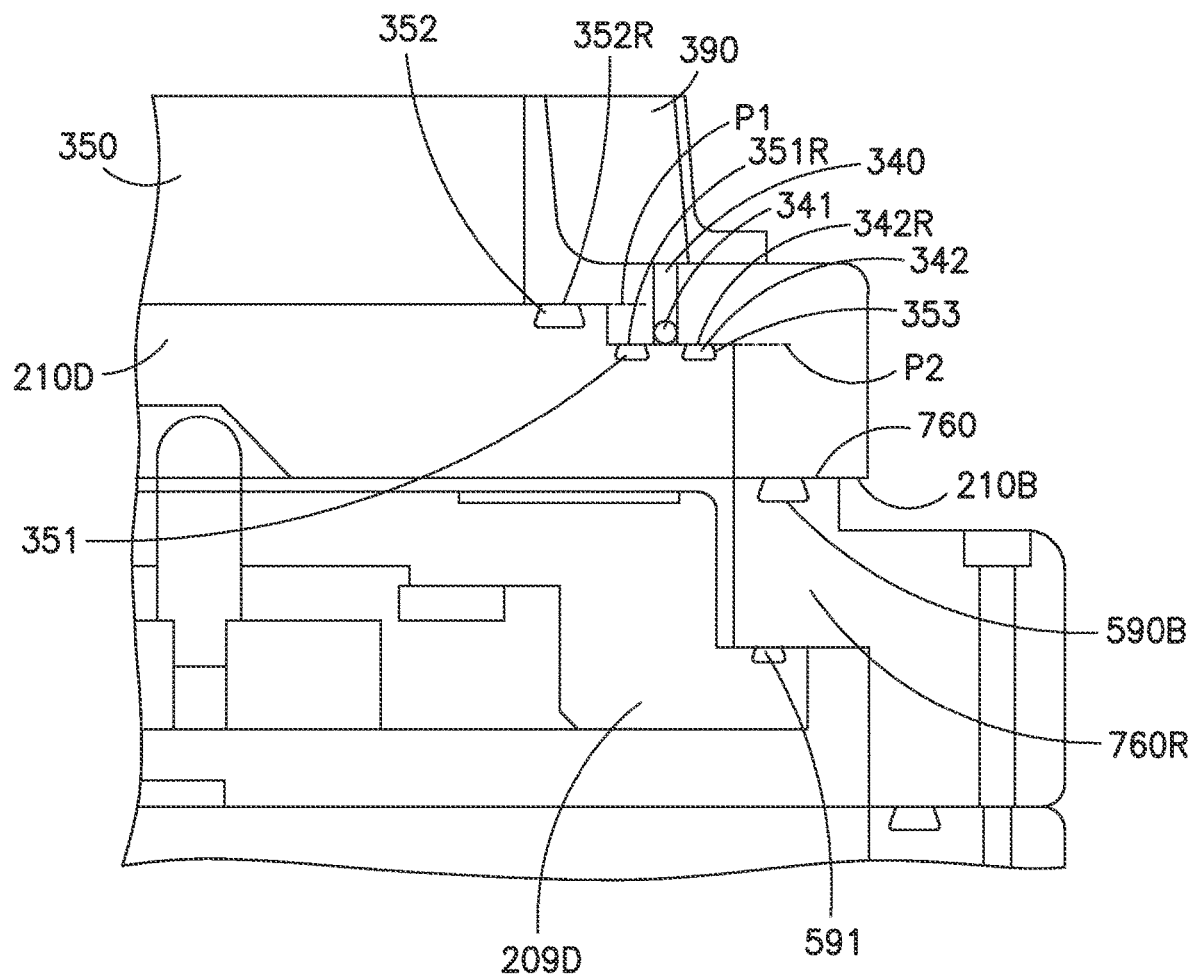

Referring also to FIG. 3D the port seal 590 may be disposed on one or more of the door 209D or pod support surface 760 of the port plate 209 for forming a seal between the pod support surface 760 and a bottom surface 210B of the substrate pod 210. It is noted that the port seal(s) 590 and/or the pod clamp 500 may form a redundant seal system where at least one seal 590 is located in, for example, a horizontal plane and another other seal (e.g. pod clamp 500) is located in a substantially vertical plane (e.g. the seals are located in substantially orthogonally arranged planes) surrounding a circumference of the substrate pod 210. In one aspect, the port seal 590 may include any suitable seal 590A disposed substantially around a periphery of the door 209D for sealing an interface between the door 209D of the port plate 209 and a door 210D (FIG. 3A-3C) of the substrate pod 210. The port seal 590 may also include any suitable seal 590B disposed around a periphery of the pod support surface 760 for sealing an interface between the pod support surface 760 and a housing of the substrate pod 210. In other aspects the port seal 590 may include any suitable number of seals having any suitable configuration. The port seal 590 may be recessed or otherwise affixed in or on one or more of the door 209D, the pod support surface 760, the housing 210H or the door 210D in any suitable manner.

The pod clamp 500 may be disposed along a periphery of a recessed portion 209R (FIG. 5A) of the port plate 209 in which, for example, the substrate pod 210 is placed. In other aspects the port plate 209 may not have a recessed area. The pod clamp 500 may be any suitable clamp for holding a housing 210H (FIG. 3A-3C) of the substrate pod 210 on the port plate 209. In one aspect, the pod clamp 500 may be an inflatable clamp configured to grip and form a seal with a periphery of the substrate pod 210 housing. The pod clamp 500 may be inflated in any suitable manner, such as by any suitable pump (not shown). In other aspects, the pod clamp may include any suitable clasps, cams, levers or any other suitable releasable solid state or movable clamping mechanisms.

The door latch actuator 530 may include any suitable gripper for gripping a corresponding feature, such as post 310 (FIG. 3A), of the substrate pod door 210D (as will be described below). In one aspect the door latch actuator 530 may include a pin 530P for aligning the door latch actuator with the post 310, and one or more fingers 530L for gripping the post 310. In one aspect the fingers 530L may be pivotally coupled to one or more of the pin 530P and a surface of the port plate 209 so that as the pin 530P is moved in the direction of arrow 798 the fingers 530L rotate to grip the post 310 and move the substrate pod door against the interface module door 209D to form a seal between the substrate pod door and the interface module door 209D as will be described in greater detail below. A conduit pass through 770 may also be formed in the interface module door 209D for providing any suitable sensors for the actuation of the door latch actuator 530 and/or for sensing when fingers 530L grip the post 310. In other aspects the door latch actuator 530 may be part of the elevator 730 such that when the linear actuator 530A moves the elevator the fingers 530L are caused to rotate in any suitable manner, e.g. such as by linear movement of the pin 530P, for gripping the post 310.

The pod presence sensor 580 (FIG. 5B) may include a transmitter 580T and a receiver 580R for sensing the presence of the substrate pod 210 on the port plate 209 in any suitable manner. While the pod presence sensor 580 is illustrated as having a transmitter 580T and receiver 580R in separate housings in other aspects the transmitter and receiver may be disposed in a common housing. In one aspect the pod presence sensor may be a noncontact sensor such as a reflective sensor, through-beam sensor or any other optical, capacitive or contactless sensor. In still other aspects the pod presence sensor 580 may be any other suitable type of sensor, such as for example a contact sensor. The door presence sensor(s) 700 may be disposed on, for example, the interface module door 209D for detecting, for example, the presence of the substrate pod 210 door against the interface module door 209D in any suitable manner. One or more door latch sensors 520 may also be provided on, for example, the interface module door 209D for passively unlatching the substrate pod door 210D (FIG. 3A-3C) from the substrate pod housing 210H (FIG. 3A-3C) as will be described below and/or sensing when the latch is released.

The status indicators 610 may be disposed at any suitable location on the interface module 201. In one aspect the status indicators may be disposed on a surface of the port plate 209. As can be seen in FIG. 6B the status indicators 610 may include one or more visual indicators 610A, 610B, 610C, 610D, 610E that communicate an operational status of the interface module 201 to, for example, an operator. It is noted that the status indicators 610 as well as the various sensors and drives of the interface module 201 may be operably connected to one or more controllers, such as controller 1091 (FIG. 1A). The controller may receive signals from the various sensors and drives and provide corresponding signals to the status indicators 610 for providing the visual status indication.

Figure 6A:
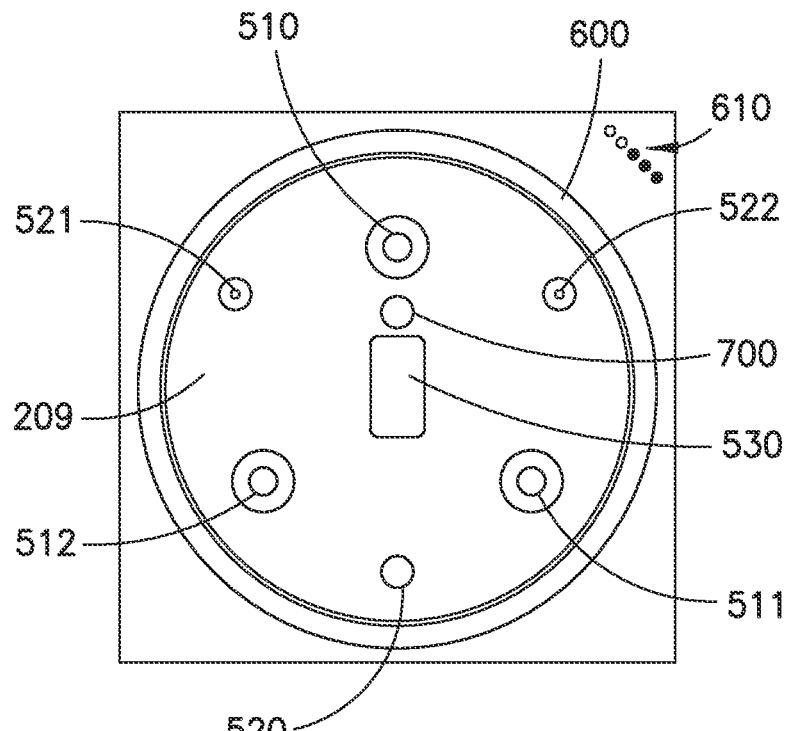
FIGS. 6A and 6B are schematic illustrations of a portion of a processing tool in accordance with aspects of the disclosed embodiment.
Figure 6B:
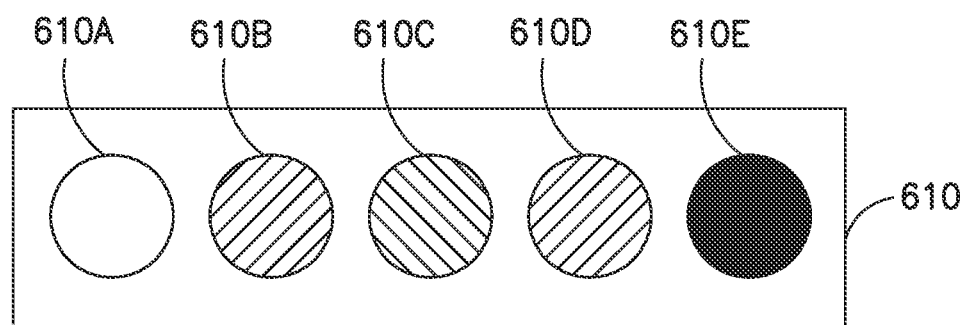
Figure 7:
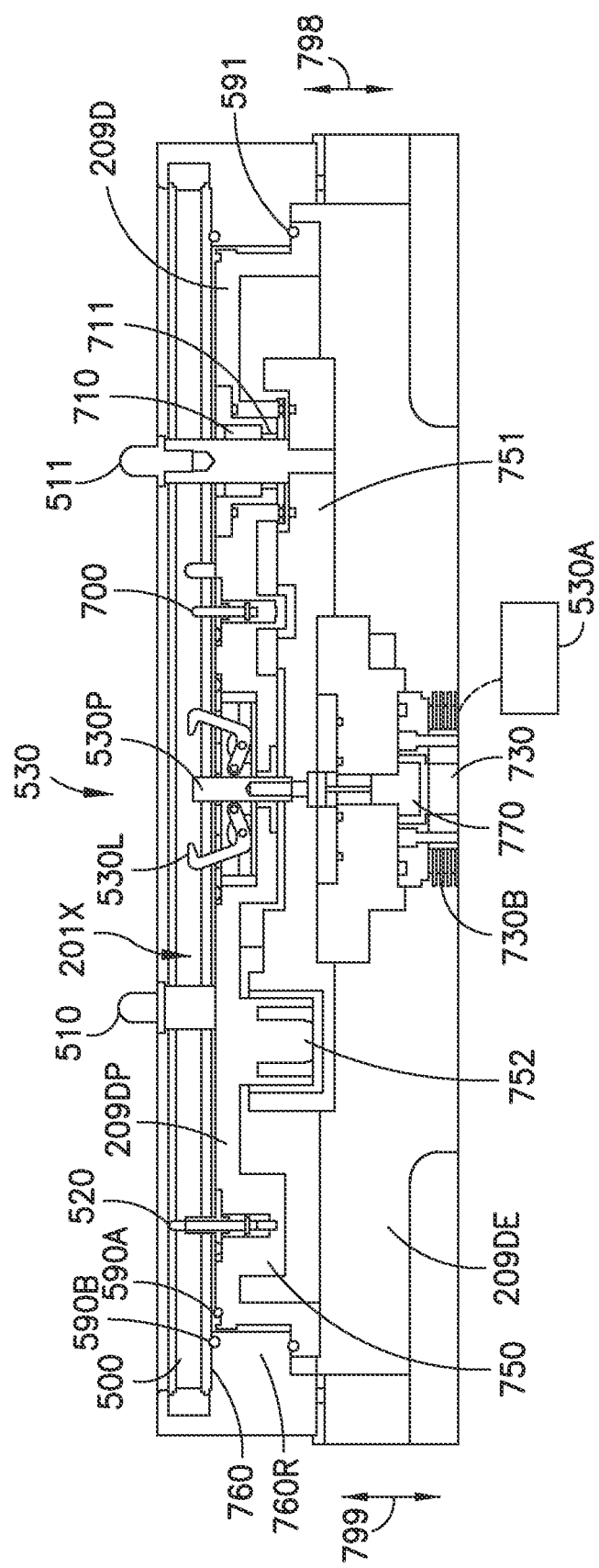
FIG. 7 is a schematic illustration of a portion of a processing tool in accordance with aspects of the disclosed embodiment.

The interface module 201 may also include one or more purge ports 600 (FIGS. 6A and 8C). In this aspect the purge port 600 is located on the pod support surface 760 for purging (e.g. evacuating) or otherwise charging (e.g. refilling or filling) a gas/fluid reservoir or chamber 390 (FIG. 3C) of the substrate pod 210 as will be described below. In one aspect the purging of the gas reservoir 390 may be automatically performed upon pumping down to vacuum of one or more of the interface module 201 and/or the substrate pod 210. In other aspects the evacuating or charging of the gas reservoir 390 may be performed at any suitable time. The interface module 201 may also include other flow ports for flushing or otherwise purging gaps or sealed areas between, for example, the port plate 209/port plate door 209D and the substrate pod 210. For example, the port plate 209 may include a gap flush supply port 810 (FIG. 8B) and a gap flush exhaust port 811 (FIG. 8B) for flushing a gap between, for example, the port plate 209 and the substrate pod 210 and/or a gap between the interface module door 209D and the door of the substrate pod 210. These gaps may be flushed with any suitable gas, such as nitrogen or other clean dry air, before the interface module door 209 is opened. The trapped volume between the port plate 209 and the substrate pod 210 and/or a gap between the interface module door 209D and the door of the substrate pod 210 may also be pumped to a vacuum pressure equivalent to, for example, the internal pressure of the substrate pod 210 for removal of the substrate pod door 210D. This will facilitate removal of particulates and by opening the substrate pod 210 in a vacuum particulate generation may be downstream of the substrate within the substrate pod 210 and exhausted through the exhaust port 811 of the interface module 201. FIG. 8D is a schematic illustration of a bottom of the interface module housing 201H. As can be seen there are pass throughs for the purge port 600, the flush supply port 810 and the flush exhaust port 811. A vacuum roughing valve 877 for pumping down the interior of the housing 201H and a vent valve 878 may also be provided.

The interface module door 209D may also include one or more kinematic coupling pins 510, 511, 512 for positioning the substrate pod 210 relative to the port plate 209 in a predetermined location. The kinematic coupling pins 510, 511, 512 may be any suitable pins configured to interface with any suitable mating/locating features 301, 302, 303 of the substrate pod 210. The kinematic coupling pins 510, 511, 512 may be fixed to the, for example, the door 209D in any suitable manner such as with any suitable bearings 710 and seals 711 so that the kinematic coupling pins 510, 511, 512 may move relative to the pod interface 209DP as will be described below.

Referring now to FIGS. 3A-4B, as noted above, the substrate pod 210 includes a housing 210H and a door 210D. The housing 210H may form a pressure vessel and have any suitable shape and size such as, for example, a cylindrical or circular cross section and a top surface 210T of the housing 210H may be domed or substantially spherical to, for example, exploit hoop stress to reduce necessary wall thickness of the housing 210H and weight of the substrate pod 210. In one aspect, the substrate pod 210 has an interior 350 having an environment that may have a common atmosphere with, for example, any suitable portion of the processing tool to which it is connected (e.g. through the interface module 201). The passage or tunnel formed between the substrate pod 210 and the process tool through the interface module 201 may be referred to as a clean tunnel that connects the substrate pod substantially directly to the processing tool as described in U.S. patent application Ser. No. 12/123,391, entitled "Side Opening Unified Pod" and filed on May 19, 2008, the disclosure of which is incorporated by reference herein in its entirety. For example, the clean tunnel provides the same cleanliness (as throughout the processing tool and interface module) from within the interior environment of the substrate pod 210, through the interface between the substrate pod 210 and the interface module 201 and throughout the interface module and processing sections of the process tool. The clean tunnel may be closed (such as when the substrate pod(s) is removed from the interface module), and opened freely without degradation to the clean tunnel. In one aspect as shown in, for example, FIGS. 2A, 2B and 11-30, the substrate pod to interface module interface may also be arranged to enable direct integration of the substrate pod with the processing tool independent of the environment within the substrate pod prior to interface. Thus, in aspects of the disclosed embodiment illustrated in, e.g., FIGS. 2A, 2B and 11-30, the substrate pod 210 may be interfaced with and integrated directly to processing tools having different or dissimilar environments (e.g. low vacuum to high vacuum, clean air to inert gas environment, or clean air to vacuum) and then transport directly between tools with different dissimilar environment and interfaced and integrated again with the tools. Accordingly, a substrate(s) at one tool with a controlled environment may be transferred directly with any suitable robot of the processing tool, from a processing section of the tool through the clean tunnel into the substrate pod 210, the substrate pod 210 transported directly and interfaced to the interface module of another tool possibly with a dissimilar/different controlled environment, and the substrate(s) transferred directly with any suitable robot through the clean tunnel now defined in the other tool to a processing section without degradation of the controlled environment in the other process tool. In effect, the substrate pod to interface module interface in combination with the substrate pod 210 may be considered to define an exterior load lock, or carrier load lock. In one aspect the interface module port plate may incorporate a lid, which can be raised, lowered, rotated, or pivoted in place by any suitable actuator and/or mechanism. The lid provides isolation and control of the interface module environment allowing the interface module to act as a controlled environment pass thru when the substrate pod is not present. In one aspect the port plate or door may rotate after the wafer stack is lowered into the interface module interior volume. The stack can be rotated to align with the mating transfer robotics allowing the substrate pod automation to load the pod at an orientation other than the required wafer stack orientation.

In one aspect the housing 210H may be configured to house five substrates while in other aspects the housing 210H' may be configured to house twenty-five substrates or any other suitable number of substrates such as, for example, three substrates or even one substrate. The housing may be constructed of any suitable material, such as, for example, a high structural modulus material, a metal or metal alloy (e.g. aluminum, stainless steel, titanium), a plastic, a composite, or a combination thereof and form an interior space 350 that is, for example, maintained at a vacuum pressure environment or an inert gas environment when an opening 350X of the housing is sealed by the door 210D (e.g. during transport or storage of the substrate pod 210) and/or when the housing 210H is coupled to the interface module 201. The housing 210 is structurally configured in any suitable manner (such as with reinforcing ribs, etc.) to support the external loads exerted on the housing when the interior is at, for example, vacuum pressure. As noted above, the housing 210H may also include a gas (or other fluid) reservoir or chamber 390. In other aspects the gas chamber 390 may be disposed in the door 210D. In still other aspects both the housing 210H and the door 210D may include a gas chamber 390. The chamber 390 may be configured to hold any suitable gas such as, for example, nitrogen or other inert gas. The chamber 390, or any portion thereof, may be integrally formed with the housing 210H or otherwise coupled to the housing in any suitable manner. The chamber 390 may be charged or otherwise replenished, for example, during transportation or storage of the substrate pod 210 or while substrate pod 210 is docked at an interface module. For example, an external port of substrate pod 210 which is mated to a suitable matching port on a station (e.g. an interface module, storage station, and/or transport system station) can be used to provide a replenishing supply of gas/fluid to chamber 390. In some instances such a system can permit the volume of chamber 390 to be reduced as only the volume of gas/fluid necessary for the anticipated transportation time and accompanying anticipated leak rate during travel from one station to the next station is needed to be carried. Consequently, the volume of chamber 390 and thus footprint of the substrate pod can be reduced or minimized. In one aspect, the chamber 390 may be charged when interfaced with the interface module 201 such as, for example, through port 600. The chamber 390 may extend around a periphery of the housing opening 350X and hold any suitable volume of gas that may be released into the interior space 350 through, for example, a passage 340 that extends from the chamber 390 to a seal interface 342 (FIG. 3D) between the housing 210H and the door 210D. The passage 340 may include a check valve or any other suitable valving to allow for a predetermined direction of gas/fluid flow from the chamber 390 as well as the replenishment of gas/fluid within the chamber 390. In one aspect the flow of gas/fluid through the passage 340 may be blocked when the pod 210 is docked or otherwise interfaced with the interface module 201. In other instances the flow of gas/fluid through the passage 340 may be not be blocked when the pod 210 is docked or otherwise interfaced with the interface module 201 and the gas/fluid can be permitted to empty from chamber 390. In such an instance, chamber 390 may be filled with a gas/fluid prior to removal from interface module 201. In some aspects, the specific gas/fluid charged into chamber 390 and/or the pressure of gas/fluid charged into chamber 390 during any given charging is chosen based on the device process requirements at each step of the process flow. For example, the gas/fluid charged into chamber 390 can be selected for compatibility with the substrates to be loaded into or loaded in substrate pod 210. In some aspects, a first gas/fluid is charged into chamber 390 for a first transport of substrate pod 210, the first gas/fluid in chamber 390 is released upon or after docking with interface module 201, and a second gas/fluid is charged into chamber 390 for a second transport of substrate pod 210.

It is noted that the passage 340 and the chamber 390 may provide a redundant system where the flow of gas/fluid from the chamber 390 flows into the interior 350 of the substrate pod 210 if the substrate pod 201 is experiencing a leak and the on-board chamber pressure (e.g. the pressure within the interior 350) has dropped below a predetermined low pressure threshold, such as to actuate valving in the passage or otherwise release the gas/fluid from the chamber through the passage 340. This redundant system where gas/fluid is released only upon a leak may provide the volume of the chamber 390 to be reduced so that a footprint of the substrate pod is also reduced or minimized. In another aspect, if the on-board chamber pressure (e.g. the pressure within the interior 350) has dropped below a predetermined low pressure threshold, valving can be actuated in an external port mated to a suitable matching port on an interface module, storage station, or transport system to provide a continuous supply of gas/fluid to interior 350 from the chamber 390 via passage 340 or to replenish (e.g. charge or otherwise re-fill/fill) gas/fluid in chamber 390 to a specified pressure.

It is noted that the gas (or other fluid) within the chamber 390 and passage 340 may form a fluidic barrier seal which substantially surrounds one or more of the door seals 351, 352. The fluidic barrier seal may have an atmosphere that is different from an atmosphere within the interior 350 and be isolated, in any suitable manner, from an atmosphere within the interior 350 such as will be described below. In one aspect the fluidic barrier seal may be a pressurized seal that is disposed between the atmosphere of the interior 350 and the atmosphere external to the substrate pod 210. As noted above, in the event of a leak fluid is drawn from the chamber 390 through the passage 340 into the interior space 350 of the substrate pod 210. This substantially prevents any ambient fab air (which may contain contaminants such as, for example, particulates, moisture, or oxygen) from being drawn into the interior space 350. In some aspects, the gas/fluid charged into chamber 390 is chosen based on the device process requirements at each step of the process flow. As an example, under normal circumstances, with the seals 351, 352 in good condition (e.g. not leaking) the fluid remains in the chamber 390 and passage 340 and does not enter the interior space 350.

In one aspect the housing 210H may include any suitable features around a periphery of the housing for interfacing with any suitable clamping device (e.g. solid state clamping, movable mechanical clamping, etc.) such as, for example, pod clamp 500 of the interface module 201 for holding the substrate pod 210 on the interface module 201. It is noted that the clamping of the substrate pod 210 to the interface module 201 may provide a force for compression of the port seal 590. The housing may also include any suitable handles, such as overhead transport handle 349, to facilitate automated and/or manual transport of the substrate pod 210.

In one aspect the door 210D includes one or more substrate holding supports 210RS, e.g. a rack 210R, arranged in a vertical stack. The rack 210R may be mounted to the door 210D in any suitable manner or integrally formed with the door 210D so that when the door 210D is removed from the housing 210H the substrates are removed from the housing 210H (e.g. the substrates are transported with the door). The rack 210R and the portions of the rack that contact the substrate(s) may be constructed of any suitable material such as, for example, PEEK (Polyether ether ketone) or BKM materials. In one aspect the substrate holding supports 210RS may include a rear stop 210RP so that the substrates held on each support is restrained. In another aspect a substrate retainer 210RR may be mounted to the housing 210H and actuated by, for example, the interface module 201 such that actuation of the retainer holds the substrates on their respective supports 210RS within the rack 210R. The substrate retainer 210RR may provide a force on each individual substrate in the rack 210R that presses or otherwise urges the individual substrates against the rear stop 210RP substantially preventing substrate movement within the substrate pod 210 during transport of the substrate pod 210 (and the substrates therein). In other aspects, the actuation of the retainer can be vertical and may provide a vertical force on each individual substrate in the rack that presses or urges the substrate to seat in a conical support. As noted above, the external surface of the door 210D may include one or more suitable mating/locating (e.g. kinematic coupling) features 301, 302, 303 for interfacing with the kinematic pins 510, 511, 512 of the interface module 201. The external surface of the door may also include a post 310 that is configured to interface with the door latch actuator 530.

Figure 4A:
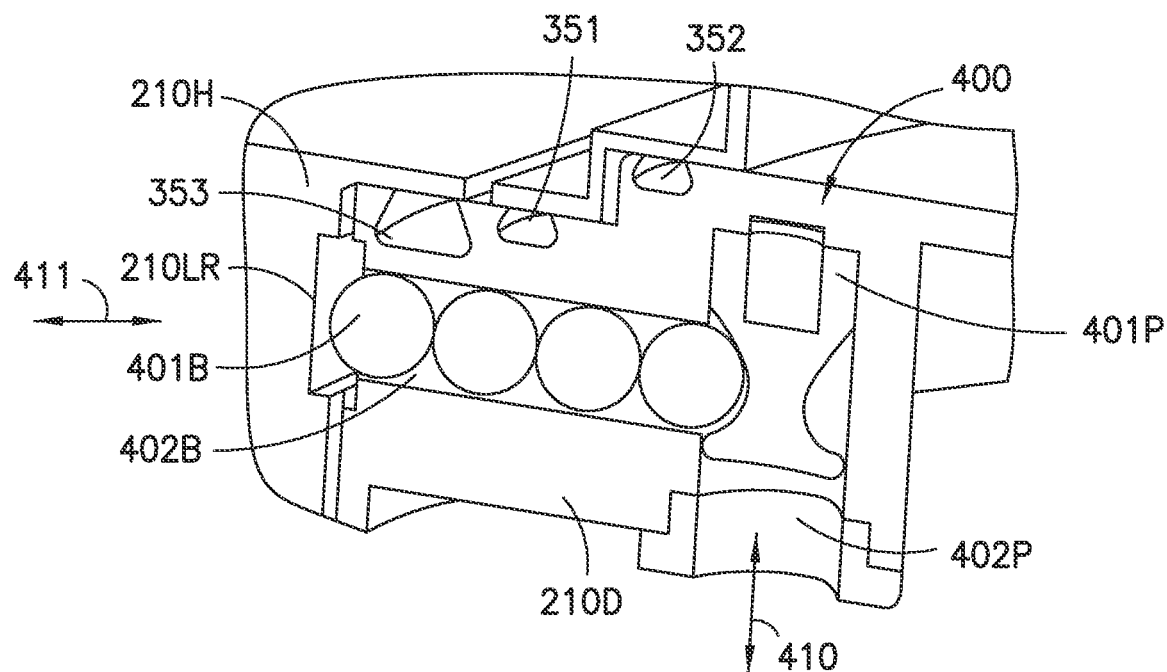
FIGS. 4A-4B are schematic illustrations of a portion of a carrier in accordance with aspects of the disclosed embodiment.
Figure 4B:
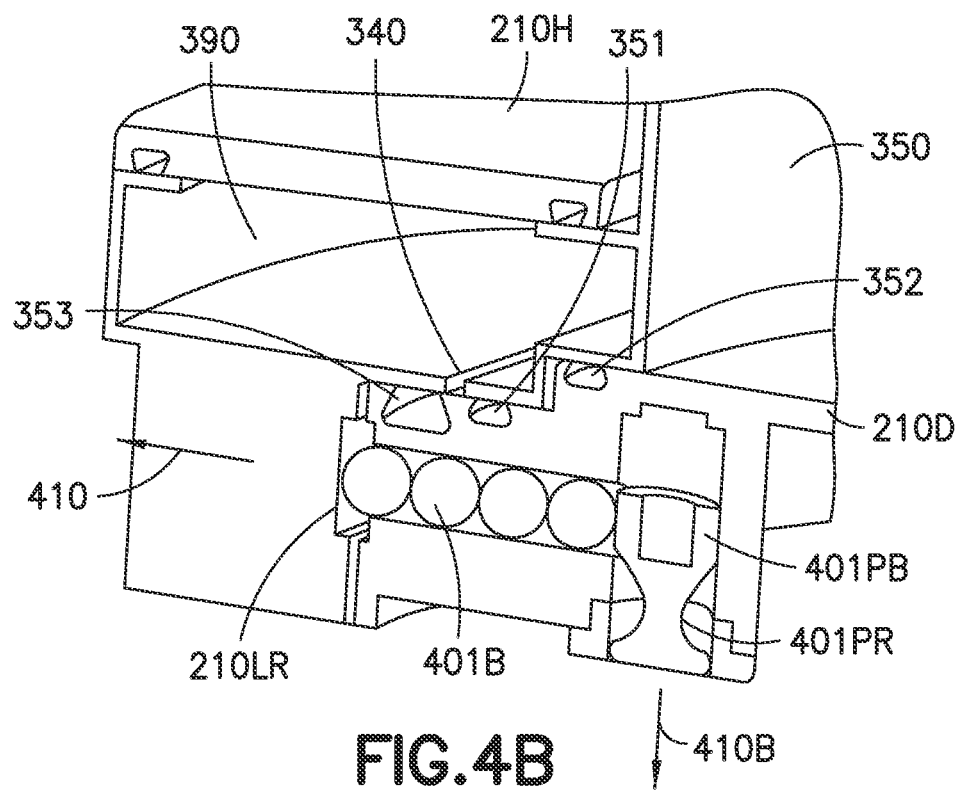
Figure 5C:
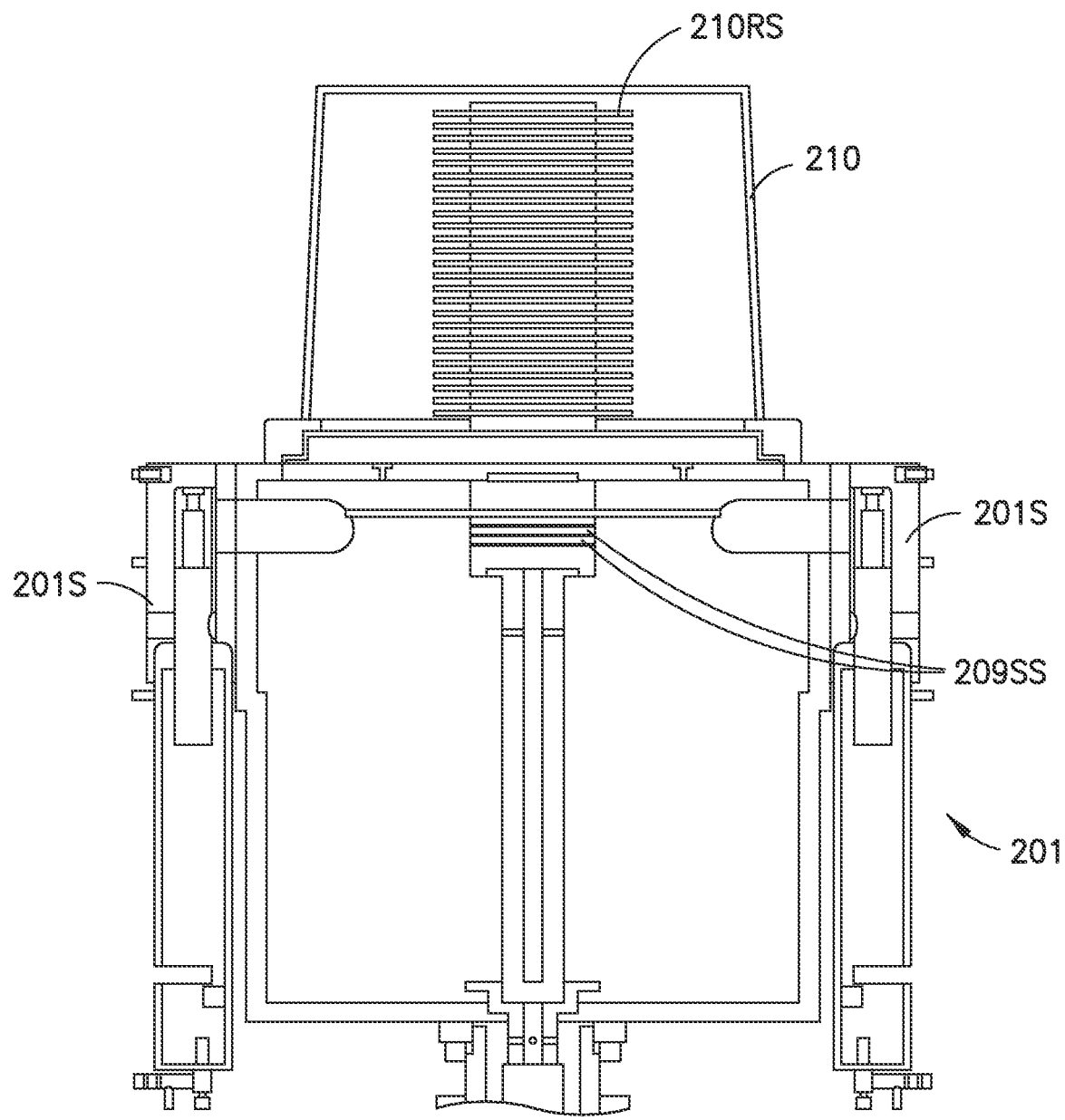

As noted above, the interior space 350 of the housing 210H may be held at a vacuum pressure when the door seals the opening 350X of the housing 210H. In one aspect the door 210D may be sealingly held against the housing 210H with, for example, a differential pressure between the vacuum inside the housing 210H and an atmospheric (or other) pressure outside the sealed substrate pod 210. The differential pressure may provide a force such that the weight of the substrate(s) held in the rack 210R is supported and seals such as, for example, seals 351-353 (which will be described below) disposed between the door 210D and the housing 210H are compressed. In one aspect, the substrate pod 210 may include a door latch 400 (FIGS. 4A and 4B) to substantially prevent the door 210D from separating from the housing 210H in the event the vacuum within the sealed housing 210H is lost. It is noted that in this aspect the door latch 400 may not be used to seal the door 210D against the housing 210H but rather the door latch 400 merely holds the door's 210D position relative to the housing 210H in the event of pressure loss within the housing 210H. In other aspects the door latch 400 may be used to seal the door 210D against the housing 210H in any suitable manner. In one aspect the door latch 400 may be a ball lock mechanism while in other aspects the door latch 400 may be any suitable latch. Here the door latch includes a plunger 401P and one or more balls 401B disposed at least partly within the door 210D. The plunger is moveable in the direction of arrow 410 inside passage 402P while balls 104B are movable in the direction of arrow 411 inside passage 402B (which intersects passage 402P). The plunger 401P includes a ball contact area 401PB and a recessed area 401PR and may be biased in the direction of arrow 410B in any suitable manner, such as by a resilient member. When in the biased or locked position, e.g. shown in FIG. 4B, the plunger 401P contacts the balls 401B with the ball contact area 401PB for urging the balls in the direction of arrow 411U so that at least one ball is positioned inside recess 210LR which is disposed in the housing 210H for locking the door 210D to the housing 210H. When in the retracted or unlocked position, e.g. as shown in FIG. 4A the balls are allowed to move into the recessed area 401PR of the plunger 401P and out of the recess 210LR for unlocking the door 210D from the housing 210H. In one aspect a sensor may be disposed on the door latch to detect if the carrier is placed properly on the interface module, if the door was installed properly at a previous station, or if the door is being replaced properly during reloading of the pad. For example, the extent of ball lock plunger elevation could be used to get this information.

The seals 351, 352, which may be vacuum seals, between the door 210D and the housing 210H may have a redundant arrangement. A gas reservoir seal 353 may also be provided. In one aspect the seal 352 may be an inner seal having the atmosphere of the interior 350 on one side of the seal. The gas reservoir seal 353 may be an outer seal having an outside atmosphere (e.g. an atmosphere external to the substrate pod 210) on one side of the seal 353 and an atmosphere of the fluidic barrier on an opposite side of the seal 353. The seal 351 may be an intermediate seal having an atmosphere of the fluidic barrier seal on one side of the seal 351. The area formed between seals 351 and 352 may form a void having any suitable atmosphere that may be the same or different than one or more of the interior 350 atmosphere or the atmosphere of the fluidic barrier seal. The intermediate seal 351 may isolate the fluidic barrier seal from the inner seal 352 while one or more of the seals 351, 352 may isolate the fluidic barrier seal from the interior 350. It is noted that while the seals 351-353 are shown as being recessed into the door 210D in other aspects the seals may be recessed or otherwise affixed to one or more of the door 210D and housing 210H. It is also noted that the seals 351-353 may have a circular shape (e.g. circular seal geometry) while in other aspects the seals may have any suitable sealing geometry. The redundancy of the seals 351, 352 may provide protection against a damaged seal and/or particulate within the seal area that may prevent positive contact between the mating surface of the door 210D and housing 210H. The seals 351, 352 may be placed in two distinct planes P1, P2 and the seal surfaces may be recessed to, for example, protect the seal surfaces from damage. While the planes P1, P2 are shown as distinct horizontal planes that substantially surround a circumference of the substrate pod 210 in other aspects one or more of the seals may be placed in a vertical plane. It is noted that placement of the seals 351, 352 on separate planes may provide protection for one or more of the seals 351, 352 from impact with other objects or wafer robotics which could tear or otherwise damage the inner seal 352. The gas reservoir seal 353 may be located outward, with respect to a centerline CL of the pod 210, of one or more of the seals 351, 352. In the event that both seals 351, 352 fail the gas reservoir seal 353 may provide for a clean environment within the interior space 350 as gas is released from the gas reservoir 390 into the interior space 350. In some aspects, seal 353 may be more compliant than seals 351 and 352 and positioned in a suitable manner such as to provide initial contact with the mating seal surface on the housing when the door is being mated to the housing. In such aspects, seal 353 may provide suitable compliance to initiate a vacuum seal and permit a vacuum force on the pod door to provide compression force for seals 351, 352 and permit the use of less compliant seal materials for seals 351 and 352 which may be desirable for vacuum applications. As may be realized, any suitable sensors may be located onboard the pod 210 in any suitable location to monitor the pressure within the interior space 350 and/or gas reservoir 390 and provide a warning or other alert to an operator (e.g. through for example controller 1091—FIG. 1A) if a leak or loss or pressure is detected. If a leak is detected the controller 1091 or the operator may direct the pod 210 to a predetermined location for diagnosis and/or direct the pod 210 to a station to replenish the gas/fluid in chamber 390.

It is noted that the mating surface for each of the seals 351-353 may be recessed. In one aspect where the seals 351-353 are located on the door 210D the housing 210H may include recessed areas 351R-353R (FIG. 3D) in which the seals 351-353 interface with the housing 210H. In other aspects where one or more seals are located in the housing 210H the door 210H may include the recessed areas. In still other aspects the one or more seals 351-353 and recessed areas 351R-353R may be suitably located on any one of the door 210D and housing 210H.

Figure 9B:
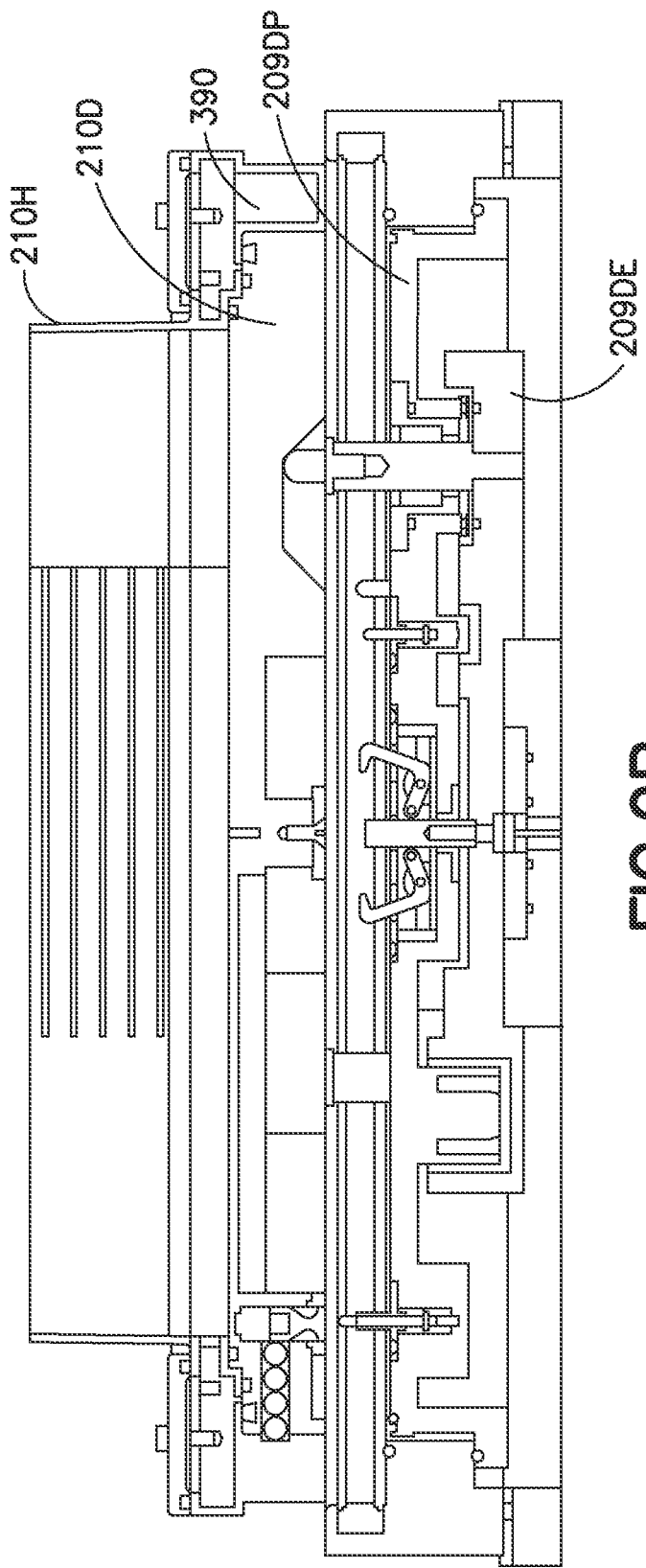
Figure 9F:
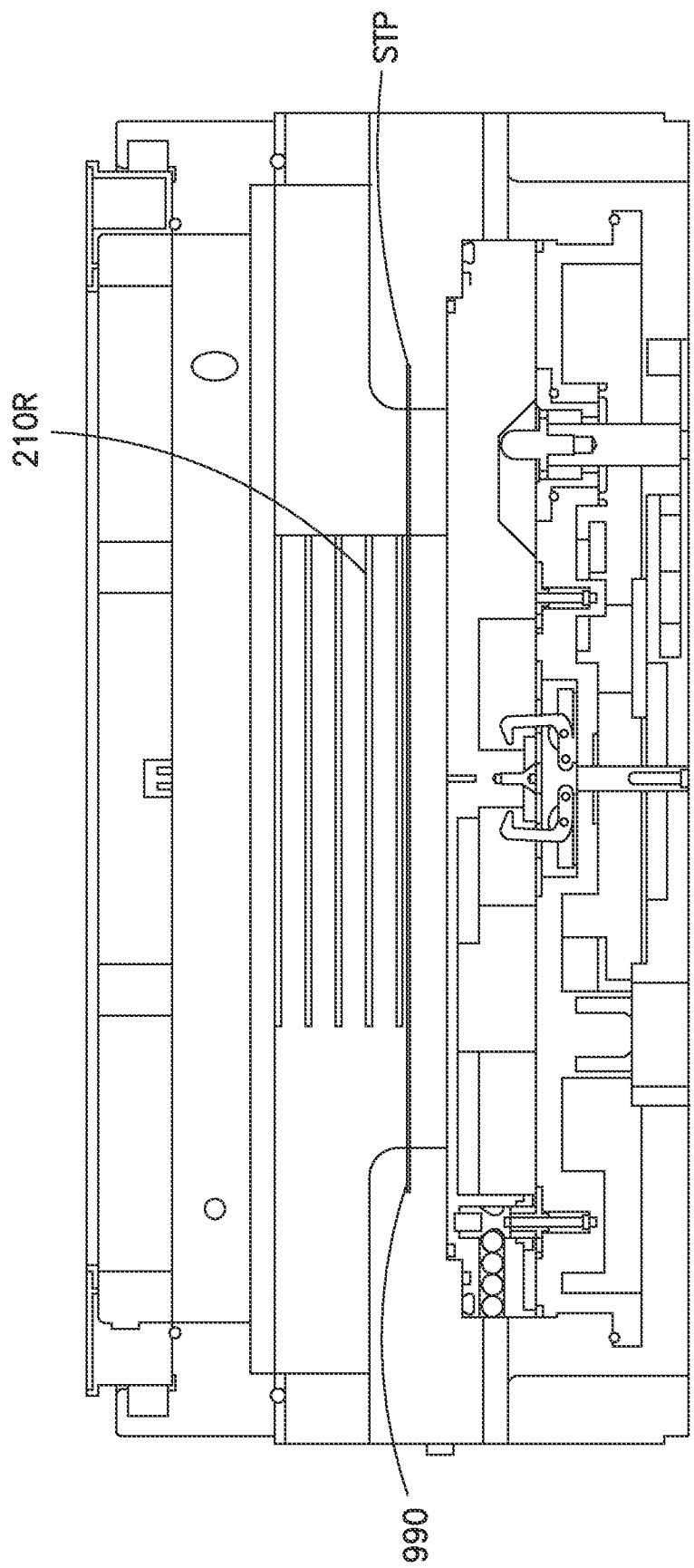
Figure 10:
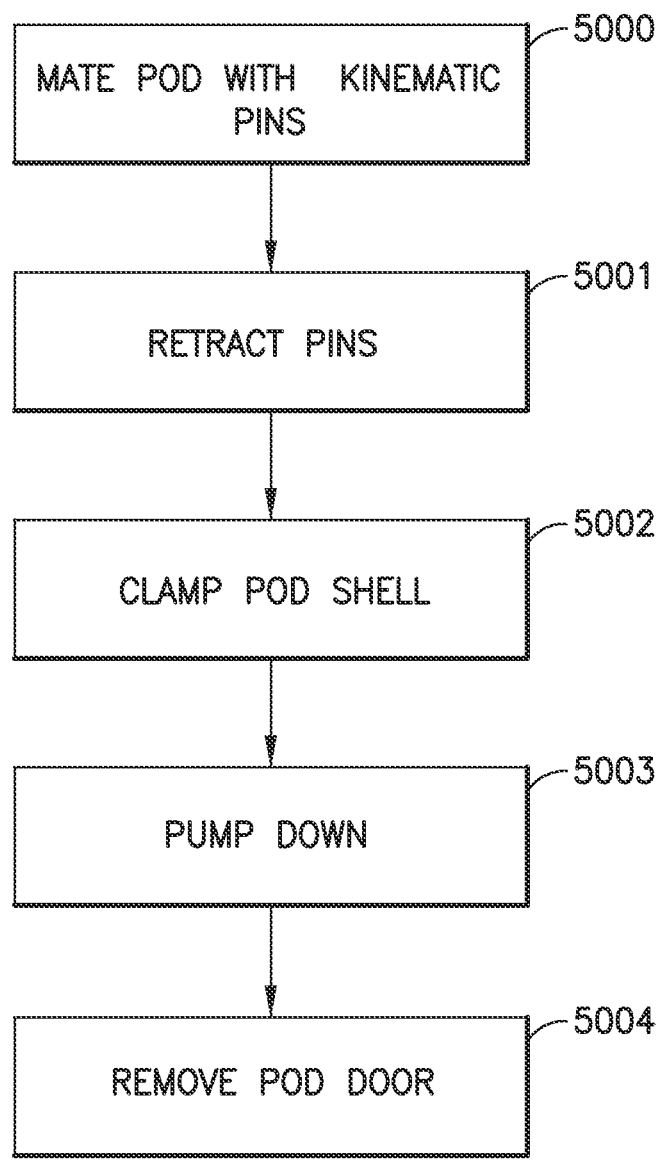
FIG. 10 is a flow diagram in accordance with aspects of the disclosed embodiment.

Referring now to FIGS. 4A, 4B, 7, 9A-9F and 10 an exemplary docking or loading of the pod 210 to the interface module 201 will be described. The pod 210 is moved to the interface module 201 and mated with the kinematic pins 510-512 in any suitable manner (FIG. 10, Block 5000; FIGS. 9A-9B). The pod presence sensor 580 (FIG. 5B) may register the pod as being present with, for example, the controller 1091 (FIG. 1A). As noted above, the kinematic pins 510-512 may be movably mounted to the elevator interface 209DE so that as the elevator 730 is lowered the kinematic pins 510-512 are retracted relative to, for example, the pod interface 209DP (FIG. 10, Block 5001; FIG. 9C) so that the housing 210H contacts the port seal 590 (FIG. 5A). The pod housing 210H may be clamped to the port plate 209 in any suitable manner such as with, for example, clamp pod clamp 500 (FIG. 10, Block 5002). At least the space (e.g. a port door gap) between the pod door 210D and the pod interface 209DP (e.g. interface module door) may be evacuated or pumped down (FIG. 10, Block 5003). In one aspect a low pressure flow of clean dry air may be dispersed through the port door gap and wash across the seals 590A and 590B; such as when a substrate pod is not fully docked on the interface module 201. This low pressure flow of clean dry air may prevent particulates from the ambient fab environment from settling on the seal and causing a leak. In addition, the positive pressure substantially prevents particles from settling into the port door gap and then later being deposited into the internal clean vacuum space of the interface module 201 and/or substrate pod 210. The clean dry air flow velocity can be low to avoid turbulence into the ambient factory environment. When the substrate pod is present on the kinematic pins the horizontal gap formed between the port door and substrate pod bottom surface can direct the clean dry air flow horizontally across the seals and as the substrate pod lowers the gap decreases which may increase the clean dry air velocity to dislodge any particulate. In other aspects the internal chamber of housing 201H (FIG. 5A) may be pumped down. The pod door 210D may be removed (FIG. 10, Block 5004; FIGS. 9D-9F) where elevator 730 (FIG. 7) may be lowered further so that movement of the elevator interface 209DE causes the fingers 530L to clamp the post 310 of the pod door 210D. Movement of the elevator interface 209DE may also cause the door latch pin(s) 520 to engage the plunger 401P of the lock 401 so that the plunger 401P is moved to the retracted position (FIG. 4A) for releasing the lock 401 as described above. The substrate retainer (as described above) may also be disengaged for releasing the substrates from the housing 210H. During this process, the gas reservoir 390 may be sealed in any suitable manner to retain the gas/fluid therein or the gas in reservoir 390 may be exhausted, for example, into the interior of the interface module 201 or into the interior of the substrate pod, and reservoir 390 later recharged with gas/fluid, for example, during later closure of the substrate pod door. It is noted that relative movement between the pod interface 209DP and the elevator interface 209DE may be limited by a predetermined amount such that once the lock 401 is unlocked and the post 310 is gripped by the door latch mechanism 530 the pod interface 209DP and the elevator interface 209DE move in unison for removing the pod door 210D from the housing 210H. The pod door 210D may be moved by any suitable amount with the elevator 730 such that a desired substrate 990 on the rack 210R is placed along a desired substrate transfer plane STP so that the substrate may be removed from the rack 210R by for example, substrate transport 202T for transport to any suitable processing module connected to the interface module 201.

It is noted that there may be a pressure differential between the interior space 350 of the substrate pod 210 and the interior of the interface module 201. The interface between the substrate pod 210 and the interface module 201 may be configured to accommodate this pressure differential in any suitable manner such as through a dynamic pressure equalization. For example, the elevator 730 may be controlled by, for example, any suitable controller such as controller 1091, so that the elevator 730 forms an electronic relief valve. For example, as the interior of the interface module 201 is pumped down to vacuum, the pressure at some point will cross-over the vacuum pressure inside the substrate pod 210 and the port door 209D and the pod door 210D will push open under, for example, the force from the positive pressure differential. Once the pod door 210D opens, the volume of substrate pod 210 comes into fluid communication with the volume of the interface module 201 allowing the pressure inside the substrate pod 210 and the pressure inside the interface module 201 to equalize, substantially eliminating any pressure differential between the two volumes (e.g. the inside of the substrate pod and the inside of the interface module). This pressure equalization may be performed without any prior knowledge of the pressure within the substrate pod 210 and/or the pressure within the interface module 201 such that pressure sensors may not be needed in the substrate pod 210.

Unloading the pod 210 from the interface module 201 may be performed in a manner substantially opposite that described above for loading the pod 210 on the interface module 201. In one aspect, there may be a substrate protrusion sensor for detecting if one or more substrates are protruding out of, for example, the rack 210R before the rack is inserted into the housing 210H.

It is noted that while or as the elevator is lowered, the substrates may be mapped (e.g. the location of each substrate and/or its orientation may be determined) by any suitable substrate mapping device (e.g. optical sensors/cameras, capacitive sensors, etc.). In one aspect the entire stack of substrates in the rack 210R may be presented to the substrate transport 202T for transfer in a batch, while in other aspects one or more substrates may be presented to the substrate transport 202T at a time. The elevator 703 may also include a rotational drive for rotating, e.g. by any suitable amount, at least a portion of the port plate 209 and the substrates held thereon. In one aspect the gas reservoir 390 may be replenished at any suitable time when the pod 210 is docked to the interface module 201 such as, for example, when the substrates are being transported to and from the rack 210R. The internal pressure of the pod 210 may also be read in any suitable manner by the interface module 201 before the door 210D is opened.

In some aspects, the interface module may have one or more port door substrate supports or shelves located below the port door. The interface module can be configured with one or more side ports 201S, e.g. a side port comprising a slot valve such as those shown in FIG. 5C. In some aspects when the port door is in a position to align one or more of the port door supports with one or more of the side ports, substrates can be placed via a substrate transport through a side port onto the port door supports. In some aspects, the elevator can index to present one or more specific port door supports 209SS to one or more side ports at a level appropriate for a substrate transport to place substrates on or remove substrates from the supports. In one aspect, substrate pod 210 is not present on interface module 201 and the port door is in the fully up position. In such an aspect, the port door supports 209SS can be used to pass substrates through the interface module from side port to side port. In other aspects when substrate pod 210 is present, the interface module 201 can be also be used as a pass-through wherein one or more of either or both of the port door supports 209SS and substrate holding supports 210RS are used to hold one or more substrates. In some aspects wherein substrate pod 210 is not present, a first side port is connected to one type of atmosphere (e.g. gas at a first pressure such as atmospheric pressure or a first level of vacuum) and a second side port is connected to another type of atmosphere (e.g. gas at a second pressure such as vacuum or a second level of vacuum) and the lower chamber of interface module 201 is used as a loadlock wherein a substrate is placed on a port door support 209SS via a side port 201S, the atmosphere in the lower chamber is adjusted, and the substrate is removed via a side port 201S. In other aspects, when substrate pod 210 is present, the interface module 201 can be also be used as a loadlock wherein one or more of either or both of the port door supports 209SS and substrate holding supports 210RS are used to hold one or more substrates passed into the interface module via a side port 201S while the atmosphere in the lower chamber is adjusted. These aspects may permit substrates to exit or enter equipment through the space typically occupied by a conventional loadlock thereby reducing the total equipment footprint while also allowing substrate transport from substrate pod 210 directly to a vacuum process. As may be realized, when a substrate pod 210 is open on the interface module the interior of the substrate pod may communicate with and may form part of the pass-through atmosphere.

Referring now to FIGS. 11-30 exemplary processing tools will be described in accordance with aspects of the disclosed embodiment.

Figure 11:
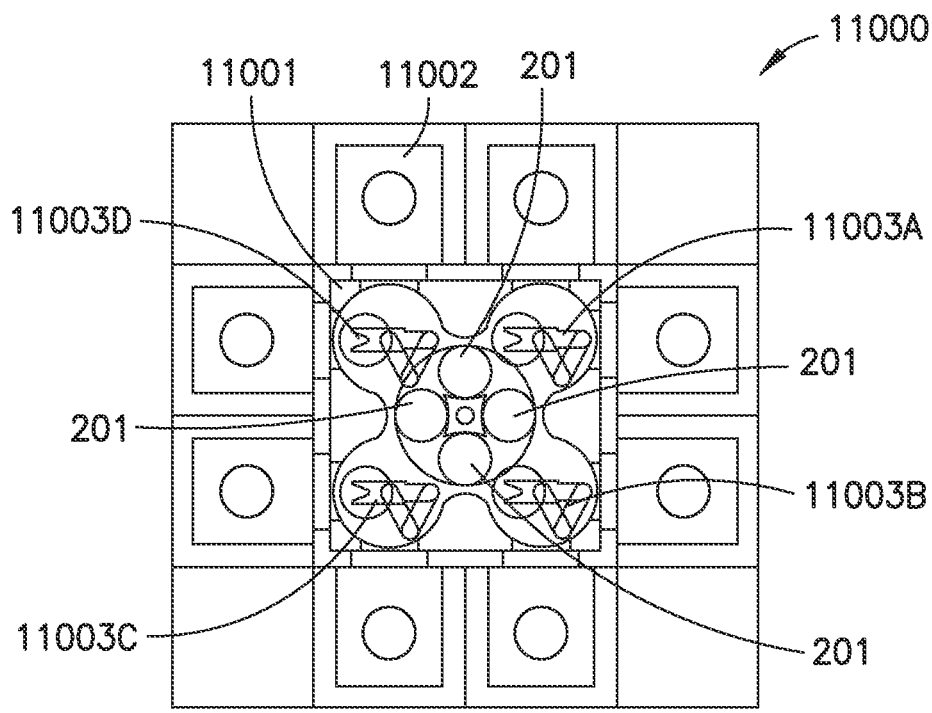
FIGS. 11-30 are schematic illustrations of processing tools in accordance with aspects of the disclosed embodiment.

FIG. 11 illustrates a processing tool 11000 having a central transfer chamber 11001 and one or more processing modules 11002 (substantially similar to those described above) communicably coupled to one or more sides of the central transfer chamber 11001. The central transfer chamber 11001 may have any suitable polygonal shape. In this aspect one or more interface modules 201 may be integral with or otherwise connected to the central transfer chamber for allowing coupling of one or more substrate pods 210 to the processing tool 11000 so that a clean tunnel is formed between the substrate pod(s) 210 and, for example, any suitable portion of the processing tool. One or more robotic transports 11003A-11003D may be disposed within the central transfer chamber 11001, such as at each corner of the central transfer chamber, for transporting substrates between each other, the processing modules 11002 and the interface modules 201. As may be realized, while two processing modules 11002 are shown on each side of the central transfer chamber 11001 in other aspects any suitable number of processing modules may be coupled to each side of the central transfer chamber in a side by side and/or a stacked configuration. In one aspect an overhead transport (not shown) or any other suitable transport may transfer the substrate pod(s) 210 to the interface modules 201 of the processing tool 11000. As may be realized, the central transfer chamber may also include any other suitable processing equipment such as substrate aligners and substrate buffers.

Figure 12:
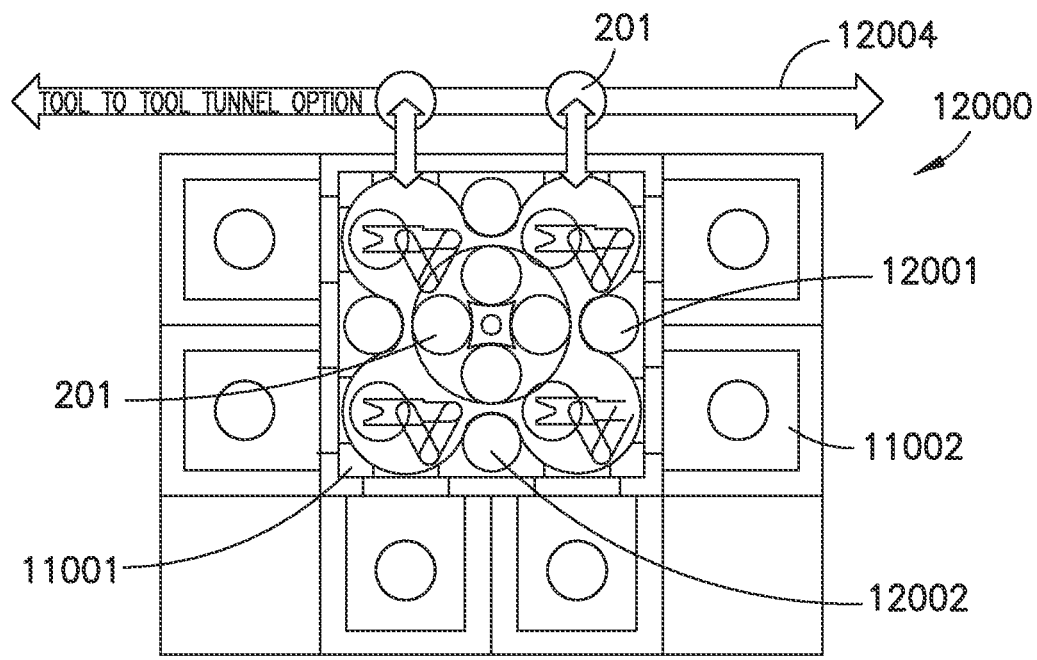

FIG. 12 illustrates a processing tool 12000 substantially similar to processing tool 11000. In this aspect the central transfer chamber 11001 is shown with substrate aligners 12001 and substrate buffers 12002 disposed within the central transfer chamber 11001. Here a transport 12004, such as an overhead transport or other suitable transport, is shown interfaced with one side of the central transfer chamber 11001 in any suitable manner. In one aspect one or more interface modules 201 may provide the interface between the transport 12004 and central transfer chamber 11001 while in other aspects any suitable interface, such as an equipment front end module including one or more load ports, may be provided as the interface between the transport 12004 and central transfer chamber 11001.

Figure 13:
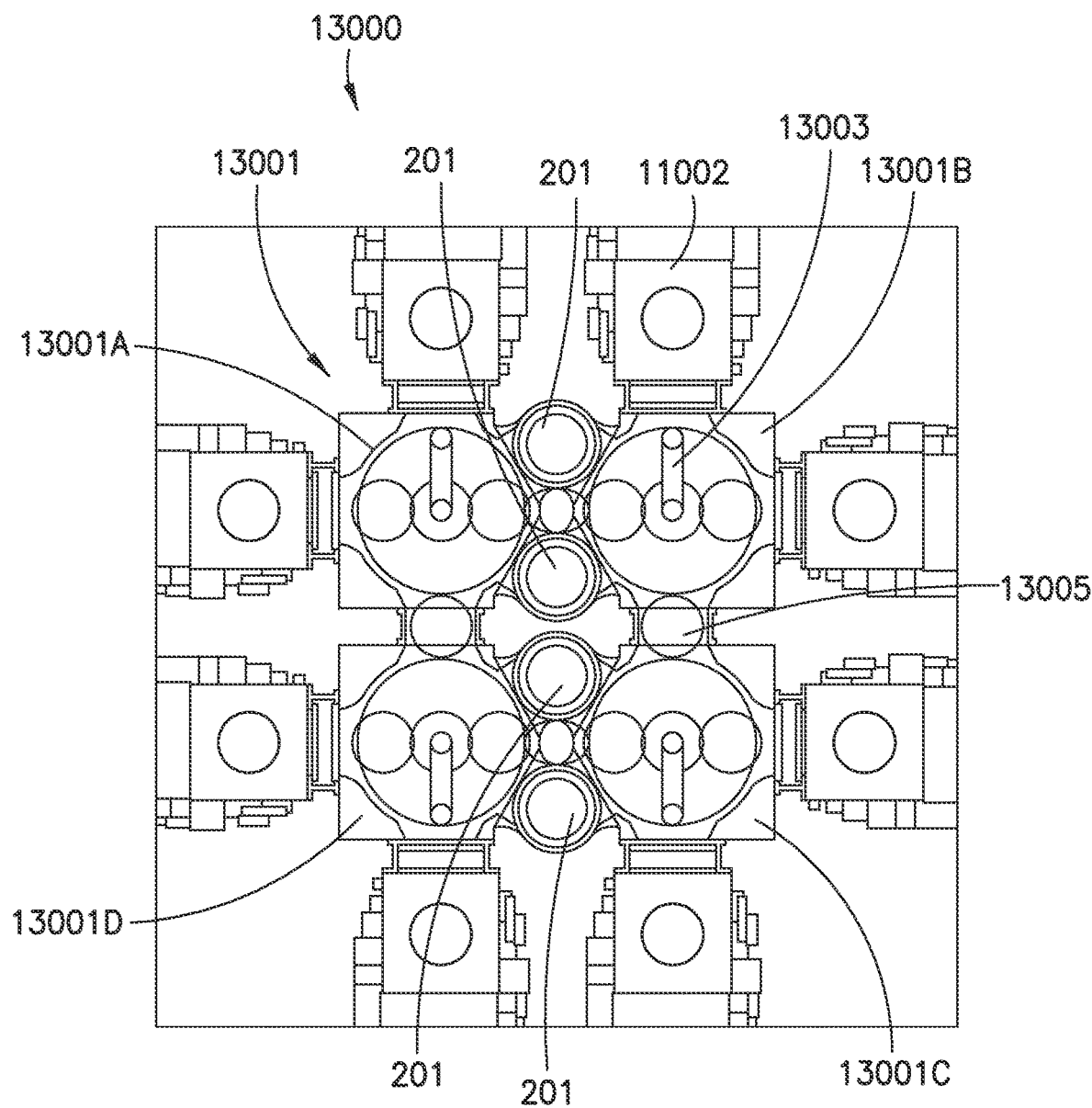

Referring now to FIG. 13 another exemplary processing tool 13000 is illustrated in accordance with aspects of the disclosed embodiment. Here the central transfer chamber 13001 comprises one or more distinct transfer chambers 13001A-13001D that are connected to each other in any suitable manner so that a clean tunnel is formed between the transfer chambers 13001A-13001D. Here the distinct transfer chambers may each include one or more substrate transport robots 13003 and be connected to each other by interface modules 201 and or any suitable load lock and/or buffer modules 13005. As may be realized, while the interface modules 201 are shown as being arranged in line along a centerline of the central transfer chamber 13001 in other aspects the interface modules 201 and/or load lock and/or buffer modules 13005 may have any suitable arrangement.

Figure 14:
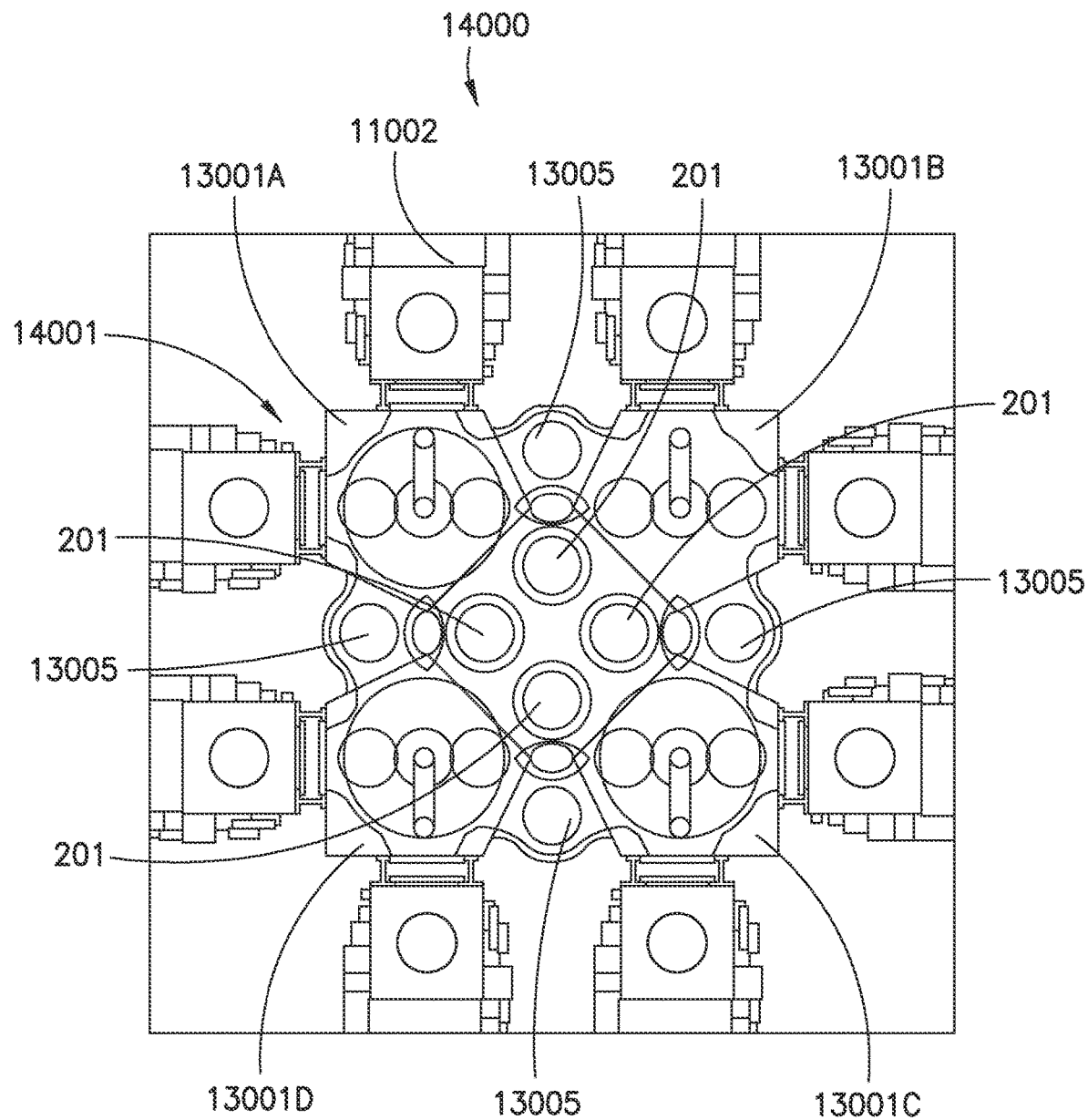

FIG. 14 illustrates a processing tool 14000 substantially similar to processing tool 13000 however in this aspect the interface modules 201 are centrally arranged in central transfer chamber 14001 in a clustered arrangement such that each distinct transfer chamber 13001A-13001D is connected to another distinct transfer chamber 13001A-13001D by both an interface module 201 and a load lock or buffer module 13005. As may be realized, substrate pods 210 may be transported to the processing tools 13000, 14000 in any suitable manner such as those described herein.

Figure 15:
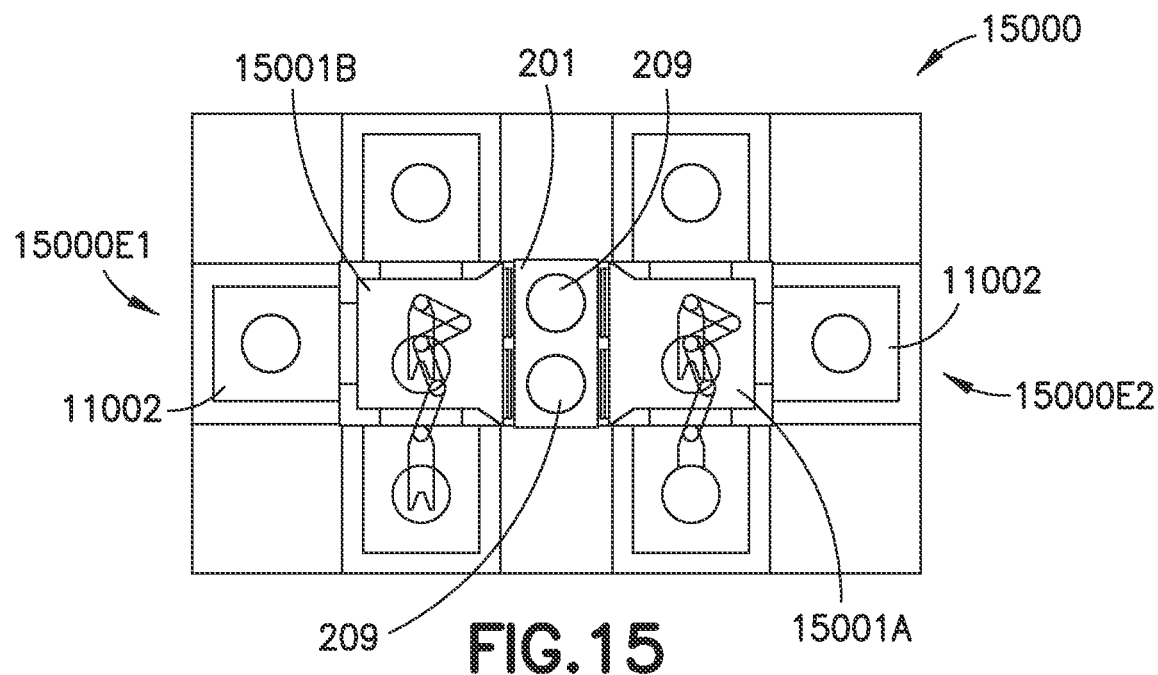

FIG. 15 illustrates a processing tool 15000 having a central interface module having two port plates 209 for holding two substrate pods 210. As noted above, the central interface module may be a multi-port interface module having a common internal chamber for the port plates 209 or separate internal chambers for each of the port plates 209. In this aspect transfer chambers 15001A, 15001B (substantially similar to those described herein) are connected to opposite sides of the interface module 201. Each transfer chamber 15001A, 15001B may have one or more processing modules 11002 connected to one or more sides of the transfer chamber 15001A, 15001B in any suitable manner such as described herein. The process tool may have ends 15000E1, 15000E2 with the clean tunnel extending between the ends 15000E1, 15000E2. The interface module may be located between the ends of the clean tunnel and may define a mid-entry or intermediate entry to the clean tunnel for inserting or removing substrates from the clean tunnel.

Figure 16:
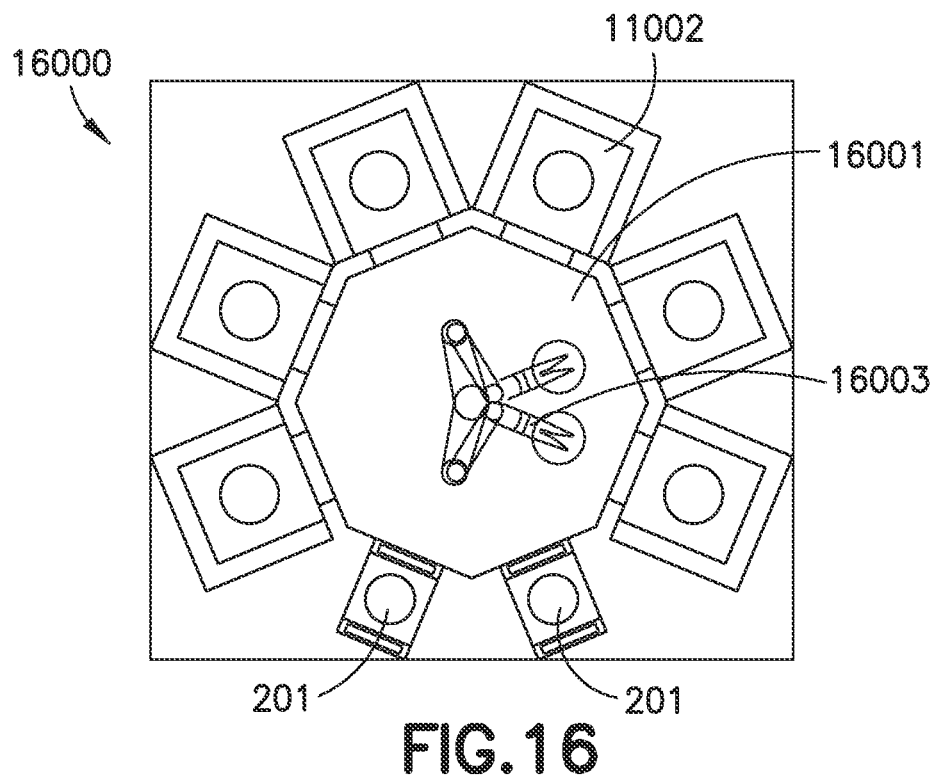

FIG. 16 illustrates a processing tool 16000 having a clustered architecture. The processing tool 16000 includes a multi-faceted central transfer chamber 16001 having one or more processing modules connected to one or more facets/sides of the transfer chamber 16001. In this aspect, two interface modules 201 are connected to respective facets of the transfer chamber 16001 but in other aspects any suitable number of interface modules may be connected to the transfer chamber 16001. One or more suitable transfer robots 16003 may be provided within the transfer chamber 16001 for transferring substrates between substrate pods 210 coupled to the interface modules 201 and the processing modules 11002.

Figure 17:
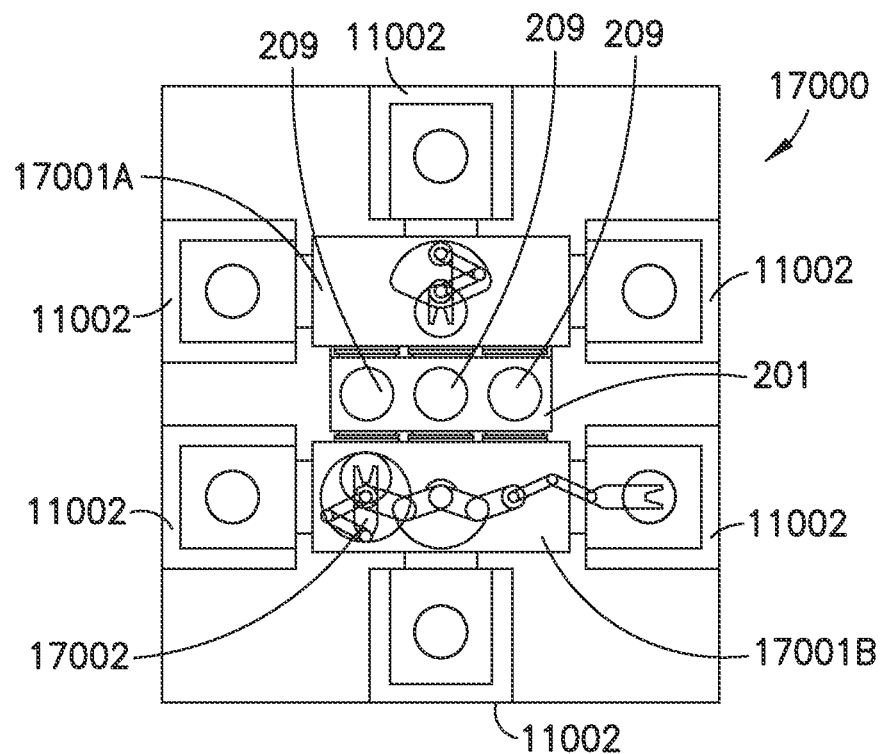
Figure 18:
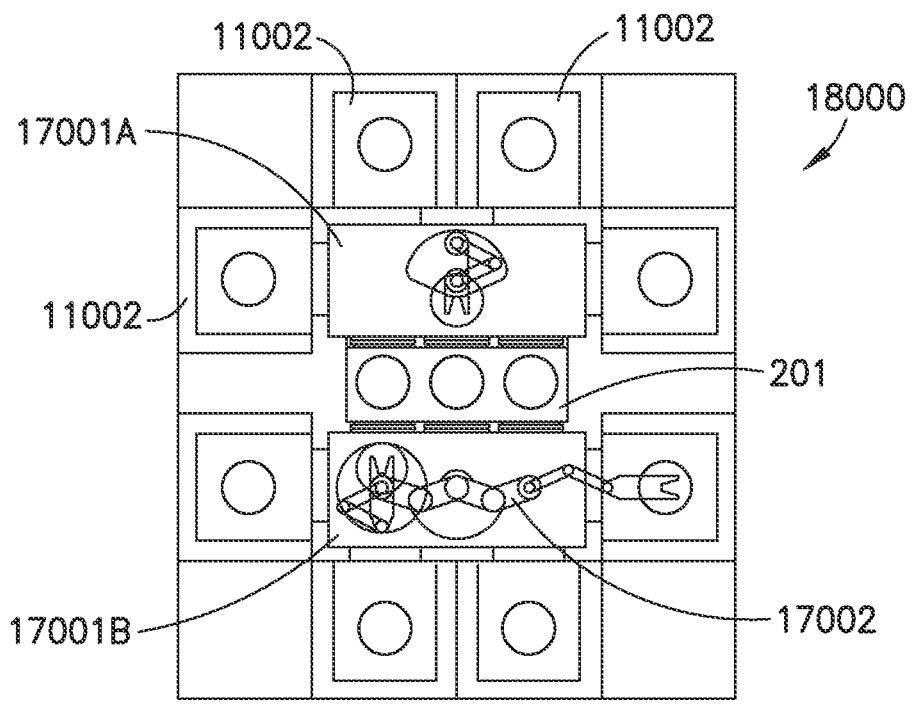

FIGS. 17 and 18 illustrate processing tools 17000, 18000 substantially similar to processing tool 15000. However in these aspects the interface module includes three port plates 209 for coupling three substrate pods 210 to the processing tools 17000, 18000. As may be realized the transfer chambers 17001A, 17001B may be linearly elongated transfer chambers having a length corresponding to a length of the interface module 201. Each transfer chamber 17001A, 17001B may include one or more transport robots 17002 suitably configured (e.g. in any suitable manner) to extend the length of a respective transfer chamber 17001A, 17001B for accessing each sealable opening 201S of the interface module 201 and each processing module 11002 connected to the transfer chamber 17001A, 17001B. It is noted that at least one processing module 11002 may be connected to the elongated side of the transfer chamber 17001A, 17001B opposite the interface module in a side by side and/or stacked arrangement.

Figure 19:
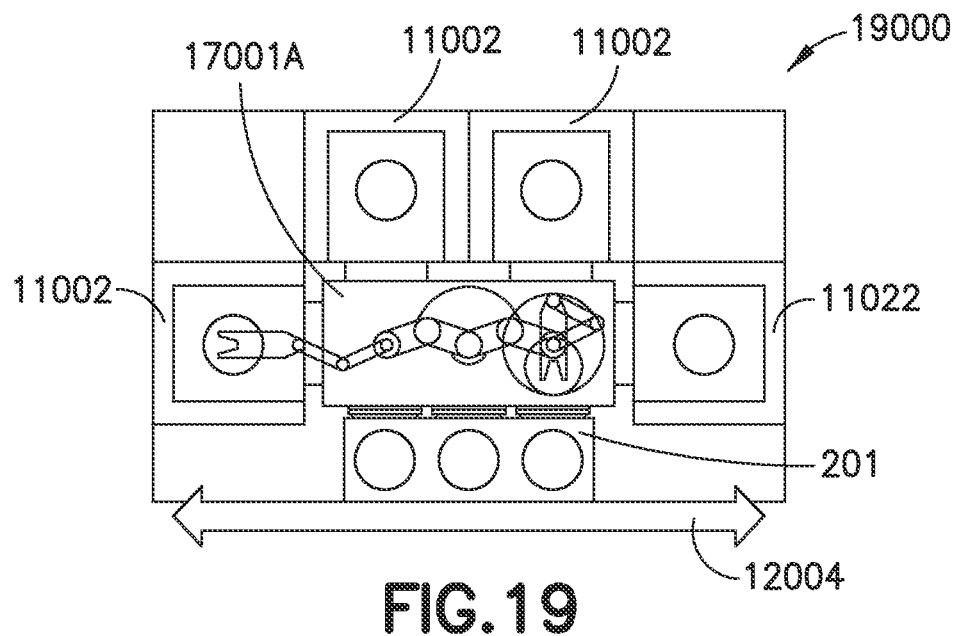

FIG. 19 illustrates a processing tool 19000 substantially similar to those described above with respect to FIGS. 17 and 18. However, only one transfer chamber 17001A is provided. The transport 12004 is provided to transfer substrate pod(s) 210 to the interface module 201. As may be realized the transport 12004 may also pass between the transfer chamber 17001A, 17001B in FIGS. 17 and 18 to transfer substrate pods 210 to the interface module 201.

Figure 20:
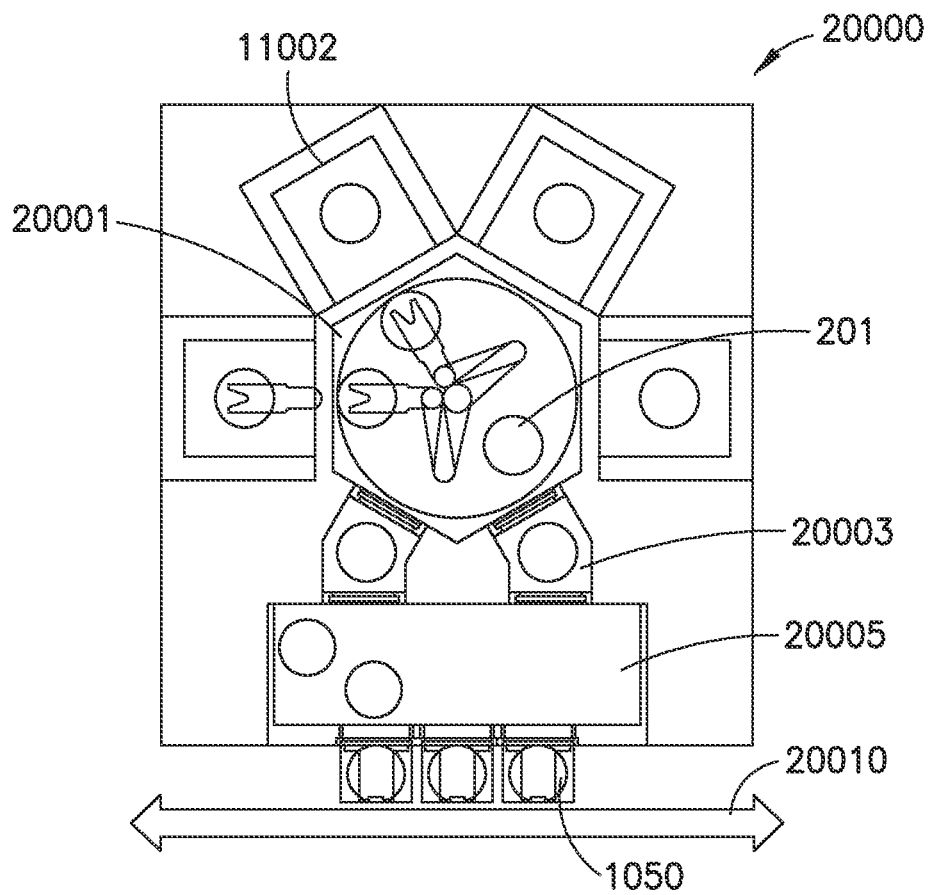

FIG. 20 illustrates a cluster type processing tool 20000 having a central transfer chamber 20001 (which may be substantially similar to transfer chamber 16001), one or more processing modules connected to the transfer chamber 20001 and an equipment front end module 20005 connected to the transfer chamber 20001. The equipment front end module 20005 may be substantially similar to those described above (see e.g. FIGS. 1A-1D) and be connected to the transfer chamber 20001 in any suitable manner such as through one or more load locks 20003. In some embodiments (not illustrated), one or both of load locks 20003 may be replaced by an interface module and interface module 201 may be removed from transfer chamber 20001. As may be realized, the transfer chamber 20001 may include an interface module 201 and/or one or more of the processing module 11002 may be replaced with an interface module(s) 201. As may be realized one or more suitable transports 20010 may be provided for transferring substrate cassettes 1050 to the equipment front end module 20005 and/or substrate pods 210 to the interface module 201.

Figure 21:
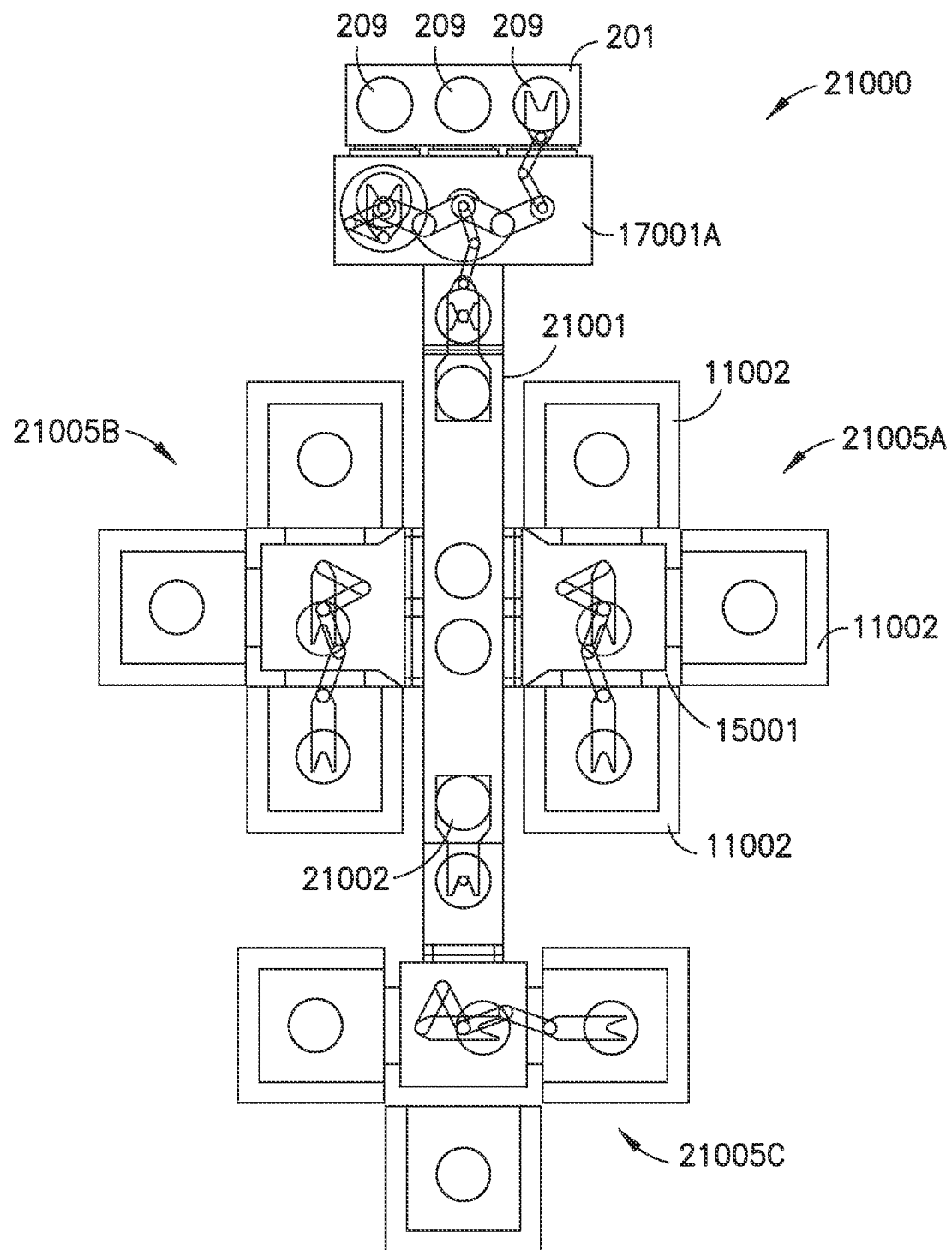

Referring now to FIG. 21 another processing tool 21000 in accordance with aspects of the disclosed embodiment. Here the processing tool 21000 includes an elongated interface module 201 and transfer chamber 17001A substantially similar to those described above with respect to, e.g. FIGS. 17 and 18. An elongated transfer chamber 21001 may be connected to the transfer chamber 17001A and include one or more suitable transport carts 21002 (e.g. passive carts that have fixed substrate supports or active carts with one or more transport arms mounted to the carts) configured to traverse a length of the elongated transfer chamber 21001. The transport carts 21002 may be driven along the length of the elongated transfer chamber 21001 in any suitable manner such as by magnetic levitation, cables, belts or any other drive configuration. The transport carts 21002 may also be configured to pass above/below one another and may include Z-motion capabilities for transferring substrates along different transfer planes and to processing modules and/or transfer chambers having stacked entrances and exits. One or more processing cells 21005A-21005C may be connected substantially directly (e.g. through a sealable port) to the elongated transfer chamber 21001 in any suitable manner and along any portion of the elongated transfer chamber 21001. In one aspect each processing cell may include a central transfer chamber 15001 and one or more processing modules 11002 connected to the central transfer chamber 15001. In other aspects the processing cells may be connected to the elongated transfer chamber 21001 by, for example, a load lock or buffer module. Here processing cell 21005C is located on an end of the elongated transfer chamber 21001 opposite the interface module 201 and processing cells 21005A, 21005B are located on opposite lateral sides of the elongated transfer chamber 21001. In other aspects the elongated transfer chamber 21001 may have any suitable length such that any suitable number of processing cells may be connected to the elongated transfer chamber 21001. As may also be realized the interface module 201 and transfer chamber 17001A may be located at any suitable location(s) along the elongated transfer chamber 21001. In one aspect more than one interface module 201 (and associate transfer chamber) may be connected to the elongated transfer chamber 21001 and/or incorporated into one or more of the processing cells 21005A-21005C.

Figure 22:
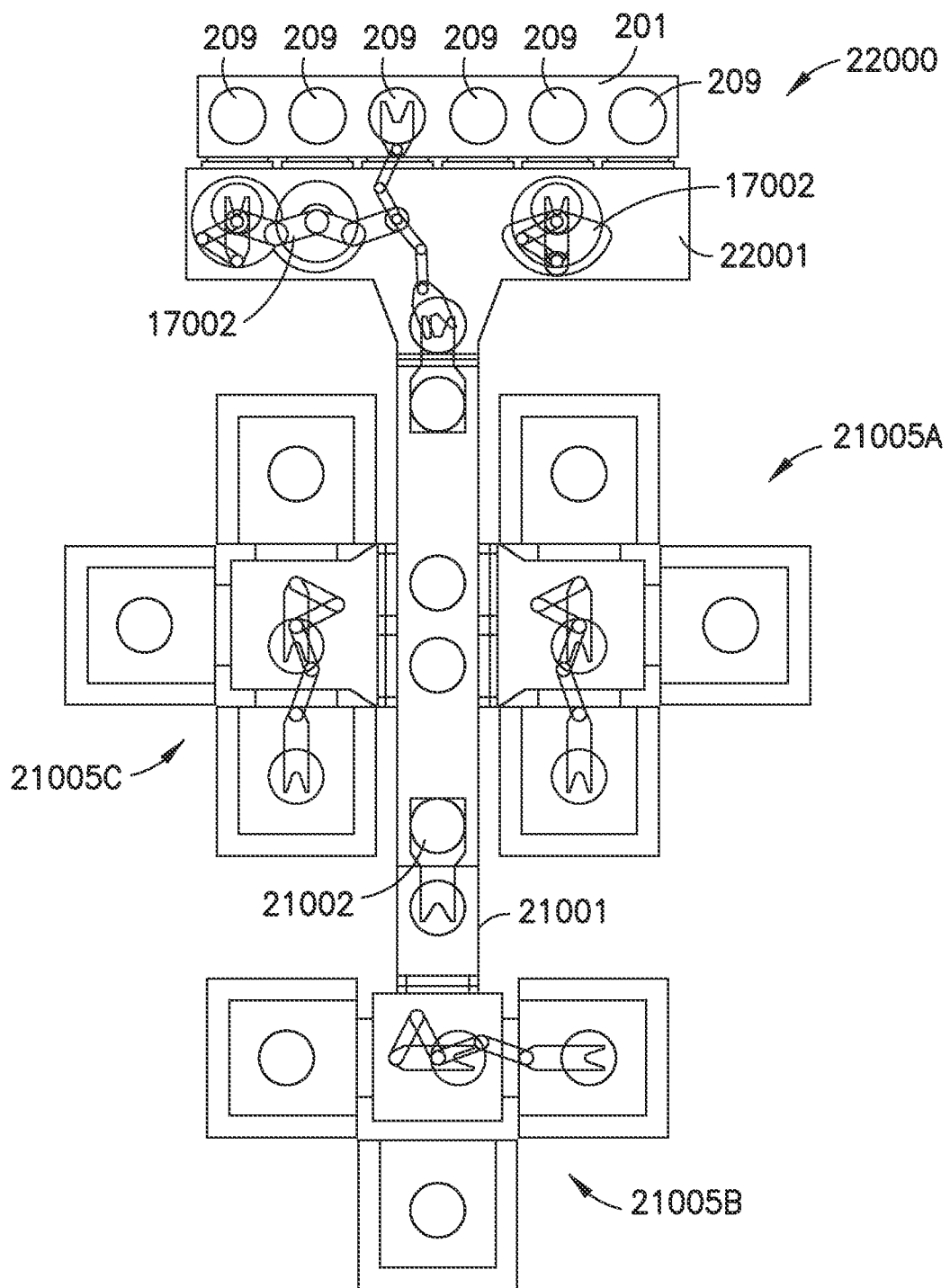
Figure 23:
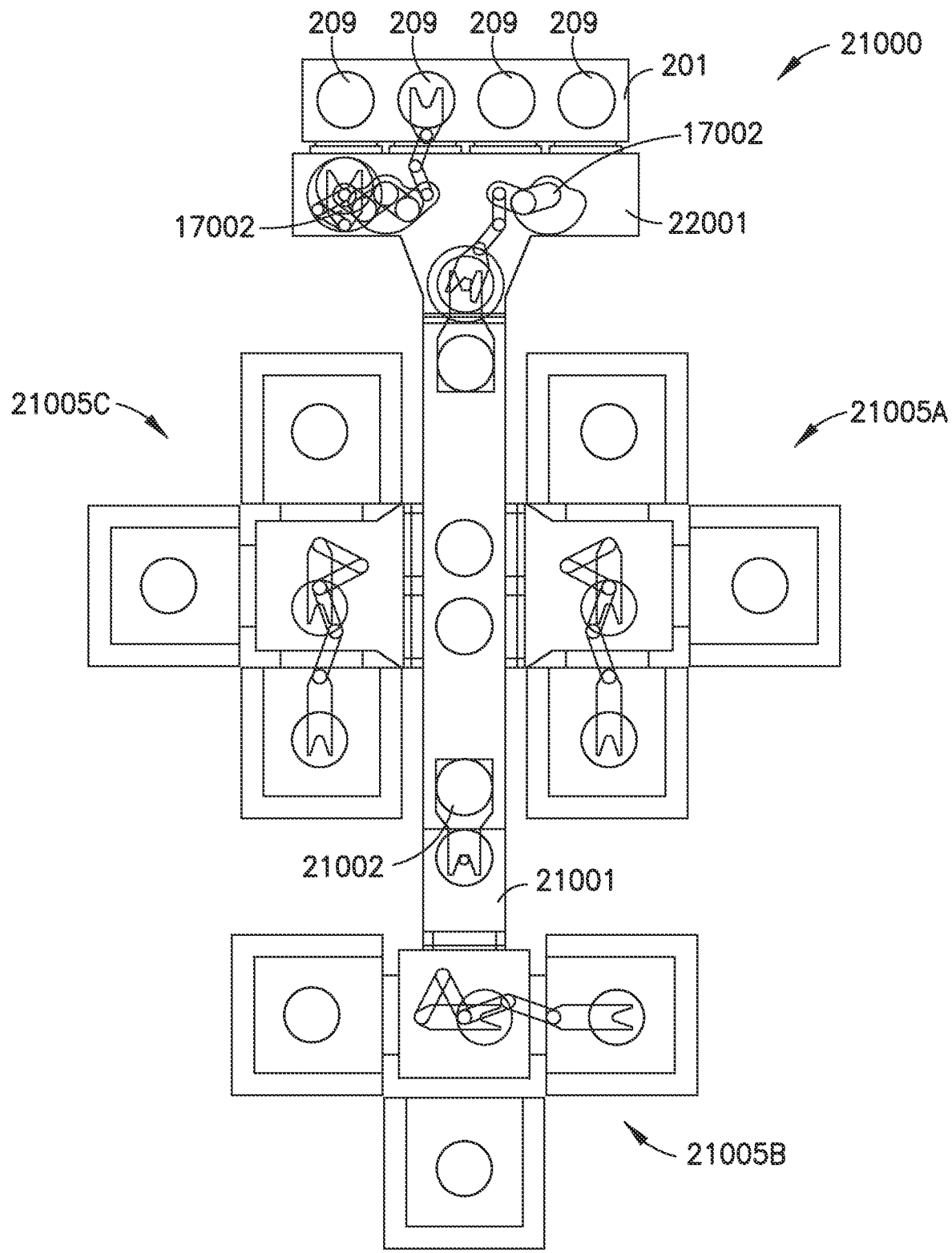

Referring now to FIGS. 22 and 23 another processing tool 22000 is illustrated in accordance with aspects of the disclosed embodiment. The processing tool 22000 may be substantially similar to processing tool 21000. However, in this aspect the interface module may be elongated to interface with any suitable number of substrate pods 210 (which for exemplary purposes only the interface module 201 in FIG. 22 is illustrated as being configured to interface with six substrate pods while the interface module 201 in FIG. 23 is illustrated as being configured to interface with four substrate pods). As may be realized the transfer chamber 22001 connecting the interface module 201 to the elongated transfer chamber 21001 may also be elongated and configured to access each sealable opening 201S of the interface module 201. For example, the transfer chamber 22001 may include two stationary transfer robots 17002 substantially similar to those described above with respect to FIGS. 17 and 18. Each transfer robot 17002 may be configured to transport substrates between a respective half of the interface module 201 and the elongated transfer chamber 21001. In other aspects the transfer chamber 22001 may include one or more transfer robots mounted to a shuttle or slide so that the transfer robots can traverse a length of the transfer chamber 22001 in a manner similar to that described above with respect to the carts 21002.

Figure 24:
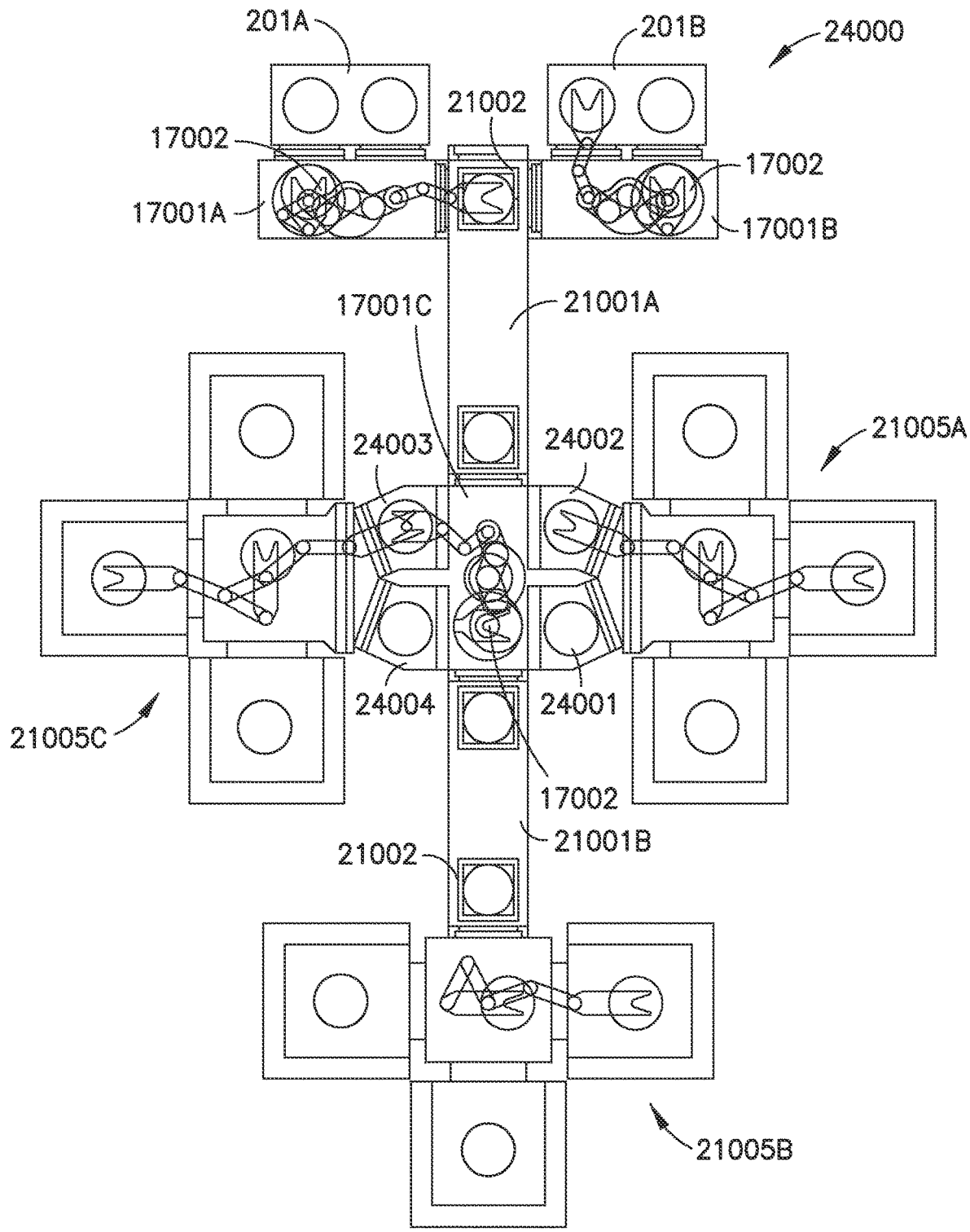

Referring to FIG. 24 another processing tool 24000 is illustrated. In this aspect the processing tool includes two interface modules 201A, 201B and associated transfer chambers, a first elongated transport chamber section 21001A, a second elongated transfer chamber section 21001B, one or more processing cells 21005A-21005C and an inline transfer chamber 17001C. Each of the transfer chambers 17001A-17001C may include one or more transport robots 17002 substantially similar to those described above. Each of the elongated transport chamber sections 21001A, 21001B may include one or more carts 21002 substantially similar to those described above. Here, the transfer chambers 17001A, 17001B may be connected to opposite lateral sides of the first elongated transport chamber section 21001A for transferring substrates between substrate pods 210 coupled to the interface modules 201A, 201B into the first elongated transfer chamber section 21001A. The inline transfer chamber 17001C may connect the first elongated transfer chamber section 21001A with the second elongated transfer chamber section 21001B in any suitable manner. Here the longitudinal axis of the inline transfer chamber 17001C is aligned with a longitudinal axis of each of the first and second elongated transfer chamber sections 21001A, 21001B. Processing cells 21005A, 21005C may be connected to the inline transfer chamber 17001C in any suitable manner such as by one or more load locks 24001-24004. It is noted that each of the load locks 24001-24004 may include one or more stacked load locks for transferring substrates between the respective processing cells 21005A, 21005C and the inline transfer chamber 17001C along different stacked transport planes. The processing cell 21005B may be disposed at an end of the second elongated transfer chamber section 21001B in any suitable manner and may also include stacked substrate transfer/processing planes. As may be realized, in other aspects the components of the processing tool 24000 may have any suitable arrangement for processing substrates.

Figure 25:
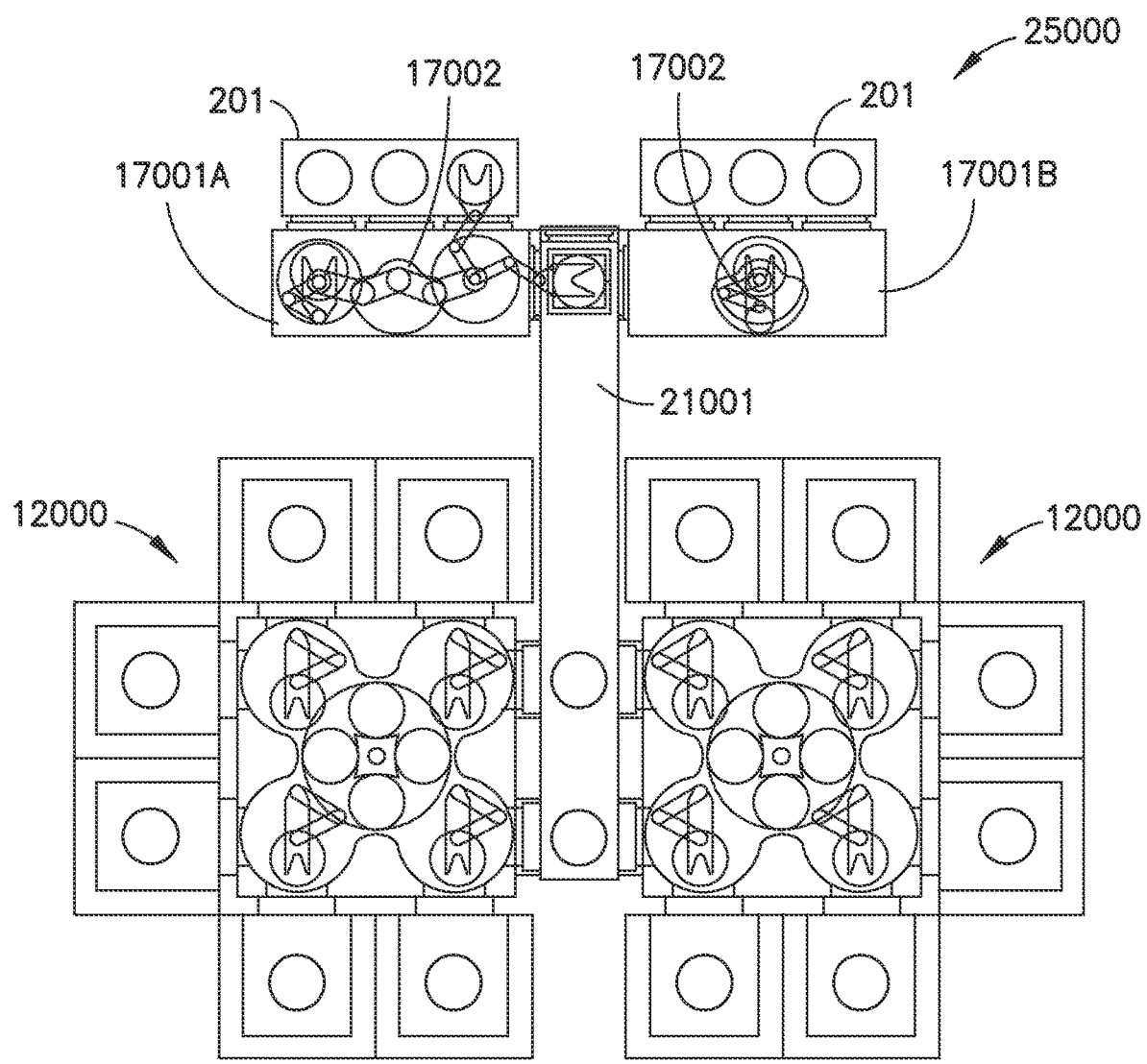

Referring to FIG. 25, another processing tool 25000 is shown in accordance with aspects of the disclosed embodiment. The processing tool 25000 may be substantially similar to processing tools 21000, 22000, 23000 and 24000. However, as may be realized any of the processing tools described herein may be connected to the, for example, the elongated transfer chamber 21001 in any suitable manner. For exemplary purposes only, FIG. 25 illustrates process tools 12000 being connected to opposite lateral sides of the elongated transfer chamber 21001.

Figure 26:
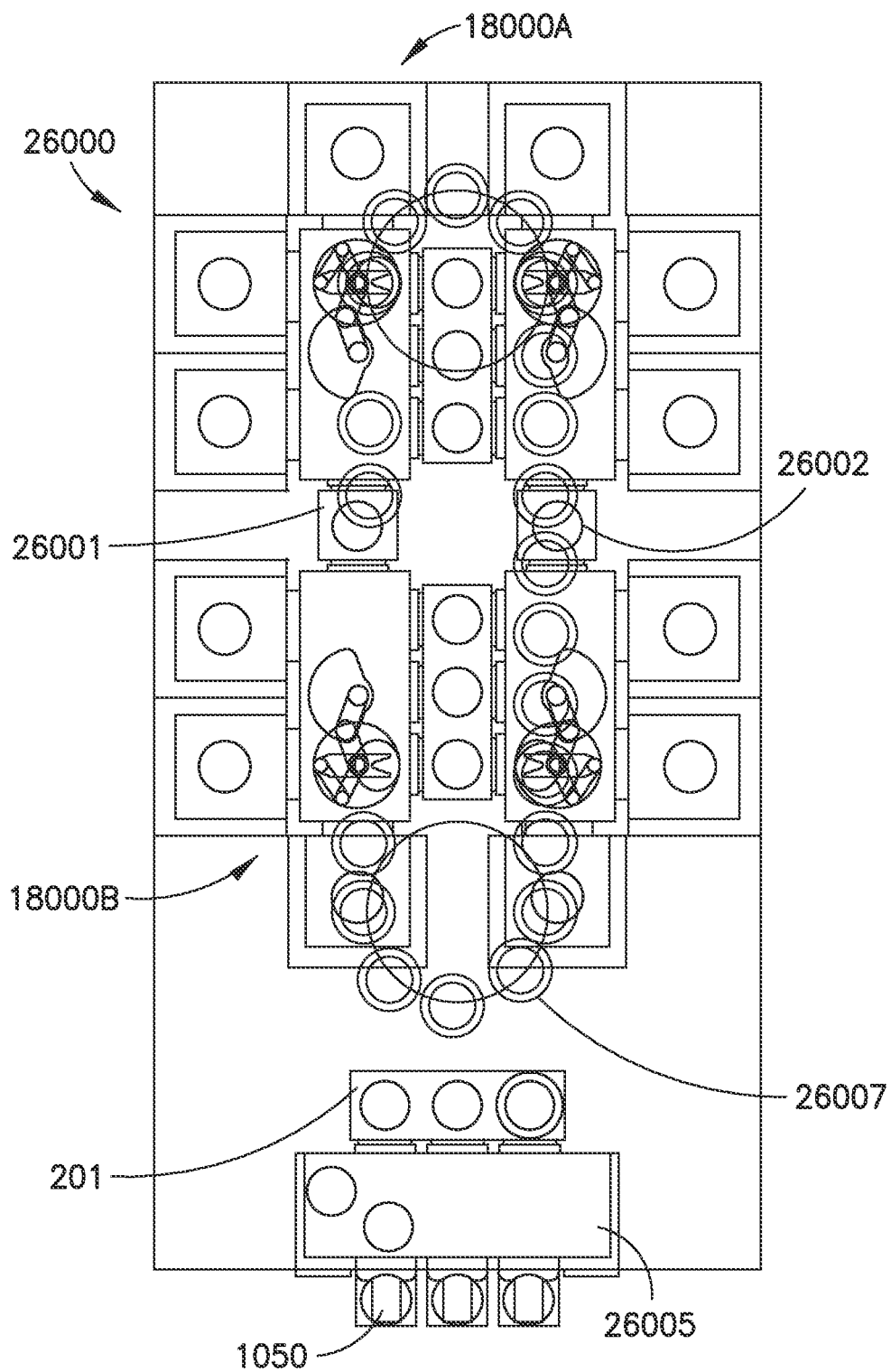

Referring now to FIG. 26 another processing tool 26000 is illustrated in accordance with aspects of the disclosed embodiment. Here two processing cells 18000A, 18000B, each of which may be substantially similar to processing tool 18000 (FIG. 18) or any other suitable processing tool such as those described herein, may be connected to each other through, for example, load locks 26001, 26002 in any suitable manner. An equipment front end module 26005 (similar to those described above) may be provided separate from the processing cells 18000A, 18000B. The equipment front end module 26005 may have load ports on one or more sides for coupling cassettes 1050 to the equipment front end module 26005. The equipment front end module 26005 may also have one or more interface modules 201 connected to another side of the equipment front end module 26005. One or more transport robots of the equipment front end module 26005 may transfer substrates between the cassettes 1050 and substrate pods 210 coupled to each of the interface modules 201. The substrate pods 210 may be transferred between the interface module 201 connected to the equipment front end module 26005 and the processing cells 18000A, 18000B in any suitable manner such as by, e.g., transport system 26007. Transport system 26007 may be any suitable transport system including but not limited to an overhead transport system. In some embodiments, transport system 26007 can transport substrate pods to interface modules 201 located at one or more of processing cells 18000A, 18000B or load locks 26001, 26002. In some embodiments (not illustrated), one or both of load locks 26001, 26002 may be replaced by an interface module.

Figure 27:
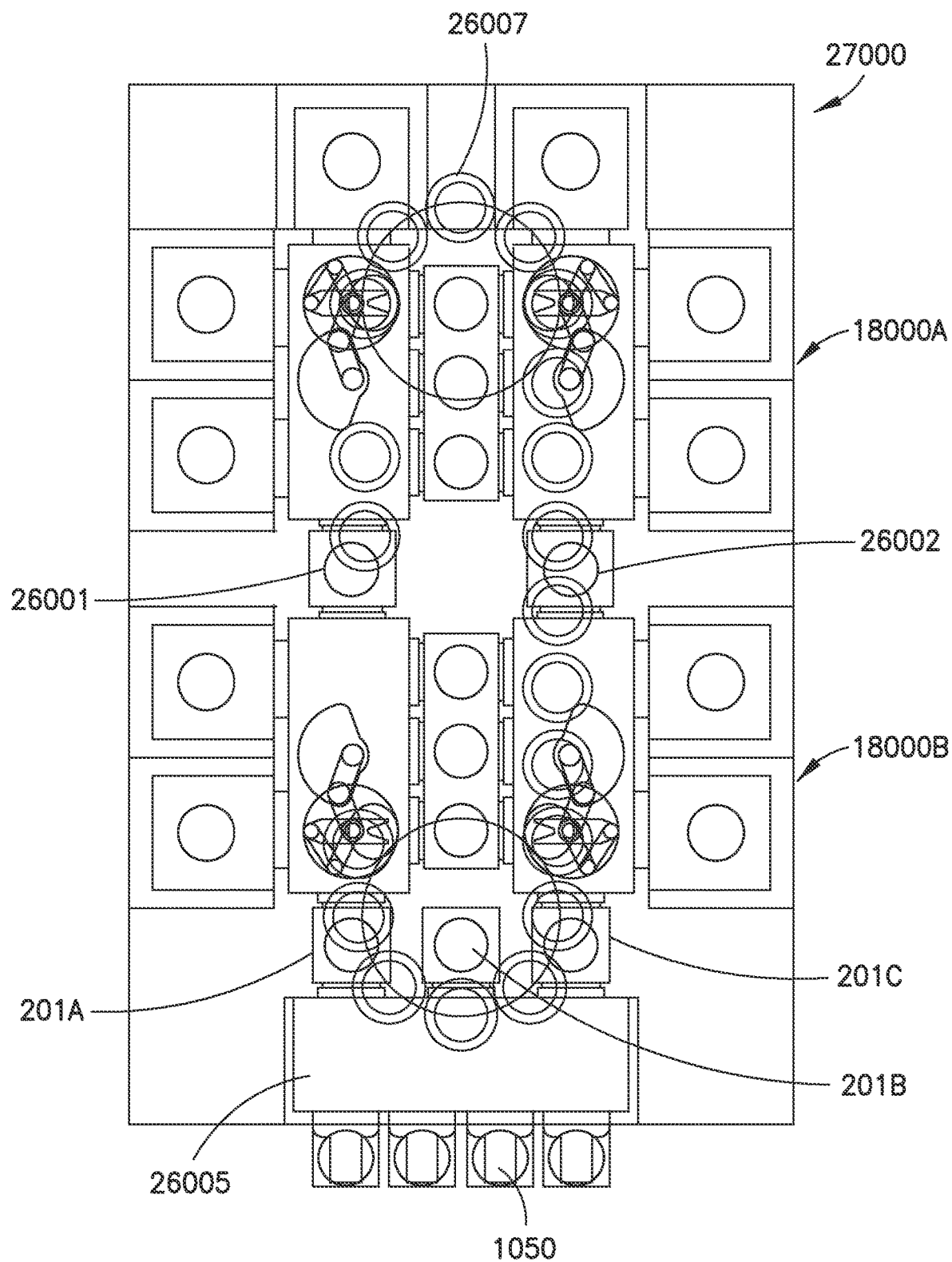

FIG. 27 illustrates another processing tool 27000 in accordance with aspects of the disclosed embodiment. The processing tool 27000 may be substantially similar to processing tool 26000 however in this aspect one or more of the interface modules 201A-201C may connect the equipment front end module 26005 to one or more of the processing cells 18000A, 18000B. For example, interface modules 201A, 201C may be pass through modules that allow substantially direct transfer of substrates between the transfer chambers of processing cell 18000B and the equipment front end module 26005. The interface modules 201A, 201C may also allow for the transfer of substrates between the cassettes 1050 and the substrate pods 210 so that the substrate pods can be transferred throughout the processing tool 27000 by transport system 26007.

Figure 28:
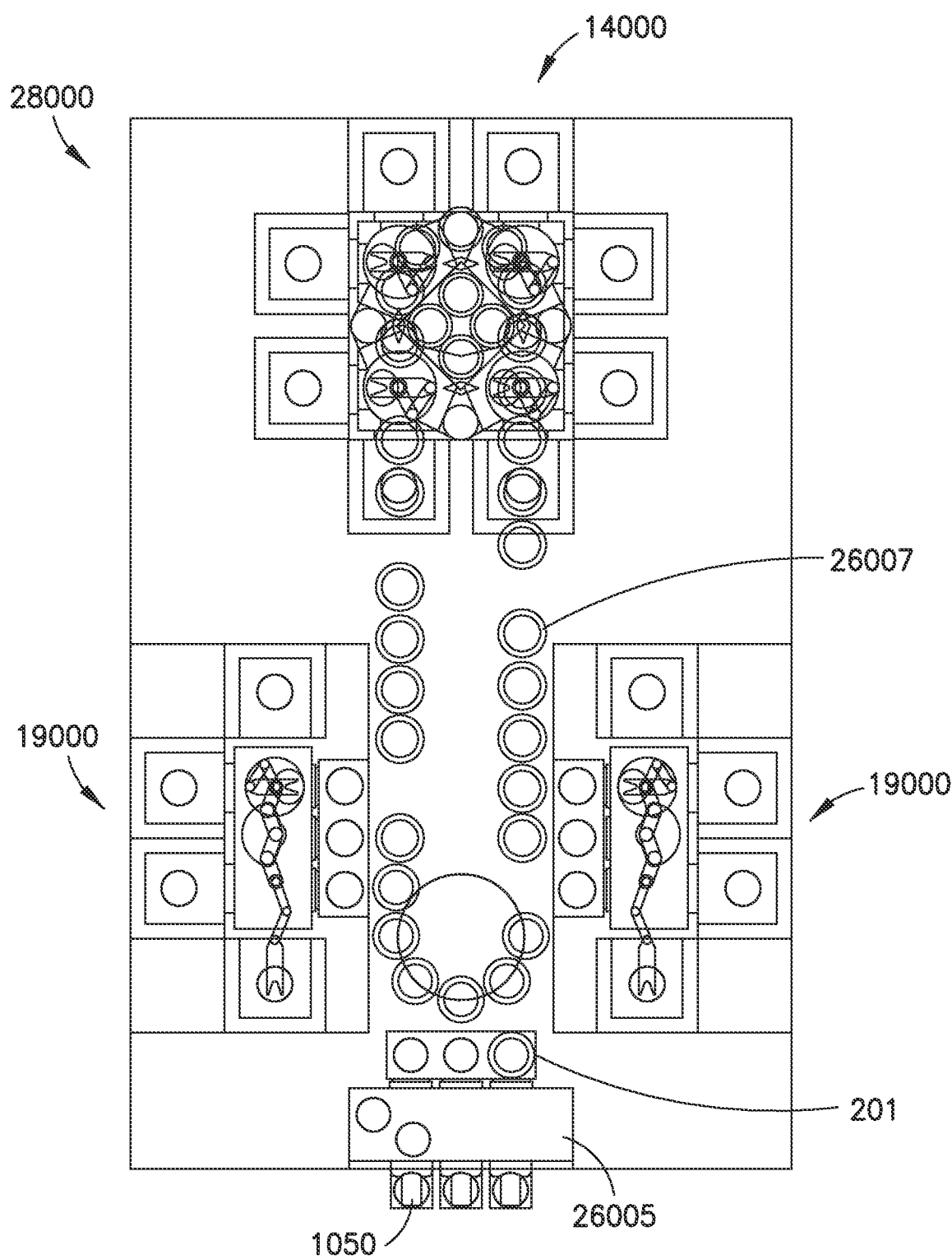
Figure 29:
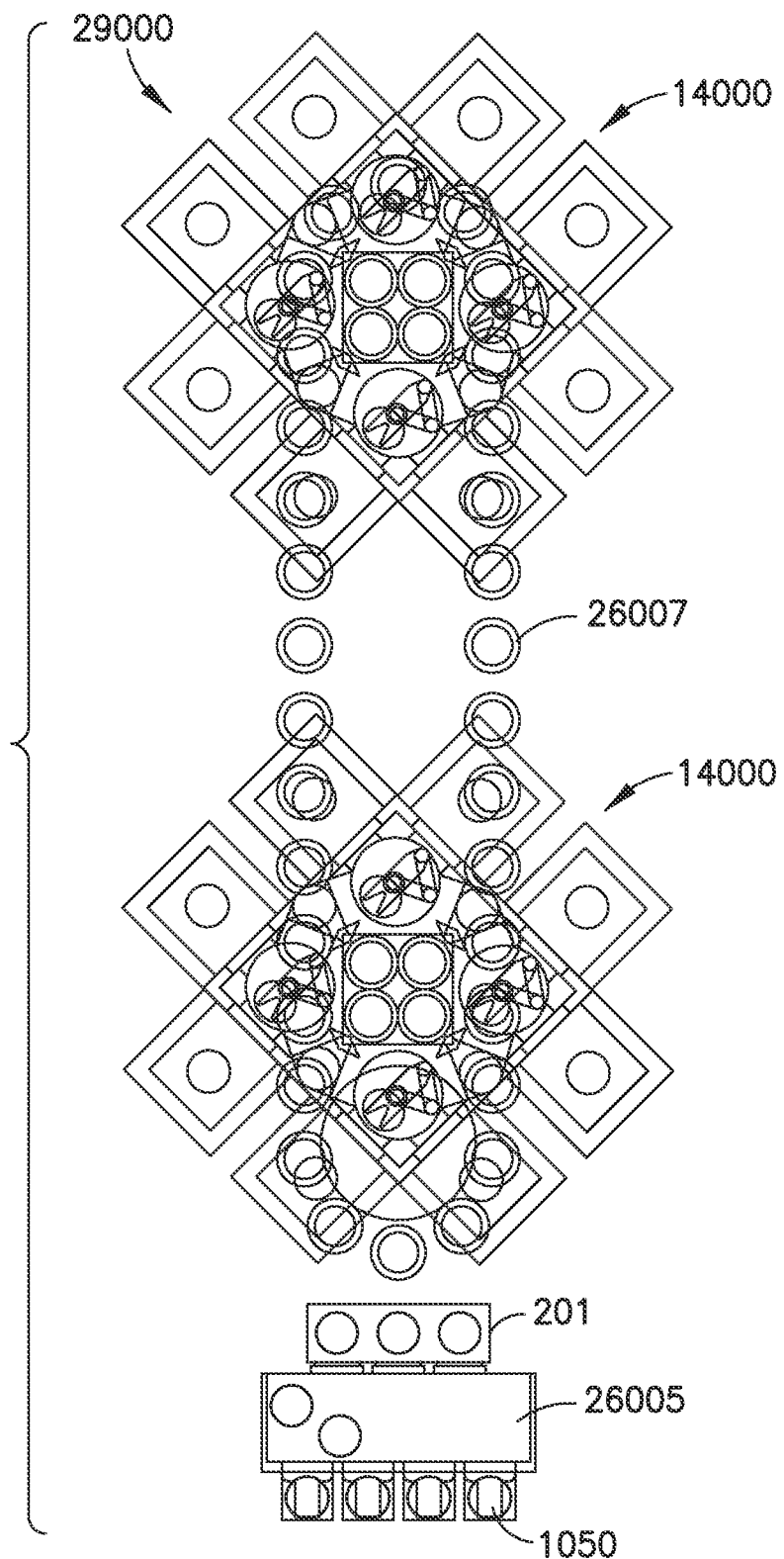

FIGS. 28 and 29 illustrate processing tools 28000, 29000 including combinations of the processing tools described herein. For example, the processing tool 28000 includes an equipment front end module 26005 for transferring substrates to one or more substrate pods 210 as described above. Any suitable transport system, such as transport system 26007, may transport the substrate pods between the interface module 201 of the equipment front end module 26005 and the interface modules of one or more processing cells, which in this example, include processing cells that are substantially similar to processing tools 19000 and 14000. Processing tool 29000 may also include an equipment front end module 26005 for transferring substrates to one or more substrate pods 210 as described above. Any suitable transport system, such as transport system 26007, may transport the substrate pods between the interface module 201 of the equipment front end module 26005 and the interface modules of one or more processing cells, which in this example, include processing cells that are substantially similar to processing tool 14000. As may be realized, the transport system 26007 may transport the substrate pods 210 to any suitable number and type of processing cells.

Figure 30:
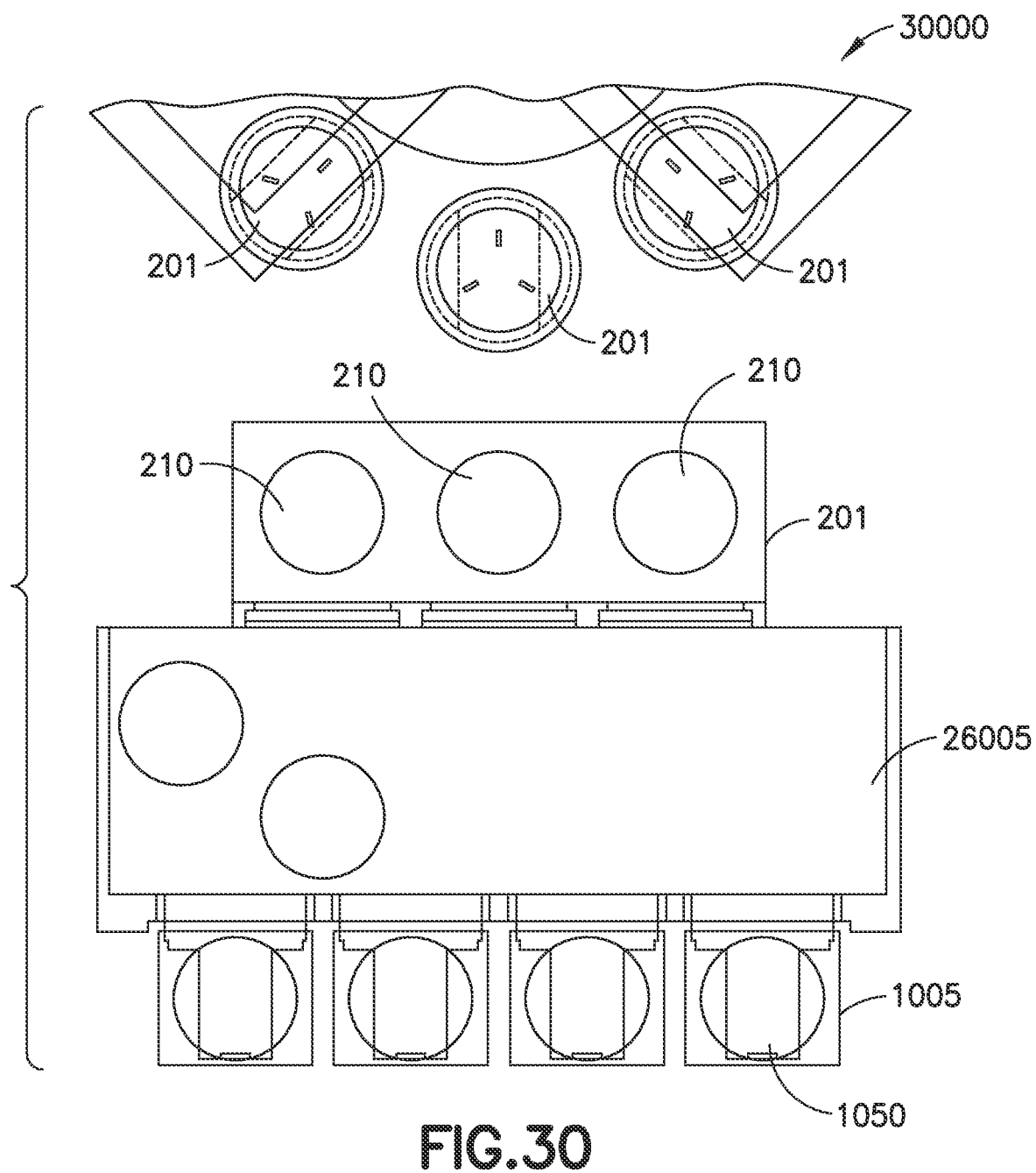

FIG. 30 illustrates the equipment front end module 26005. As described above, the equipment front end module 26005 may transfer substrates between the cassettes 1050 and the substrate pods 210. In one aspect the equipment front end module 26005 may be configured for sortation (in any suitable manner) of the substrates substantially directly between the cassettes 1050 and the substrate pods 210. The equipment front end module 26005 may be located on a floor or suspended from, for example, a ceiling or supported on, for example, pylons. Any suitable transport system, such as transport system 26007, may transport the substrate pods 210 holding the sorted substrates to interface modules 201 of any suitable processing cell 30000 such as those described herein.

Figure 31:
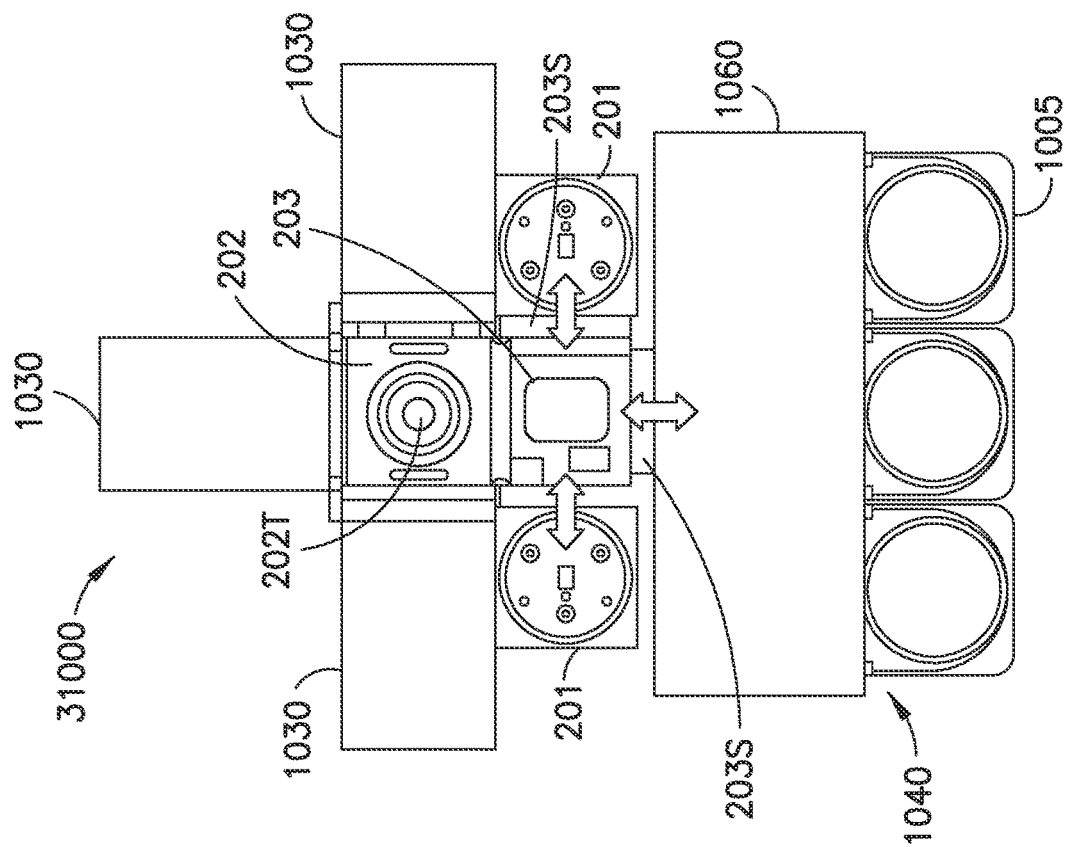

Referring now to FIG. 31, a processing tool 31000 is illustrated in accordance with aspects of the disclosed embodiment. The processing tool 31000 may be substantially similar to those described above. In one aspect the processing tool 31000 includes an atmospheric mini-environment (EFEM) 1060 having one or more load port modules 1005. One or more load lock 203 may be coupled to the mini-environment 1060 in any suitable manner such as through a sealable opening 203S. One or more interface modules 201 may be coupled to the load lock 203 in any suitable manner, such as through sealable openings 203S. A transfer chamber 202 may be coupled to the load lock 203 in any suitable manner, such as through a sealable opening 203S and one or ore processing modules 1030 may be coupled to the transfer chamber 202. In this aspect the substrates may enter or exit the load lock through the interface modules 201, the mini-environment 1060 and/or transfer chamber 202. The transfer chamber 202 and processing modules 1030 may form a vacuum and/or atmospheric processing platform 32001 (FIG. 32) for processing substrates in a vacuum or atmospheric environment. In one aspect, the load lock 203 may include any suitable substrate transport which may be substantially similar to those described above for transferring substrates to and from the vacuum interfaces (e.g. interface modules 201 and transfer chamber 202). In this aspect the substrate transport 202T of the transfer chamber 202 and a substrate transport of the mini-environment may transfer substrates substantially directly onto the substrate transport of the load lock 203 for transfer substrates through the load lock 203. In this aspect transfer of the substrates from pods 210 to the load lock 203 through a respective interface module 201 may be performed under vacuum conditions (e.g. in a vacuum environment where the interface modules provide a vacuum to vacuum interface) while in other aspects the interface modules 201 may provide a vacuum to atmospheric interface.

Figure 32:
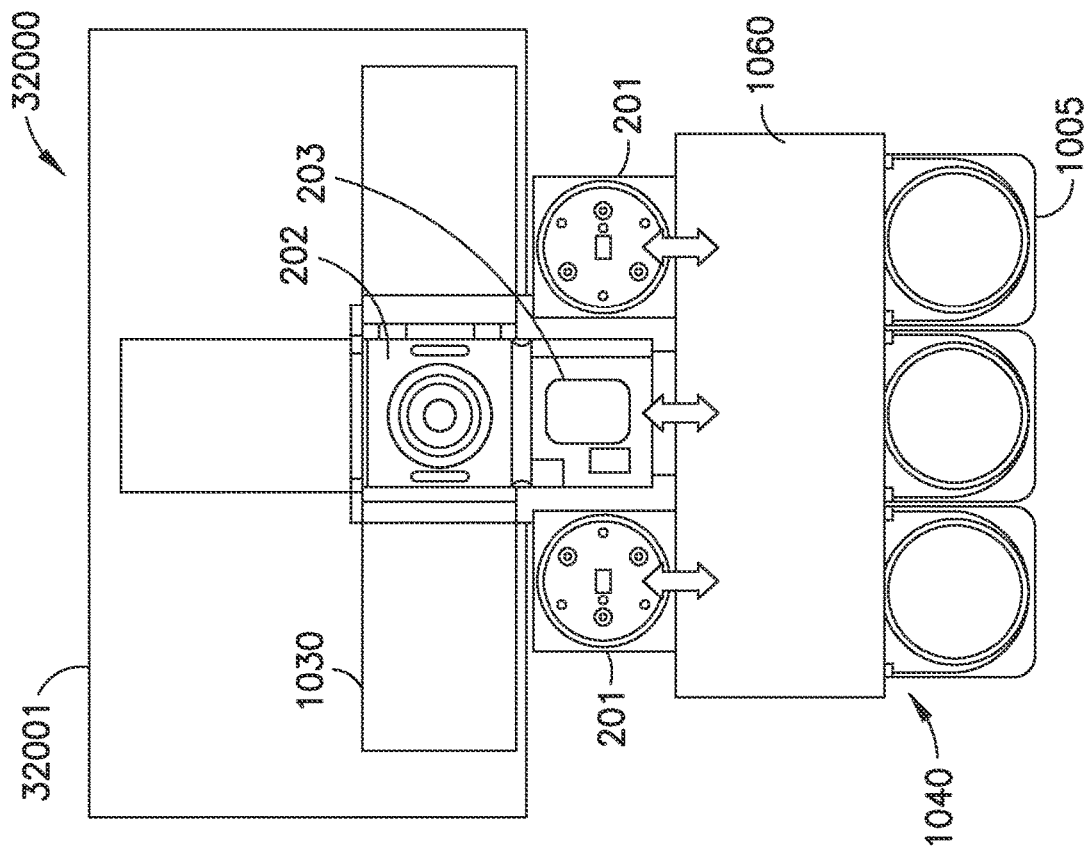
FIGS. 31 and 32 are schematic illustrations of processing tools in accordance with aspects of the disclosed embodiment.
Figure 33:
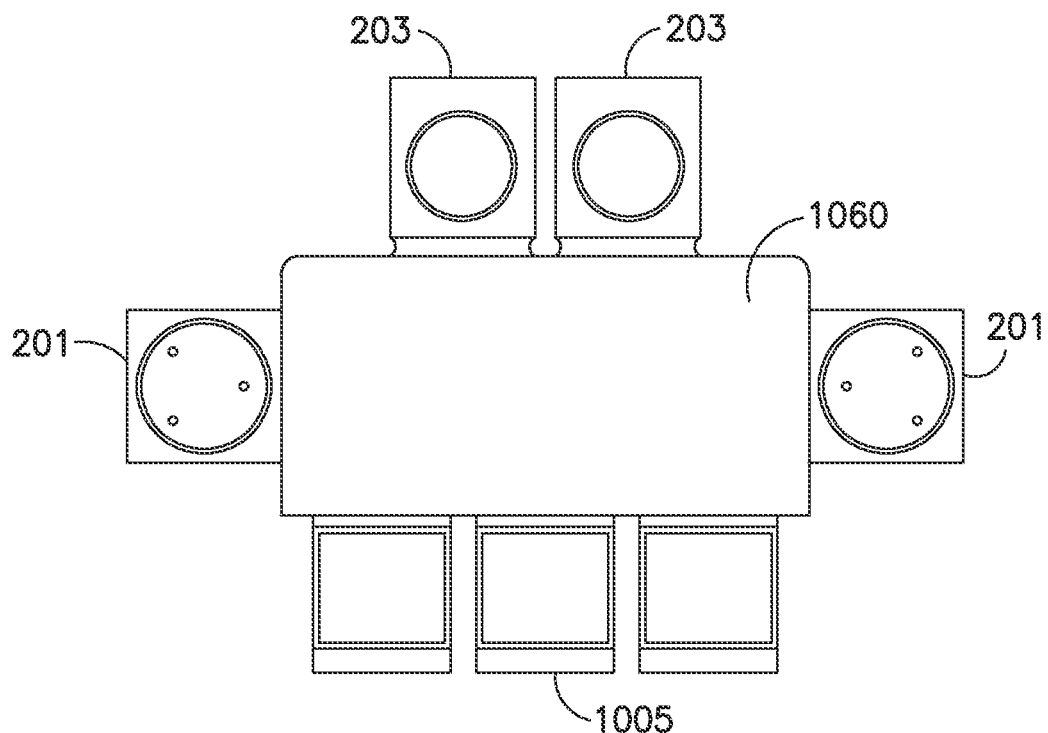
FIGS. 33 and 34 are schematic illustrations of portions of a processing tool in accordance with aspects of the disclosed embodiment.
Figure 34:
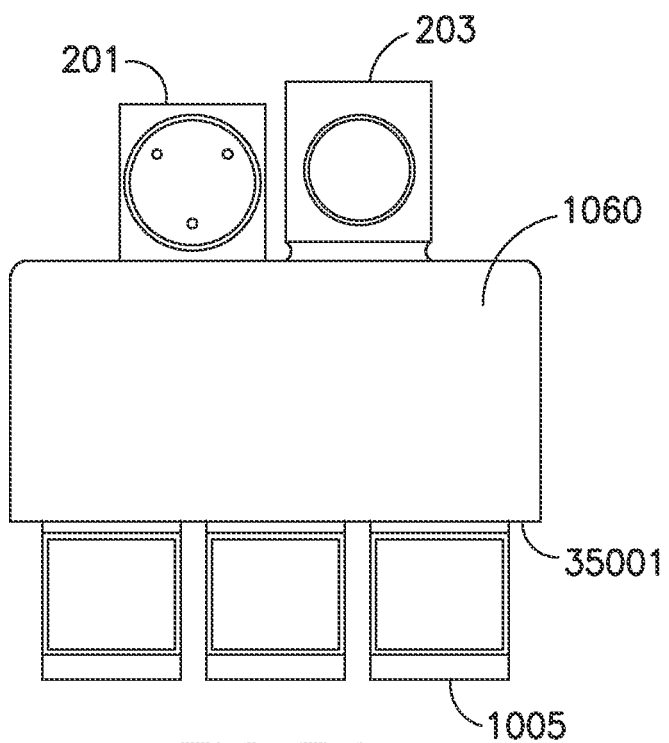

Referring now to FIG. 32, a processing tool 32000 is illustrated in accordance with aspects of the disclosed embodiment. The processing tool 32000 may be substantially similar to processing tool 31000 however, in this aspect the interface modules 201 interface with the atmospheric mini-environment 1060 such that substrates enter and exit the load lock 203 through the mini-environment 1060 or transfer chamber 202. Substrates can enter and/or exit the vacuum interface modules 201 through the mini-environment 1060. In this aspect the interface module may be configured to evacuate a pod or substrate carrier 210 mated to the interface module 201 in the manner described herein so that substrates can be transferred from the pod 210 to the mini-environment in an atmospheric environment and so that the atmospheric environment extends to an interior environment of the interface module 201 (such as the interior environment described below or an interior of the housing 210H). The interface module 201 may also be configured to pump down an interior of the pod 210 to a vacuum pressure, as described herein, before the pod 210 is uncoupled from the interface module 201 so that the pod 210 is moved to another processing tool or station. Pumping an interior of the pod 210 to a vacuum pressure may provide batch load lock functions for downstream vacuum processing tools or platforms. For example, the substrates may arrive at the downstream processing tools under vacuum conditions which may eliminate evacuating and pumping of the load lock 203 (e.g. coupled to an interface module to which the pod is coupled) when transferring substrates from the pod 210, reducing cycle times for the downstream vacuum processing tools. FIGS. 33 and 34 illustrate portions of a processing tool and show a mini-environment having one or more interface modules 201 coupled thereto in various positions relative to the load port modules 1005 and load lock(s) 203. For example, FIG. 33 illustrates the load port modules 1005 and load locks 203 being disposed on longitudinal sides of the mini-environment 1060 while one or more interface modules 201 are located on one or more of the lateral sides of the mini-environment 1060. FIG. 34 illustrates a load lock 203 and interface module 201 being located on the same longitudinal side of the mini-environment 1060. In other aspects the interface modules, load port modules and load locks may have any suitable arrangement relative to each other and the mini-environment 1060.

Figure 35A:
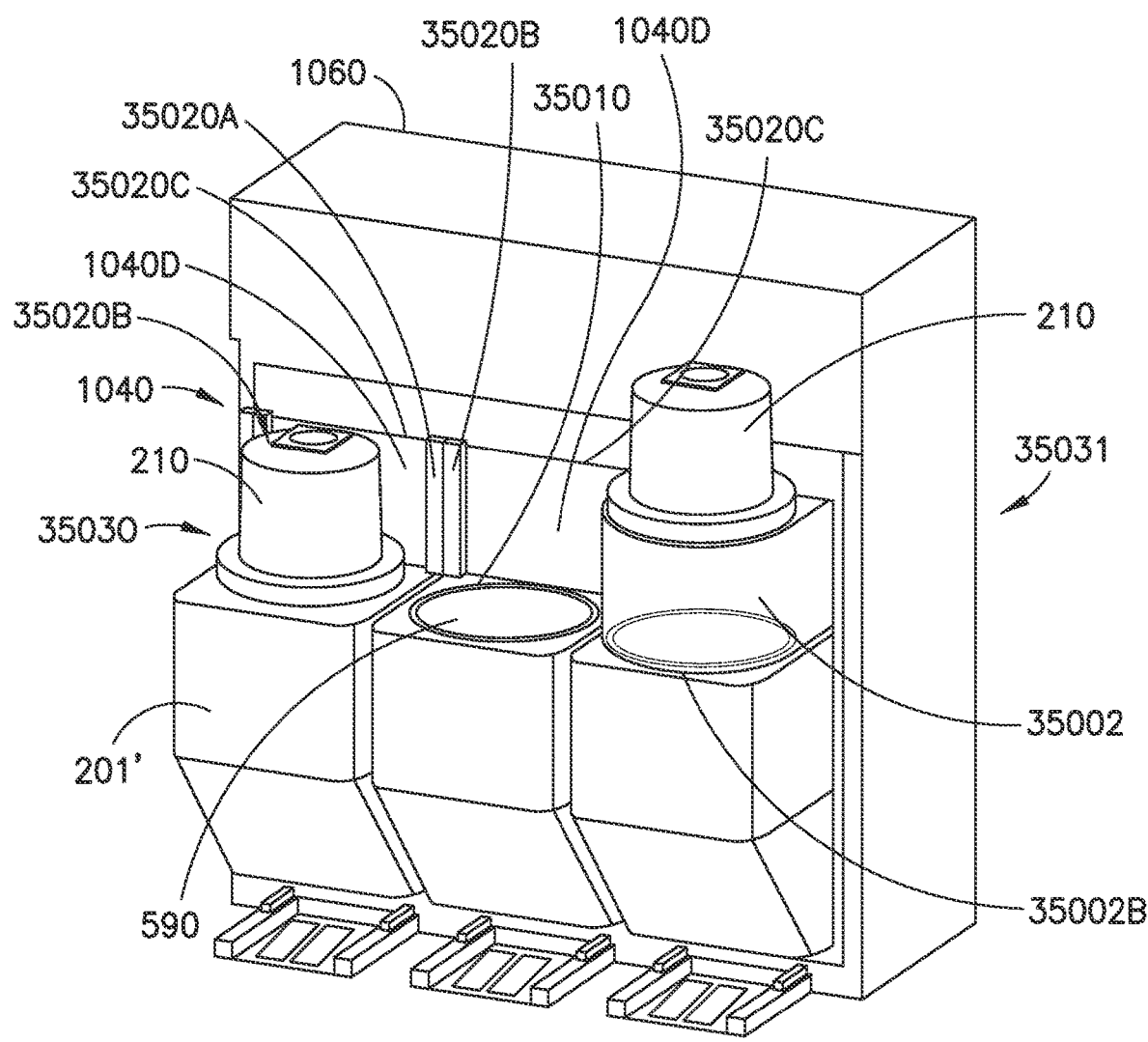
FIGS. 35A and 35B are schematic illustrations of portions of a processing tool in accordance with aspects of the disclosed embodiment.
Figure 35B:
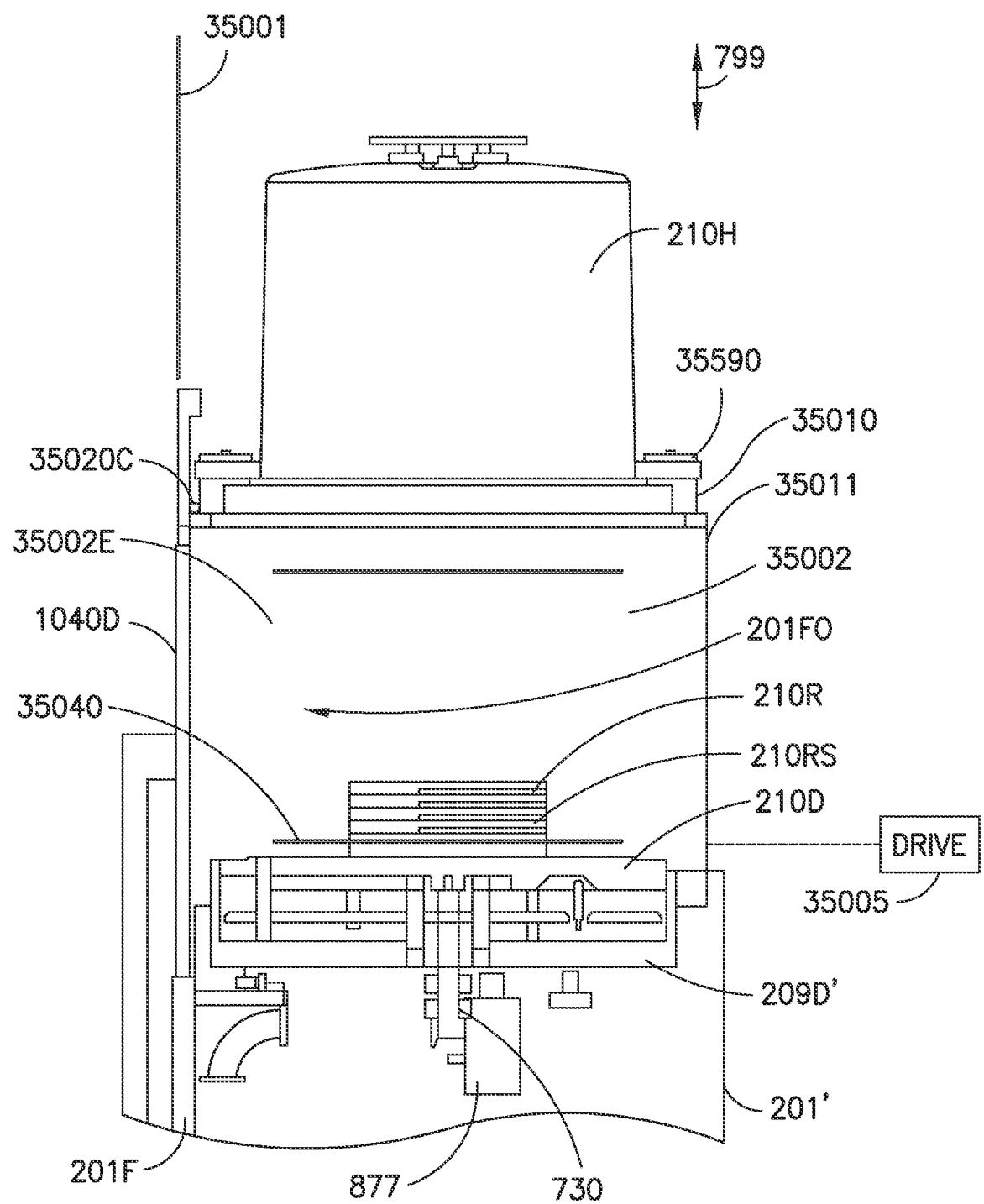

FIGS. 35A and 35B illustrate portions of a processing tool (which may be substantially similar to those described above) in accordance with aspects of the disclosed embodiments where the interface module 201' may include a pod (e.g. substrate carrier) to tool interface that is configured to selectably interface a bottom opening pod 210 substantially directly with a mini-environment 1060, load lock 203 and/or transfer chamber 202 having a box/opener to tool standard (BOLTS) interface 35001 for side opening pods (see also FIGS. 33 and 34). In one aspect the interface module 201' includes a frame 201F having at least one closable opening 201FO through which substrates pass and being configured for coupling to one or more of the minienvironment 1060 (e.g. atmospheric processing chamber) and vacuum processing chamber such as the load lock 203 (e.g. FIG. 31). In one aspect a door interface 209D' and elevator 730 which may be substantially similar to the port door 209D and elevator 730 described above may be connected to the frame 201F. The elevator 730 may move the door interface 209D' in the direction of arrow 799 by any suitable amount so that, for example, substrates in the rack 210R are aligned with a transfer plane of a substrate transport of the mini-environment 1060 and/or load lock 203 to which the interface module 201' is connected. In one aspect where a substrate transport robot of the mini-environment 1060 and/or load lock 203 includes a Z-axis drive for moving the robot arm in the direction of arrow 799 the elevator 730 may have a reduced stroke such as to effect separation of the pod door 210D from the pod housing 210H. In other aspects where a substrate transport robot of the mini-environment 1060 and/or load lock 203 does not include a Z-axis drive for moving the robot arm in the direction of arrow 799 the elevator 730 may have any suitable stroke such as to effect separation of the pod door 210D from the pod housing 210H and to index the substrate rack 210R of the pod 210 and place each substrate carried by the pod 210 along a transfer plane of the robot arm.

The interface module 201' may also include an environmental shroud 35002 that, in one aspect, is movable in the direction of arrow 799. The shroud 35002 may be driven in the direction of arrow 799 in any suitable manner and by any suitable drive between a retracted position 35030 and an extended position 35031. For example, drive 35005 (which may be substantially similar to elevator 730 and or substantially similar to that described in U.S. Pat. No. 5,788,458 issued on Aug. 4, 1998 and U.S. Pat. No. 6,082,949 issued on Jul. 4, 2000 the disclosures of which are incorporated by reference herein in their entireties) may be connected to the shroud 35002 for moving the shroud 35002 in the direction of arrow 799 between the retracted position 35030 and the extended position 35031. The drive 35005 may be a linear actuator, screw drive or any other suitable drive for moving the shroud 35002 as described herein. The shroud 35002 may include a pod housing interface 35010 and one or more side walls 35011. The pod housing interface 35010 may include any suitable port seal(s) 500 for sealing the pod housing 210H against the pod housing interface 35010. The pod housing interface 35010 may also include one or more clamps 35590 configured to clamp the pod housing 210H to the pod housing interface 35010. In one aspect the seal 590 and one or more clamps 35590 may be substantially similar to the seal and clamp described above with respect to, for example, FIGS. 5A-10. As may be realized the pod housing interface 35010 may include an aperture that circumscribes the door interface 209D' so that the pod door 210D interfaces with the door interface 209D' while the pod housing interface 35010 is coupled with the pod housing 210H via the seal 590 and clamp 35590. The pod housing interface 35010 may be coupled to and form a seal with the one or more side walls 35011 in any suitable manner. The one or more side walls 35011 may be sealed against the load port 1040 so that when the pod housing 201H is coupled to the pod housing interface 35010, the pod housing interface 35010 and one or more walls 35011 form a sealed or otherwise isolated controlled environment enclosure 35002E.

In one aspect any suitable seals may be provided between the one or more side walls 35002 and the load port 1040 and between the pod housing interface 35010 and the load port 1040 for sealing the shroud 35002 against the load port 1040. For example, when the shroud 35002 is moved in the direction of arrow 799 to form the isolated controlled environment enclosure 35002E, the side walls 35011 may interface in any suitable manner with seal members 35020A, 35020B of the load port 1040 BOLTS interface 35001. In one aspect the seal members 35020A, 35020B may be disposed on the BOLTS interface 35001 (or any other suitable location of the load port 1040) and/or on the side walls 35011. The seal members 35020A, 35020B may be any suitable seal members such as a labyrinth seal, bellows seal, or any other seal configured to hold a controlled or otherwise isolated vacuum and/or atmospheric environment 35002E between the shroud 35002 and the load port 1040. The pod housing interface 35010 may be configured to interface in any suitable manner with seal member 35020C of the load port 1040 BOLTS interface 35001. The seal member 35020C may extend between seal members 35020A, 35020B. In one aspect the seal members 35020A, 35020B, 35020C may be of unitary one piece construction while in other aspects one or more of the seal members 35020A, 35020B, 35020C may be an individual seal member that interfaces with the other seal members. It is noted that a bottom 35002B of the shroud 35002 may form any suitable seal with the interface module 201' so that in combination with the seal members 35020A, 35020B, 35020C the isolated controlled environment enclosure 35002E between the shroud 35002 and the load port 1040 is formed. The seal between the bottom of the shroud 35002 and the interface module 201' may be any suitable seal such as a bellows seal, compression seal, labyrinth seal or any other suitable seal. In one aspect the seal members 35020A, 35020B may be disposed on the BOLTS interface 35001 (or any other suitable location of the load port 1040) and/or on the side walls 35011. The seal members 35020A, 35020B may be any suitable seal members such as a labyrinth seal, bellows seal, or any other seal configured to hold a controlled or otherwise isolated vacuum and/or atmospheric environment between the shroud 35002 and the load port 1040.

Figure 36:
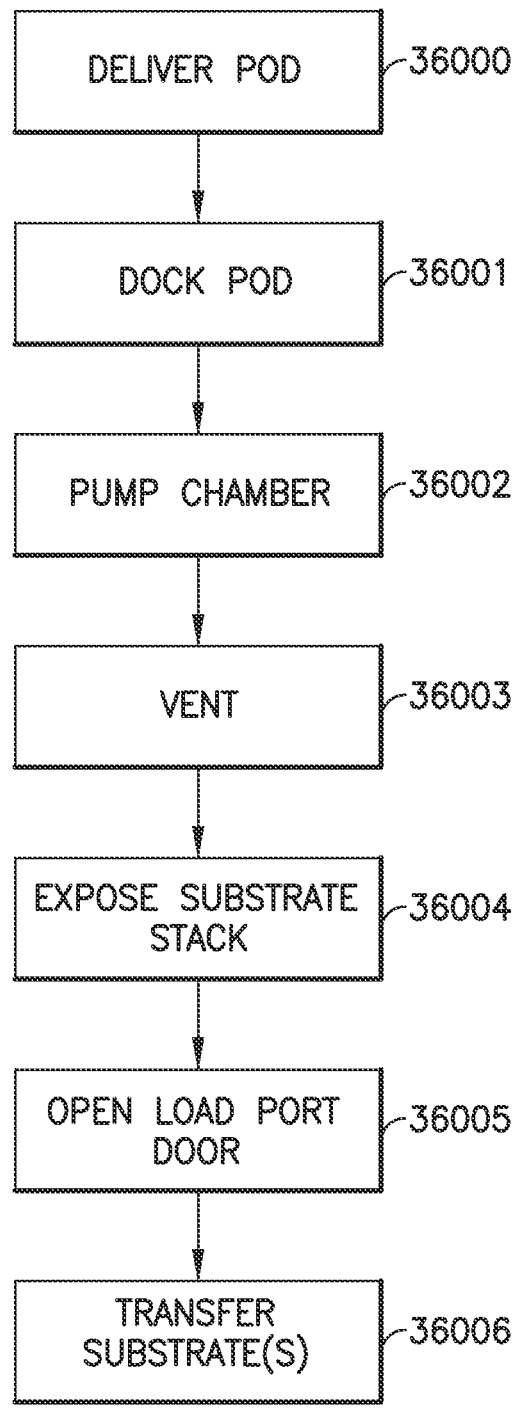
FIG. 36 is a flow chart in accordance with aspects of the disclosed embodiment.

In operation of the interface module 201' any suitable substrate pod 210 transport (such as any suitable overhead transport system, manual operator, etc.) may deliver a substrate pod 210 to the interface module 201' (FIG. 36, Block 36000). It should be understood that while the operation of the interface module 201' is described herein with respect to the mini-environment 1060 in other aspects the interaction between the interface module 201' and one or more of the load lock 203 and transfer chamber 202 may be substantially similar to that described herein for the mini-environment 1060. The substrate pod 210 may be docked with the interface module 201' (FIG. 36, Block 36001) so that, for example, the pod door 210D is mated with the door interface 209D' in any suitable manner, such as in a manner described above and so that the pod housing 210H forms a seal with the pod housing interface 35010 of the shroud 35002. In one aspect the substrate pod 210 may be delivered to the interface module 201' in a docked position while in other aspects the substrate pod 210 may be delivered to the interface module 201' in an undocked position. When the substrate pod is delivered in an undocked position the interface module 201' may include any suitable shuttle or transport unit for moving the substrate pod 210 from the undocked position to a docked position. The door interface 209D' may be substantially similar to port door 209D described above. Any space between the door interface 209D' and pod door 210D may be evacuated (in this aspect pumped down to a vacuum and/or vented) to, for example, remove contaminants (FIG. 36, Block 36002). The pod door 210D may be unlatched from the pod housing 210H in the manner described above and the drive 730 may move the pod door 210D and the stack of substrates thereon to separate the pod door 210D from the pod housing 210H and to pace a predetermined substrate in the stack of substrates at a predetermined position/elevation 35040.

The interior volume of the pod 210 and/or the space between the pod door 210D and door interface 209D' may be evacuated (e.g. in this aspect purged) with any suitable gas (e.g. such as nitrogen or other inert gas) so that a pressure within the interior volume of the pod 210 and/or the space between the pod door and port door is at an atmospheric pressure substantially equal to or greater than a pressure within the mini-environment 1060 (FIG. 36, Block 36003). In one aspect the substrate pod 201 may be delivered to the interface module 201' in a vacuum condition (e.g. the interior volume of the pod is held at a vacuum pressure) and brought up to an atmospheric pressure in the manner described above for interfacing with the mini-environment 1060. In other aspects the substrate pod 201 may be delivered to the interface module 201' in an atmospheric condition (e.g. the interior volume of the pod is held at atmospheric pressure) and purged with, e.g., an inert gas in the manner described above for interfacing with the mini-environment 1060. In yet other aspects, where the interface module is coupled to a chamber configured to hold a vacuum such as the load lock 203 and transfer chamber 202 a vacuum within the pod 210 may be maintained by the interface module 201' so that a vacuum environment of the load lock 203 and/or transfer chamber 202 is shared with the pod 210 and/or the isolated controlled environment enclosure 35002E.

The drive 35005 may move the shroud 35002 in the direction of arrow 799 so that the pod housing 210H is moved away from the pod door 210D as shown in FIG. 35B so that the stack of substrates on the rack 210R are exposed or otherwise accessible by any suitable substrate transport of the mini-environment (FIG. 36, Block 36004). In one aspect the pod housing 210H may be lifted by the shroud 35002 in a manner substantially similar to that described in U.S. Pat. No. 5,788,458 issued on Aug. 4, 1998 and U.S. Pat. No. 6,082,949 issued on Jul. 4, 2000 the disclosures of which are incorporated by reference herein in their entireties. In other aspects the shroud 35002 may be substantially stationary and positioned so as to provide the isolated controlled environment enclosure 35002E around the load port 1040. The substrate pod 210 may be delivered to the pod housing interface 35010 of the substantially stationary shroud 35002 (where the aperture in the pod housing interface is sealed by the port plate 209' in a manner substantially similar to that described above with respect to interface module 201). It is noted that the drive 730 may include any suitable stroke so that the stack of substrates in the rack 210R may be lowered from the pod housing interface 35010 of the substantially stationary shroud 35002 for placing a predetermined substrate or substrate support 210RS substantially along a transfer plane of the mini-environment in a manner similar to that described below.

The load port door 1040D may be opened in any suitable manner so that the interior of the isolated controlled environment enclosure formed at least in part by the shroud 35002 is in communication with the interior of the mini-environment 1060 (FIG. 36, Block 36005) through the opening 201FO. The drive 730 may move the rack 210R in the direction of arrow 799 so that a predetermined substrate (or substrate holding support 210RS) is placed along a transfer plane of the mini-environment 1060 substrate transport (which may be substantially similar to transfer robot 1013 described above) for transfer of the predetermined substrate to and/or from the mini-environment 1060 (FIG. 36, Block 36006). In other aspects the substrate transport of the mini-environment may include a Z-axis drive so that a transfer plane of the mini-environment may move in the direction of arrow 799 for removing or placing substrates from/to the rack 210R while the rack 210R remains substantially stationary in the direction of arrow 799.

As may be realized, transfer of the substrate pod 210 from the interface module 210' may occur in a manner substantially opposite to that described above with respect to FIG. 36. In one aspect the interface module 210' may include one or more vacuum pumps and/or roughing valves, such as described above, configured to pump the internal volume of the substrate pod 210 to any suitable vacuum pressure before the substrate pod 210 is removed from the interface module 201'.

As may be realized, while one or more interface modules 201' is/are illustrated on a common side of the mini-environment, in other aspects the interface module 201' may be placed on any suitable side of the mini-environment (as described above) such as to a BOLTS interface 35001 or any other suitable interface of the mini-environment 1060. As may also be realized, the interface module 201' may provide one or more of a vacuum to atmosphere interface, an atmosphere to vacuum interface or both depending on, for example, upstream and downstream substrate process flow requirements. For example, in one aspect one or more interface modules 201' may be located within a fabrication facility 37000 as shown in FIG. 37. The fabrication facility may be substantially similar to that described in, for example, U.S. Pat. No. 8,272,827 issued on Sep. 25, 2012 the disclosure of which is incorporated herein by reference in its entirety. In one aspect the fabrication facility includes processing modules PTC, PTC1, PTC2, PTB1, PTB2, PTA1, PTA2 and any suitable transport 37001 for transporting pods 210 to and from the interface modules 201'. As may be realized some of the processing modules PTC, PTC1, PTC2, PTB1, PTB2, PTA1, PTA2 may be atmospheric processing modules while other ones of the processing modules PTC, PTC1, PTC2, PTB1, PTB2, PTA1, PTA2 may be vacuum processing modules. In this aspect the transport 37001 is an overhead transport system including overhead pod storage 37001S but in other aspects the transport 37001 may be any suitable transport. In one aspect one interface module 201' may be connected to an atmospheric processing station PTC1 (such as at an EFEM or other atmospheric chamber) positioned in the process flow between an atmospheric processing station PTC and a vacuum processing station PTC2. The interface module 201' at processing station PTC1 may be configured to interface the substrate pod 210 to the atmospheric process and then pump the substrate pod 210 to a vacuum for interfacing with the vacuum process of processing module PCT2 (e.g. where a load lock operation may be omitted as the substrate pod 210 is already at a vacuum atmosphere so that the pod 210 may interface substantially directly with the vacuum environment in a manner substantially similar to that described in U.S. patent application Ser. No. 12/123,391 entitled "Side Opening Unified Pod" and filed on May 19, 2008). The interface module 201' at processing station PTC2 may be upstream of atmospheric processing module PTB1 such that the pod 210 may be delivered to processing station PTB1 with the interior of the pod at a vacuum where the interface module 201' of processing station PTB1 evacuates the pod 210 for interfacing with an atmospheric environment of processing station PTB1. In other aspects the interface module at processing station PTC2 may evacuate the pod 210 so that the interior of the pod 210 is at an atmospheric pressure for delivery to the atmospheric processing station PTB1.

Figure 38A:
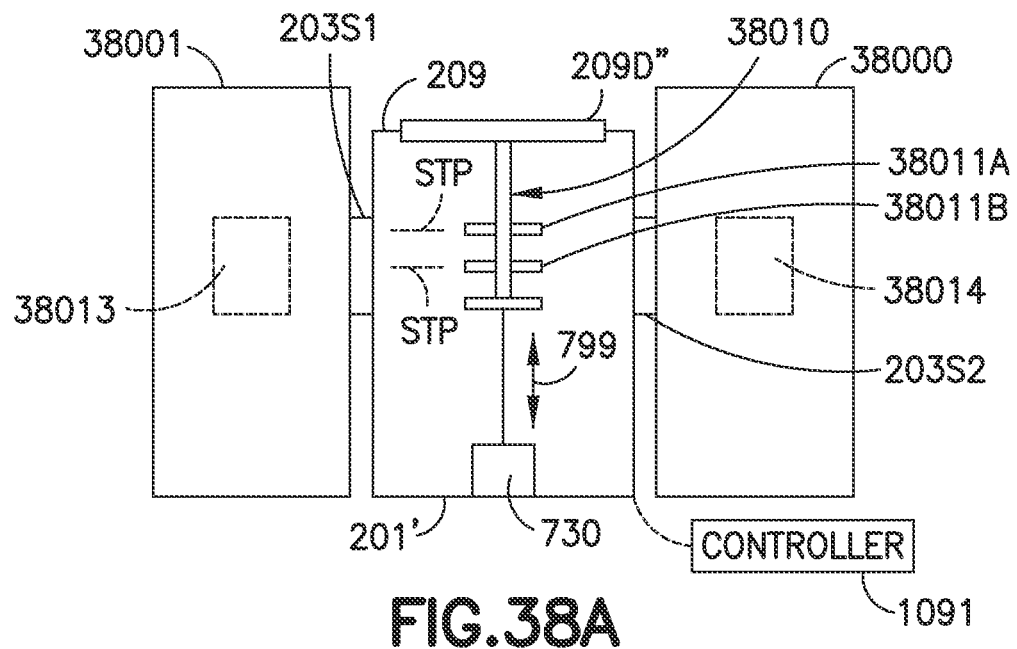
FIGS. 38A and 38B are schematic illustrations of a portion of a processing too in accordance with aspects of the disclosed embodiment.

Referring now to FIG. 38A the interface module 201' may be configured as a pass-through load lock or chamber that allows one or more substrates to pass through the interface module 201' into one processing chamber 38000, such as a vacuum processing chamber or an atmospheric processing chamber from another chamber 38001, such as another vacuum processing module or another atmospheric processing chamber. In one aspect the processing chamber 38001 may be an atmospheric processing chamber such as the mini-environment 1060 described above and the processing chamber 38000 may be a vacuum processing chamber substantially similar to one or more of back end 1020, transfer chamber 1025 and processing stations 1030 or any other suitable vacuum processing chamber (or vice versa). In other aspects both processing chambers 38000, 38001 may be atmospheric processing chambers such as mini-environment 1060. In still other aspects both processing chambers 38000, 38001 may be vacuum processing chambers such as one or more of back end 1020, transfer chamber 1025 and processing stations 1030 or any other suitable vacuum processing chamber.

As an example of a pass through load lock or chamber, the interface module 201' may be sealed such that the interface module door 209D" seals the opening in the port plate 209

Figure 39:
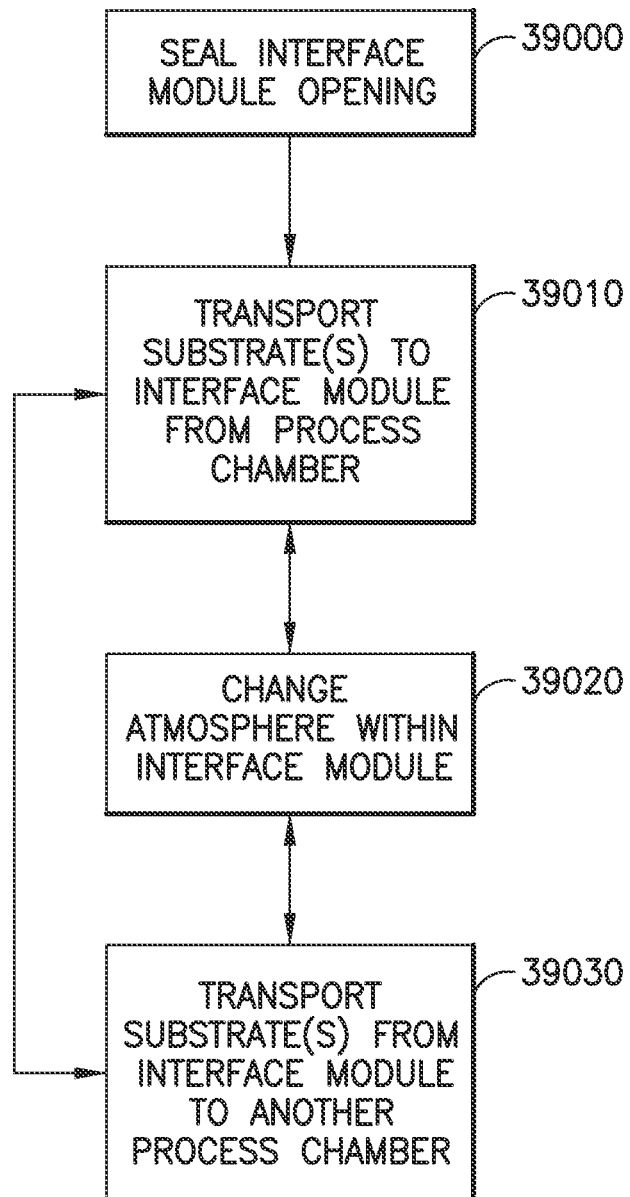
FIGS. 39 and 40 are flow diagrams in accordance with aspects of the disclosed embodiment.

(FIG. 39, Block 39000). A rack 38010 having one or more substrate holding locations 38011A, 38011B may be connected to or otherwise depend from the interface module door 209D" so that the one or more substrate holding locations 38011A, 38011B are position along one or more substrate transfer planes STP extending between the processing chamber 38001 and the processing chamber 38000. A substrate may be transferred through sealable opening 203S1 to a substrate holding location 38011A, 38011B within the interface module 201' from the processing chamber 38001 by transfer robot 38013 (e.g. with sealable opening 203S2 closed) (FIG. 39, Block 39010). The transfer robot may be substantially similar to one or more robotic transport described herein depending on the atmosphere (e.g. atmospheric or vacuum) within the processing chamber 38001. Where processing chamber 38001 is an atmospheric processing chamber and processing chamber 38001 is a vacuum processing chamber the sealable opening 203S1 may be closed and the interface module 201' may be pumped to a vacuum atmosphere of the processing chamber 38000 (FIG. 39, Block 39020). Where processing chamber 38001 and processing chamber 38001 have the same environment (e.g. both processing chambers have an atmospheric environment or both processing chambers have a vacuum environment) the sealable opening 203S1 may be closed and the pumping of the chamber may be omitted where the interface module is already at the vacuum or atmospheric pressure of the processing chambers 38000, 38001. The sealable opening 203S2 may be opened and a transfer robot 38014 (which may be substantially similar to the vacuum and atmospheric transfer robots described herein depending on an environment of the processing chamber 38000) of the processing chamber 38000 may transport the substrate from the interface module 201' to the processing chamber 38000 (FIG. 39, Block 39030). Transfer of the substrate from processing chamber 38000 to processing chamber 38001 may occur in a manner substantially opposite to that described above where the pumping down of interface module 201' to vacuum is placed with venting the interface module 201' to bring the interface module 201' to an atmospheric pressure of the processing module 38001. Again, as noted above, where processing chambers 38000, 38001 both have an atmospheric environment or a vacuum environment the venting of the interface module 201' may be omitted.

Figure 38B:
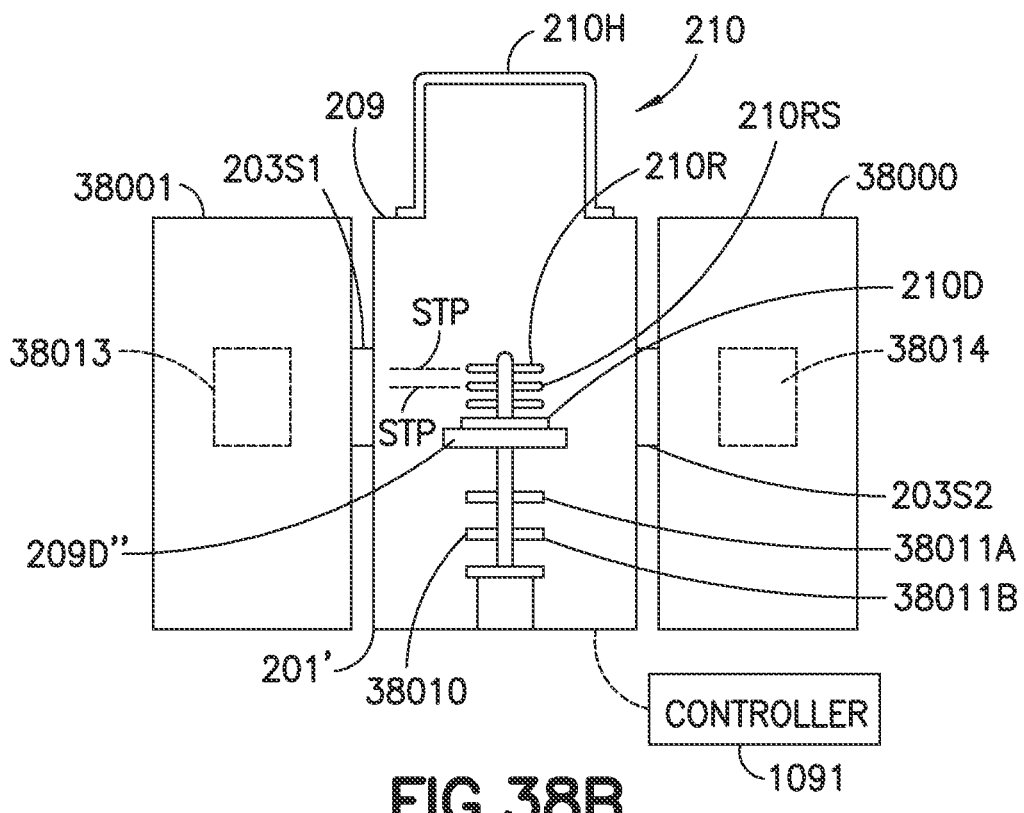
Figure 40:
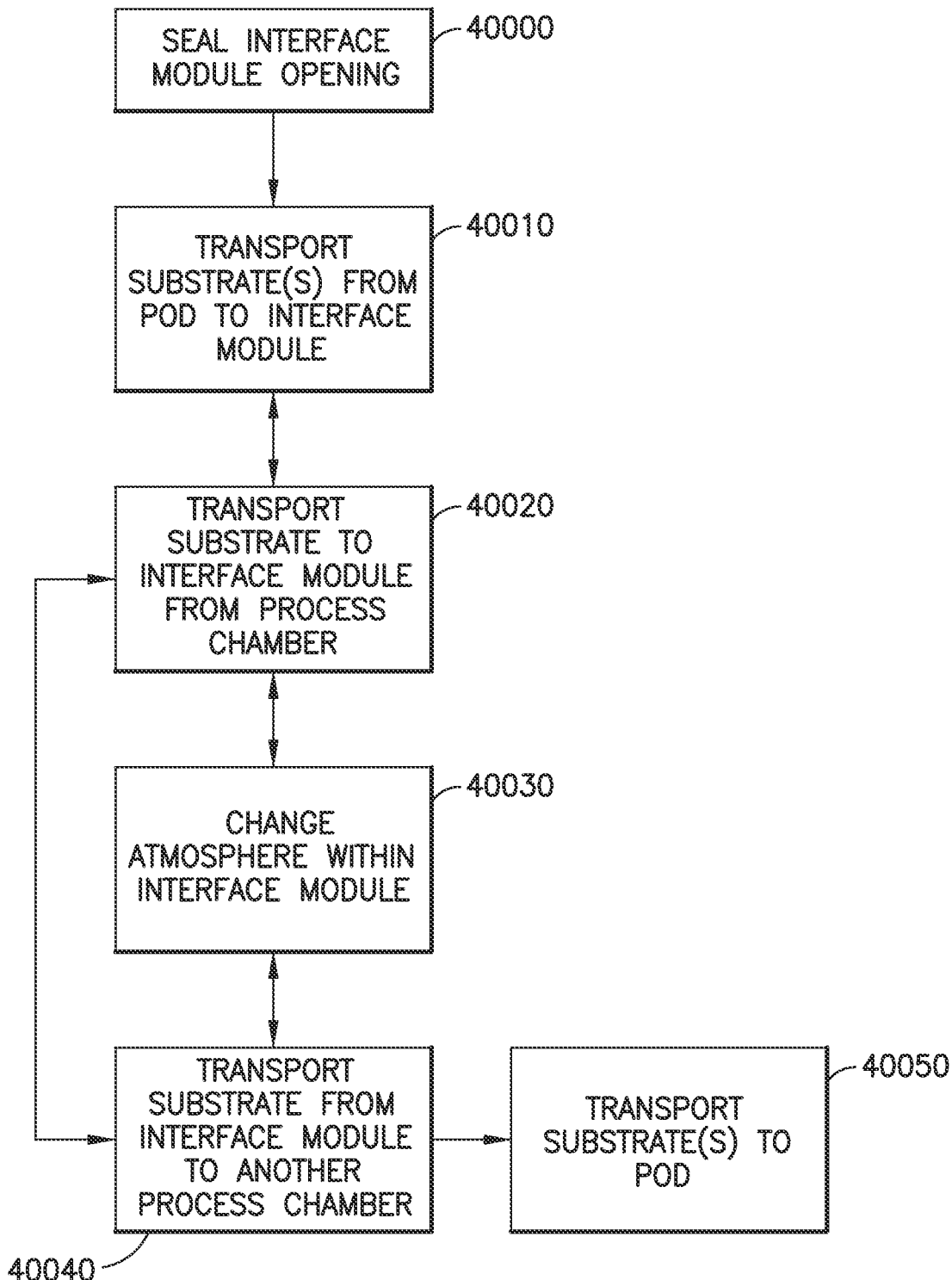

As can be seen above, the transfer of the substrate from the processing chamber 38001 to the processing chamber 38000 is performed without the pod 210 engaged to the interface module 201'. Referring to FIG. 38B, in other aspects the pass-through load lock may be effected with the pod 210 engaged with the interface module 201'. For example, the pod 210 may be loaded on the interface module 201' in a manner similar to that described above such that the pod housing 210H seals the interface module port plate 209 opening (FIG. 40, Block 40000). The interface module door 209D" may remove the pod door 210D from the pod housing 210H and lower the pod door 210D so that at least one of the substrate holding supports 210RS of the rack 210R are positioned along at least one substrate transfer plane STP (FIG. 40, Block 40010. As may be realized, one or more of the substrate holding supports 210RS may be empty so that a substrate may be transported through the sealable opening 203S1 from the processing module 38001 and to the empty substrate support (FIG. 40, Block 40020). Where processing chamber 38001 is an atmospheric processing chamber and processing chamber 38001 is a vacuum processing chamber the sealable opening 203S1 may be closed and the interface module 201' may be pumped to a vacuum atmosphere of the processing chamber 38000 (FIG. 40, Block 40030). Where processing chamber 38001 and processing chamber 38001 have the same environment (e.g. both processing chambers have an atmospheric environment or both processing chambers have a vacuum environment) the sealable opening 203S1 may be closed and the pumping of the chamber may be omitted where the interface module is already at the vacuum or atmospheric pressure of the processing chambers 38000, 38001. The sealable opening 203S2 may be opened and a transfer robot 38014 of the processing chamber 38000 may transport the substrate from the interface module 201' to the processing chamber 38000 (FIG. 40, Block 40040). Transfer of the substrate from processing chamber 38000 to processing chamber 38001 may occur in a manner substantially opposite to that described above where the pumping down of interface module 201' to vacuum is replaced with venting the interface module 201' to bring the interface module 201' to an atmospheric pressure of the processing module 38001. Again, as noted above, where processing chambers 38000, 38001 both have an atmospheric environment or a vacuum environment the venting of the interface module 201' may be omitted. In other aspects, the substrate may be returned from processing chamber 38000 to the pod 210 (FIG. 40, Block 40050). For example, the substrate may be transferred from an atmospheric environment of processing chamber 38001 to a vacuum environment of processing chamber 38000 as described above. The substrate may then be transferred from the vacuum environment of the processing chamber 38000 to a substrate holding support 210RS of the pod positioned in a vacuum environment of the interface module 201'. In one aspect the pod door may be closed (e.g. with an interior of the pod 210 at vacuum) so that substrate can be transferred within the pod under vacuum conditions.

In accordance with one or more aspects of the disclosed embodiment a substrate transport system includes a carrier having a housing forming an interior environment having an opening for holding at least one substrate and a door for sealing the opening from an outside atmosphere where when sealed the interior environment is configured to maintain an interior atmosphere therein, the housing including a fluid reservoir exterior to the interior environment and configured to contain a fluid, forming a different atmosphere in the fluid reservoir than the interior atmosphere, to form a fluidic barrier seal that seals the interior environment from an environment exterior to the carrier.

In accordance with one or more aspects of the disclosed embodiment the fluid reservoir is configured to release fluid into the interior environment upon a breach of the first environment.

In accordance with one or more aspects of the disclosed embodiment the substrate transport system includes a vacuum chamber having a carrier interface, the carrier interface being configured to support the carrier for transport of the at least one substrate in the vacuum chamber.

In accordance with one or more aspects of the disclosed embodiment at least one of the housing and door includes a redundant seal arrangement, the redundant seal arrangement including at least one vacuum seal disposed around a periphery of the opening and at least one fluid reservoir seal.

In accordance with one or more aspects of the disclosed embodiment the fluid reservoir contains a gas at a pressure higher than the pressure of the interior atmosphere.

In accordance with one or more aspects of the disclosed embodiment the fluid reservoir contains a gas at a pressure higher than atmospheric pressure.

In accordance with one or more aspects of the disclosed embodiment the interior atmosphere is at a pressure less than atmospheric pressure.

In accordance with one or more aspects of the disclosed embodiment the housing of the carrier is configured to support a vacuum interior environment.

In accordance with one or more aspects of the disclosed embodiment the at least one vacuum seal of the redundant seal arrangement includes a first seal located in a first plane and a second seal located in a second plane where the first and second planes are distinct from one another.

In accordance with one or more aspects of the disclosed embodiment each of the seals of the redundant seal arrangement mate with a recessed sealing surface in at least one of the housing and door.

In accordance with one or more aspects of the disclosed embodiment the housing includes a fluid reservoir channel in communication with the fluid reservoir such that the fluidic barrier seal is disposed outward of the at least one vacuum seal and at least one fluid reservoir seal is disposed around a periphery of the fluid reservoir channel.

In accordance with one or more aspects of the disclosed embodiment the fluid reservoir is configured to release a fluid through the fluid reservoir channel into the interior environment upon a breach of the at least one vacuum seal.

In accordance with one or more aspects of the disclosed embodiment the door is sealed to the housing from a vacuum force of the interior environment.

In accordance with one or more aspects of the disclosed embodiment the door is released through a dynamic pressure equalization between the interior environment and the vacuum chamber.

In accordance with one or more aspects of the disclosed embodiment the carrier interface includes a redundant seal arrangement including a first seal located in a first plane and a second seal located in a second plane where the first and second planes are substantially orthogonal to each other.

In accordance with one or more aspects of the disclosed embodiment the substrate transport includes a passive door lock configured to retain the door to the housing upon loss of the vacuum force.

In accordance with one or more aspects of the disclosed embodiment the passive door lock comprises a ball lock detent and a ball lock plunger.

In accordance with one or more aspects of the disclosed embodiment the substrate transport system includes a passive door lock holding the door to the housing, where the carrier interface is configured to release the passive door lock.

In accordance with one or more aspects of the disclosed embodiment the vacuum chamber includes at least one sealable opening for coupling the vacuum chamber to at least one substrate processing module.

In accordance with one or more aspects of the disclosed embodiment the carrier interface includes a purge port configured to purge at least one of a space between the door and the carrier interface and a seal between the door and the housing.

In accordance with one or more aspects of the disclosed embodiment the carrier interface is a passive interface.

In accordance with one or more aspects of the disclosed embodiment a substrate transport includes a housing forming an interior environment for housing at least one substrate in a first atmosphere, the housing including an opening to the interior environment and a fluid reservoir forming a fluidic barrier seal with a second atmosphere different from and external to the first atmosphere, a door configured to close the opening, where when the opening is closed the housing is configured to maintain the first atmosphere within the interior environment and a redundant seal arrangement disposed on at least one of the housing and the door, the redundant seal arrangement including at least a first seal disposed around a periphery of the opening and at least a second seal where the second seal is disposed between the first seal and the fluidic barrier seal.

In accordance with one or more aspects of the disclosed embodiment the housing includes a fluid reservoir channel in communication with the fluid reservoir and disposed outward of the first seal, the substrate transport further including a fluid reservoir seal outwardly disposed around a periphery of the fluid reservoir channel.

In accordance with one or more aspects of the disclosed embodiment the fluid reservoir is configured to release a fluid through the fluid reservoir channel into the interior environment upon a breach of one or more of the first and second seals.

In accordance with one or more aspects of the disclosed embodiment the door is sealed to the housing from a vacuum force of the interior environment.

In accordance with one or more aspects of the disclosed embodiment the substrate transport includes a passive door lock configured to retain the door to the housing upon loss of the vacuum force.

In accordance with one or more aspects of the disclosed embodiment the passive door lock comprises a ball lock detent and a ball lock plunger.

In accordance with one or more aspects of the disclosed embodiment the passive door lock is configured to be passively released.

In accordance with one or more aspects of the disclosed embodiment the door is configured to support the at least one substrate.

In accordance with one or more aspects of the disclosed embodiment a substrate transport includes a housing having an interior environment configured to hold at least one substrate in a first atmosphere, the first atmosphere being common to a substrate processing atmosphere, a door for sealing the interior environment, and a fluidic barrier seal between the door and the housing, the fluidic barrier seal having a second atmosphere different from and isolated from the first atmosphere where an outer seal isolates the fluidic barrier seal from an external atmosphere outside the housing and an inner seal isolates the fluidic barrier seal from the first atmosphere so that a void exists between the fluidic barrier seal and the first atmosphere.

In accordance with one or more aspects of the disclosed embodiment an intermediate seal is provided to isolate the fluidic barrier seal from the inner seal.

In accordance with one or more aspects of the disclosed embodiment the fluidic barrier seal includes a fluid reservoir distinct from the interior environment and connected to the housing and a fluid channel.

In accordance with one or more aspects of the disclosed embodiment the fluid channel connects the fluid reservoir to an interface between the housing and the door.

In accordance with one or more aspects of the disclosed embodiment the fluidic barrier seal is a pressurized seal disposed between the external atmosphere and the first atmosphere.

In accordance with one or more aspects of the disclosed embodiment a processing system includes substrate processing tool, a controlled environment carrier having an interior environment and a fluidic barrier seal having a different atmosphere than the interior environment, and a controlled environment interface module configured to couple the controlled environment carrier with the substrate processing tool where a passage formed through the coupling of the controlled environment carrier to the process tool through the controlled environment interface module forms a clean tunnel.

In accordance with one or more aspects of the disclosed embodiment a gap formed between a port door of the controlled environment interface module and a bottom surface of the controlled environment carrier can direct a clean dry air flow across seals between the port door and bottom surface.

In accordance with one or more aspects of the disclosed embodiment the controlled environment interface module defines a mid-entry or intermediate entry to the clean tunnel.

In accordance with one or more aspects of the disclosed embodiment the controlled environment interface module is located between ends of the clean tunnel.

In accordance with one or more aspects of the disclosed embodiment the controlled environment interface module includes a rotatable port door that is movable into an interior volume of the controlled environment interface module where rotation of the port door allows controlled environment carrier automation to load the controlled environment carrier at an orientation other than a required wafer stack orientation.

In accordance with one or more aspects of the disclosed embodiment the controlled environment interface module comprises a pass through load lock.

In accordance with one or more aspects of the disclosed embodiment an interior atmosphere of the controlled environment carrier, when the controlled environment carrier is open, communicates with an interior atmosphere of the pass through load lock.

In accordance with one or more aspects of the disclosed embodiment the controlled environment interface module is a pass through module that includes a port door having integral substrate supports.

In accordance with one or more aspects of the disclosed embodiment the integral substrate supports move as a unit with the port door.

In accordance with one or more aspects of the disclosed embodiment the interior environment and an environment of the process tool are a common environment that extends through the controlled environment interface module.

In accordance with one or more aspects of the disclosed embodiment the fluidic barrier seal is a pressurized seal with respect to the atmosphere of the internal environment.

In accordance with one or more aspects of the disclosed embodiment the controlled environment carrier includes a housing for holding the interior environment and a door for sealingly closing the housing, the fluidic barrier seal includes a passage formed at an interface between the housing and the door when the door is closed.

In accordance with one or more aspects of the disclosed embodiment an interface between the controlled environment carrier and the controlled environment interface module includes a fluid port for charging a fluid of the fluidic barrier seal independent from the atmosphere of the interior environment.

In accordance with one or more aspects of the disclosed embodiment an interface between the controlled environment carrier and the controlled environment interface module includes a fluid port for evacuating a fluid from the fluidic barrier seal independent from the atmosphere of the interior environment.

In accordance with one or more aspects of the disclosed embodiment the fluid port is configured to automatically evacuate the fluid from the fluidic barrier seal before and/or separate from a pumping down to a vacuum atmosphere of one or more of the controlled environment carrier and controlled environment interface module.

In accordance with one or more aspects of the disclosed embodiment, the substrate processing tool includes a central transfer chamber and process modules communicably coupled to one or more sides of the central transfer chamber, the controlled environment interface module being connected to the central transfer chamber.

In accordance with one or more aspects of the disclosed embodiment the central transfer chamber includes at least one transfer robot for transferring one or more substrates between the controlled environment interface module and the process modules.

In accordance with one or more aspects of the disclosed embodiment the central transfer chamber has polygonal shape.

In accordance with one or more aspects of the disclosed embodiment the central transfer chamber includes a plurality of transfer chambers coupled to each other.

In accordance with one or more aspects of the disclosed embodiment the plurality of transfer chambers are coupled to each other at least by the controlled environment interface module.

In accordance with one or more aspects of the disclosed embodiment the plurality of transfer chambers are coupled to each other through a linear transport tunnel.

In accordance with one or more aspects of the disclosed embodiment the controlled environment interface module is disposed at one or more ends of the linear transport tunnel.

In accordance with one or more aspects of the disclosed embodiment the substrate processing tool includes an automated handling system for transferring the controlled environment carrier to the controlled environment interface module.

In accordance with one or more aspects of the disclosed embodiment the process tool includes an equipment front end unit distinct from the controlled environment interface module.

In accordance with one or more aspects of the disclosed embodiment a method for sealing a substrate carrier is provided. The method includes providing a substrate carrier housing having an internal environment and a door for closing the internal environment, providing a fluidic barrier seal at an interface between the housing and the door where the fluidic barrier seal extends around a periphery of the door and has a different atmosphere than the internal environment.

In accordance with one or more aspects of the disclosed embodiment the method further includes providing a first seal disposed at the interface between the internal environment and the fluidic barrier seal and providing a second seal disposed at the interface between the fluidic barrier seal and an atmosphere external to the housing.

In accordance with one or more aspects of the disclosed embodiment the method further includes providing an intermediate seal disposed between the first seal and the fluidic barrier seal.

In accordance with one or more aspects of the disclosed embodiment a substrate loader module includes a substrate carrier to processing tool interface module having at least one closable opening through which substrates pass and being configured for coupling to one or more of a vacuum environment of a processing tool and an atmospheric environment of the processing tool. The substrate carrier to processing tool interface module including a vacuum interface configured to allow opening of an internal environment of a substrate carrier to the vacuum environment of a processing tool, and an atmospheric interface configured to allow opening of the internal environment of the substrate carrier to the atmospheric environment of the processing tool.

In accordance with one or more aspects of the disclosed embodiment the substrate carrier to processing tool interface module is configured to evacuate or charge a substrate carrier fluidic barrier seal located between a door of the substrate carrier and a housing of the substrate carrier.

In accordance with one or more aspects of the disclosed embodiment the substrate carrier to processing tool interface module is configured to evacuate or charge an internal environment of the substrate carrier.

In accordance with one or more aspects of the disclosed embodiment the substrate carrier to processing tool interface module includes a Z-axis drive for moving at least a portion of the substrate carrier in a direction transverse to a transfer plane of a substrate into and out of the substrate carrier.

In accordance with one or more aspects of the disclosed embodiment the substrate carrier to processing tool interface module is configured to separate a shell of the substrate carrier from a door of the substrate carrier to expose substrate racks connected to the door.

In accordance with one or more aspects of the disclosed embodiment the substrate carrier to processing tool interface module is configured for coupling to a load lock of a substrate processing tool.

In accordance with one or more aspects of the disclosed embodiment the substrate carrier to processing tool interface module is configured for coupling to a minienvironment of a substrate processing tool.

In accordance with one or more aspects of the disclosed embodiment a substrate processing tool includes an atmospheric processing chamber having an atmospheric environment therein, a vacuum processing chamber having a vacuum environment therein and being connected to the atmospheric processing chamber, and a substrate carrier to processing tool interface module having at least one closable opening through which substrates pass and being configured for coupling to one or more of the atmospheric processing chamber and vacuum processing chamber. The substrate carrier to processing tool interface module including a vacuum interface configured to allow opening of an internal environment of a substrate carrier to the vacuum environment of the vacuum processing chamber, and an atmospheric interface configured to allow opening of the internal environment of the substrate carrier to the atmospheric environment of the atmospheric processing chamber.

In accordance with one or more aspects of the disclosed embodiment the vacuum processing chamber comprises a load lock wherein the substrate carrier to processing tool interface module is connected to the load lock.

In accordance with one or more aspects of the disclosed embodiment the atmospheric processing chamber comprises a mini-environment wherein the substrate carrier to processing tool interface module is connected to the mini-environment.

In accordance with one or more aspects of the disclosed embodiment the vacuum processing chamber comprises a load lock and the atmospheric processing chamber comprises a mini-environment where the substrate carrier to processing tool interface module is connected to both the load lock and the mini-environment.

In accordance with one or more aspects of the disclosed embodiment the substrate carrier to processing tool interface module is configured to evacuate or charge a substrate carrier fluidic barrier seal located between a door of the substrate carrier and a housing of the substrate carrier.

In accordance with one or more aspects of the disclosed embodiment the substrate carrier to processing tool interface module is configured to evacuate or charge an internal environment of the substrate carrier.

In accordance with one or more aspects of the disclosed embodiment the substrate carrier to processing tool interface module is configured to form a pass-through load lock connected to the vacuum processing chamber and the atmospheric processing chamber, the substrate carrier to processing tool interface module having substrate support shelves disposed underneath one of the at least one closable opening.

In accordance with one or more aspects of the disclosed embodiment the substrate carrier to processing tool interface module is configured so that a substrate is transported through the pass through load lock into the vacuum processing chamber from the atmospheric processing chamber and for substrate exit into a vacuum environment of a substrate carrier coupled to the substrate carrier to processing tool interface module.

In accordance with one or more aspects of the disclosed embodiment the atmospheric processing chamber is an equipment front end module having a back connected to the vacuum processing chamber, a BOLTS interface opposite the back and sides extending between the BOLTS interface and the back, the substrate carrier to processing tool interface module being coupled to one of the back, sides and BOLTS interface.

It should be understood that the foregoing description is only illustrative of the aspects of the disclosed embodiment. Various alternatives and modifications can be devised by those skilled in the art without departing from the aspects of the disclosed embodiment. Accordingly, the aspects of the disclosed embodiment are intended to embrace all such alternatives, modifications and variances that fall within the scope of the appended claims. Further, the mere fact that different features are recited in mutually different dependent or independent claims does not indicate that a combination of these features cannot be advantageously used, such a combination remaining within the scope of the aspects of the invention.

What is claimed is:
1. A substrate processing tool comprising:
an atmospheric processing chamber having an atmospheric environment therein;
a load lock chamber having a vacuum environment therein and being connected to the atmospheric processing chamber; and
a substrate carrier to processing tool interface module having at least one closable opening through which substrates pass and being configured for coupling to one or more of the atmospheric processing chamber and load lock chamber, the substrate carrier to processing tool interface module including
a vacuum interface with a configuration that opens an internal environment of a substrate carrier to the vacuum environment of the load lock chamber, and
an atmospheric interface, different than the vacuum interface, with a configuration that opens the internal environment of the substrate carrier to the atmospheric environment of the atmospheric processing chamber.

2. The substrate processing tool of claim 1, wherein the substrate carrier to processing tool interface module is connected to the load lock.

3. The substrate processing tool of claim 1, wherein the atmospheric processing chamber comprises a mini-environment wherein the substrate carrier to processing tool interface module is connected to the mini-environment.

4. The substrate processing tool of claim 1, wherein the atmospheric processing chamber comprises a mini-environment where the substrate carrier to processing tool interface module is connected to both the load lock and the mini-environment.

5. The substrate processing tool of claim 1, wherein the substrate carrier to processing tool interface module is configured to evacuate or charge a substrate carrier fluidic barrier seal located between a door of the substrate carrier and a housing of the substrate carrier.

6. The substrate processing tool of claim 1, wherein the substrate carrier to processing tool interface module is configured to evacuate or charge an internal environment of the substrate carrier.

7. The substrate processing tool of claim 1, wherein the substrate carrier to processing tool interface module is configured to form a pass-through load lock connected to the load lock chamber and the atmospheric processing chamber, the substrate carrier to processing tool interface module having substrate support shelves disposed underneath one of the at least one closable opening.

8. The substrate processing tool of claim 7, wherein the substrate carrier to processing tool interface module is configured so that a substrate is transported through the pass-through load lock into the load lock chamber from the atmospheric processing chamber and for substrate exit into a vacuum environment of a substrate carrier coupled to the substrate carrier to processing tool interface module.

9. The substrate processing tool of claim 1, wherein the atmospheric processing chamber is an equipment front end module having a back connected to the load lock chamber, a BOLTS interface opposite the back and sides extending between the BOLTS interface and the back, the substrate carrier to processing tool interface module being coupled to one of the back, sides and BOLTS interface.

10. A substrate processing tool comprising:
an atmospheric processing chamber having an atmospheric environment therein;
a load lock chamber having a vacuum environment therein and being connected to the atmospheric processing chamber; and
a substrate carrier to processing tool interface module having at least one closable opening through which substrates pass and being configured for coupling to one or more of the atmospheric processing chamber and load lock chamber, the substrate carrier to processing tool interface module including
a first environment interface configured to be selectable between at least one of vacuum and atmospheric with a configuration that opens an internal environment of a substrate carrier to the selected at least one of the vacuum environment and atmospheric environment, and
a second environment interface different than the first environment interface, the second environment interface configured to be selectable between at least one of atmospheric and vacuum with a configuration that opens the internal environment of the substrate carrier to the selected at least one of the atmospheric environment and the vacuum environment different than selection of the first environment interface.

11. The substrate processing tool of claim 10, wherein the substrate carrier to processing tool interface module is connected to the load lock.

12. The substrate processing tool of claim 10, wherein the atmospheric processing chamber comprises a mini-environment wherein the substrate carrier to processing tool interface module is connected to the mini-environment.

13. The substrate processing tool of claim 10, wherein the atmospheric processing chamber comprises a mini-environment where the substrate carrier to processing tool interface module is connected to both the load lock and the mini-environment.

14. The substrate processing tool of claim 10, wherein the substrate carrier to processing tool interface module is configured to evacuate or charge a substrate carrier fluidic barrier seal located between a door of the substrate carrier and a housing of the substrate carrier.

15. The substrate processing tool of claim 10, wherein the substrate carrier to processing tool interface module is configured to evacuate or charge an internal environment of the substrate carrier.

16. The substrate processing tool of claim 10, wherein the substrate carrier to processing tool interface module is configured to form a pass-through load lock connected to the load lock chamber and the atmospheric processing chamber, the substrate carrier to processing tool interface module having substrate support shelves disposed underneath one of the at least one closable opening.

17. The substrate processing tool of claim 16, wherein the substrate carrier to processing tool interface module is configured so that a substrate is transported through the pass-through load lock into the load lock chamber from the atmospheric processing chamber and for substrate exit into a vacuum environment of a substrate carrier coupled to the substrate carrier to processing tool interface module.

18. The substrate processing tool of claim 10, wherein the atmospheric processing chamber is an equipment front end module having a back connected to the load lock chamber, a BOLTS interface opposite the back and sides extending between the BOLTS interface and the back, the substrate carrier to processing tool interface module being coupled to one of the back, sides and BOLTS interface.

* * * * *